(12) United States Patent
Adamovich et al.

(10) Patent No.: US 8,866,377 B2
(45) Date of Patent: Oct. 21, 2014

(54) LONG LIFETIME PHOSPHORESCENT ORGANIC LIGHT EMITTING DEVICE (OLED) STRUCTURES

(75) Inventors: Vadim I Adamovich, Yardley, PA (US); Michael Stuart Weaver, Princeton, NJ (US); Brian W. D'Andrade, Westampton, NJ (US)

(73) Assignee: Universal Display Corporation, Ewing, NJ (US)

( * ) Notice: Subject to any disclaimer, the term of this patent is extended or adjusted under 35 U.S.C. 154(b) by 1500 days.

(21) Appl. No.: 12/521,435

(22) PCT Filed: Dec. 28, 2007

(86) PCT No.: PCT/IB2007/004687
§ 371 (c)(1), (2), (4) Date: Nov. 22, 2010

(87) PCT Pub. No.: WO2009/030981
PCT Pub. Date: Mar. 12, 2009

(65) Prior Publication Data
US 2011/0057171 A1 Mar. 10, 2011

Related U.S. Application Data

(60) Provisional application No. 60/877,696, filed on Dec. 28, 2006, provisional application No. 60/900,624, filed on Feb. 8, 2007.

(51) Int. Cl.
| | | |
|---|---|---|
| *H05B 33/14* | (2006.01) | |
| *H05B 33/18* | (2006.01) | |
| *H01L 51/50* | (2006.01) | |
| *H01L 51/00* | (2006.01) | |

(52) U.S. Cl.
CPC ......... *H01L 51/5016* (2013.01); *H01L 51/0054* (2013.01); *H01L 51/5036* (2013.01); *H01L 51/0076* (2013.01); *H01L 51/0085* (2013.01); *H01L 51/0072* (2013.01); *H01L 51/5088* (2013.01); *H01L 51/0081* (2013.01); *H01L 51/5052* (2013.01)
USPC .......................................... 313/504; 313/502

(58) Field of Classification Search
USPC ............ 313/498–512; 315/169.3; 345/36, 45, 345/76
See application file for complete search history.

(56) References Cited

U.S. PATENT DOCUMENTS

| | | | |
|---|---|---|---|
| 3,711,567 A | * | 1/1973 | Innes .............................. 585/26 |
| 4,769,292 A | | 9/1988 | Tang et al. |

(Continued)

FOREIGN PATENT DOCUMENTS

| | | |
|---|---|---|
| EP | 0650955 | 5/1995 |
| EP | 1589789 | 10/2005 |

(Continued)

OTHER PUBLICATIONS

Kuwabara, Yoshiyuki et al., "Thermally Stable Multilayer Organic Electroluminescent Devices Using Novel Starburst Molecules, 4,4',4"-Tri(N-carbazolyl)triphenylamine (TCTA) and 4,4',4"-Tris(3-methylphenylphenyl-amino)triphenylamine (m-MTDATA), as Hole-Transport Materials," *Adv. Mater.*, 6(9):677-679 (1994).

(Continued)

*Primary Examiner* — Nimeshkumar Patel
*Assistant Examiner* — Christopher Raabe
(74) *Attorney, Agent, or Firm* — Sterne, Kessler, Goldstein & Fox P.L.L.C.

(57) ABSTRACT

An organic light emitting device is provided having an emissive layer with an internal interface. The concentration of a second phosphorescent material in a second organic layer is different from the concentration of a first phosphorescent material in a first organic layer, creating the interface. The materials in the first and second organic layers may be the same or different. In addition to this interface within the emissive layer, the device has one or more features designed to mitigate failure mechanisms which may be associated with electrons or excitons passing from the cathode through the emissive layer to damage organic layers on the anode side of the emissive layer. In addition, devices are provided having an interface within the emissive layer as described above, and a lower energy emissive material on at least one side of the interface.

17 Claims, 66 Drawing Sheets

(56) References Cited

U.S. PATENT DOCUMENTS

| | | | |
|---|---|---|---|
| 5,061,569 A | 10/1991 | VanSlyke et al. | |
| 5,247,190 A | 9/1993 | Friend et al. | |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 6,687,266 B1 | 2/2004 | Ma et al. | |
| 6,835,469 B2 | 12/2004 | Kwong et al. | |
| 6,869,695 B2 | 3/2005 | Thompson et al. | |
| 7,009,338 B2 | 3/2006 | D'Andrade et al. | |
| 7,022,421 B2 | 4/2006 | Thompson et al. | |
| 7,078,113 B2 | 7/2006 | Thompson et al. | |
| 7,087,321 B2 | 8/2006 | Kwong et al. | |
| 7,151,339 B2 | 12/2006 | Adamovich et al. | |
| 7,279,704 B2 | 10/2007 | Walters et al. | |
| 7,285,907 B2 | 10/2007 | D'Andrade et al. | |
| 7,294,849 B2 | 11/2007 | Thompson et al. | |
| 7,431,968 B1 | 10/2008 | Shtein et al. | |
| 7,466,073 B2 | 12/2008 | Kishino et al. | |
| 7,714,498 B2 | 5/2010 | Aoyama et al. | |
| 7,862,908 B2 | 1/2011 | Cheng et al. | |
| 7,871,711 B2 | 1/2011 | Itai | |
| 2002/0034656 A1 | 3/2002 | Thompson et al. | |
| 2002/0064679 A1* | 5/2002 | Ishiskawa et al. | 428/690 |
| 2002/0134984 A1 | 9/2002 | Igarashi | |
| 2003/0175553 A1 | 9/2003 | Thompson et al. | |
| 2003/0230980 A1 | 12/2003 | Forrest et al. | |
| 2004/0048101 A1 | 3/2004 | Thompson et al. | |
| 2004/0174116 A1 | 9/2004 | Lu et al. | |
| 2005/0025993 A1 | 2/2005 | Thompson et al. | |
| 2005/0046337 A1 | 3/2005 | Chin et al. | |
| 2005/0074630 A1 | 4/2005 | Kanno et al. | |
| 2005/0077817 A1 | 4/2005 | Yamazaki et al. | |
| 2005/0260441 A1 | 11/2005 | Thompson et al. | |
| 2005/0260449 A1 | 11/2005 | Walters et al. | |
| 2006/0008670 A1 | 1/2006 | Lin et al. | |
| 2006/0008762 A1* | 1/2006 | Friedman | 433/27 |
| 2006/0040131 A1* | 2/2006 | Klubek et al. | 428/690 |
| 2006/0046098 A1 | 3/2006 | Hosokawa | |
| 2006/0125379 A1* | 6/2006 | Liu et al. | 313/504 |
| 2006/0141288 A1 | 6/2006 | Matsuura et al. | |
| 2006/0202194 A1 | 9/2006 | Jeong et al. | |
| 2006/0232194 A1 | 10/2006 | Tung et al. | |
| 2006/0251923 A1 | 11/2006 | Lin et al. | |
| 2006/0280965 A1* | 12/2006 | Kwong et al. | 428/690 |
| 2007/0190359 A1 | 8/2007 | Knowles et al. | |
| 2007/0236140 A1* | 10/2007 | Hsu | 313/506 |
| 2008/0038586 A1* | 2/2008 | Nishizeki et al. | 428/704 |
| 2008/0152946 A1* | 6/2008 | Yen et al. | 428/690 |
| 2008/0157657 A1* | 7/2008 | Matsunami et al. | 313/504 |
| 2008/0303415 A1 | 12/2008 | Suzuri et al. | |

FOREIGN PATENT DOCUMENTS

| | | |
|---|---|---|
| EP | 1670082 | 6/2006 |
| JP | 2003229272 | 8/2003 |
| JP | 200511610 | 1/2005 |
| JP | 2005038672 | 2/2005 |
| JP | 2005-071983 | 3/2005 |
| JP | 2007123392 | 5/2007 |
| JP | 2007254297 | 10/2007 |
| WO | WO 0139234 | 5/2001 |
| WO | WO 0202714 | 1/2002 |
| WO | WO 03040257 | 5/2003 |
| WO | WO 03060956 | 7/2003 |
| WO | WO 2004093207 | 10/2004 |
| WO | WO 2004107822 | 12/2004 |
| WO | WO 2005014551 | 2/2005 |
| WO | WO 2005030900 | 4/2005 |
| WO | WO 2005089025 | 9/2005 |
| WO | WO 2005123873 | 12/2005 |
| WO | WO 2006009024 | 1/2006 |
| WO | WO 2006/013738 | 2/2006 |
| WO | WO 2006/014599 | 2/2006 |
| WO | WO 2006056418 | 6/2006 |
| WO | WO 2006082742 | 8/2006 |
| WO | WO 2006098120 | 9/2006 |
| WO | WO 2006103874 | 10/2006 |
| WO | WO 2006114966 | 11/2006 |
| WO | WO 2006132193 | 12/2006 |
| WO | WO 2007004380 | 1/2007 |
| WO | WO 2007063754 | 6/2007 |
| WO | WO 2007063796 | 6/2007 |
| WO | WO 2009/030981 | 3/2009 |
| WO | WO 2010/028262 | 3/2010 |

OTHER PUBLICATIONS

Paulose, Betty Marie Jennifer S. et al., "First Examples of Alkenyl Pyridines as Organic Ligands for Phosphorescent Iridium Complexes," Adv. Mater., 16(22):2003-2007 (2004).

Tung, Yung-Liang et al., "Organic Light-Emitting Diodes Based on Charge-Neutral $Ru^{II}$ PHosphorescent Emitters," Adv. Mater., 17(8):1059-1064 (2005).

Huang, Jinsong et al., "Highly Efficient Red-Emission Polymer Phosphorescent Light-Emitting Diodes Based on Two Novel Tris(1-phenylisoquinolinato-C2, N)iridium(III) Derivatives," Adv. Mater., 19:739-743 (2007).

Wong, Wai-Yeung, "Multifunctional Iridium Complexes Based on Carbazole Modules as Highly Efficient Electrophosphors," Agnew. Chem. Int. Ed., 45:7800-7803 (2006).

Tang, C.W. and VanSlyke, S.A., "Organic Electroluminescent Diodes," Appl. Phys. Lett., 51(12):913-915 (1987).

Adachi, Chihaya et al., "Organic Electroluminescent Device Haveing a Hole Conductor as an Emitting Layer," Appl. Phys. Lett., 55(15):1489-1491 (1989).

Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).

Gao, Zhiqiang et al., "Bright-Blue Electroluminescence From a Silyl-Substituted ter-(phenylene-vinylene) derivative," Appl. Phys. Lett., 74(6):865-867 (1999).

Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).

Hung, L.S. et al., "Anode Modification in Organic Light-Emitting Diodes by Low-Frequency Plasma Polymerization of $CHF_3$," Appl. Phys. Lett., 78(5):673-675 (2001).

Ikai, Masamichi and Tokito, Shizuo, "Highly Efficient Phosphorescence From Organic Light-Emitting Devices with an Exciton-Block Layer," Appl. Phys. Lett., 79(2):156-158 (2001).

Wang, Y. et al., "Highly Efficient Electroluminescent Materials Based on Fluorinated Organometallic Iridium Compounds," Appl. Phys. Lett., 79(4):449-451 (2001).

Kwong, Raymond C. et al., "High Operational Stability of Electrophosphorescent Devices," Appl. Phys. Lett., 81(1):162-164 (2002).

Holmes, R.J. et al., "Blue Organic Electrophosphorescence Using Exothermic Host-Guest Energy Transfer," Appl. Phys. Lett., 82(15):2422-2424 (2003).

Sotoyama, Wataru et al., "Efficient Organic Light-Emitting Diodes with Phosphorescent Platinum Complexes Containing NCN-Coordinating Tridentate Ligand," Appl. Phys. Lett., 86:153505-1—153505-3 (2005).

Okumoto, Kenji at al., "Green Fluorescent Organic Light-Emitting Device with External Quantum Efficiency of Nearly 10%," Appl. Phys. Lett., 89:063504-1-063504-3 (2006).

Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).

(56) References Cited

OTHER PUBLICATIONS

Aonuma, Masaki et al., "Material Design of Hole Transport Materials Capable of Thick-Film Formation in Organic Light Emitting Diodes," Appl. Phys. Lett., 90:183503-1-183503-3 (2007).
Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
Adachi, Chihaya et al., "High-Efficiency Red Electrophosphorescence Devices," Appl. Phys. Lett., 78(11):1622-1624 (2001).
Wong, KEith Man-Chung et al., A Novel Class of Phosphorescent Gold(III) Alkynyl-Based Organic Light-Emitting Devices with Tunable Colour, Chem. Commun., 2906-2908 (2005).
Hamada, Yuji et al., "High Luminance in Organic Electroluminescent Devices with Bis(10-hydroxybenzo[h]quinolinato)beryllium as an Emitter," Chem. Lett., 905-906 (1993).
Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4):592-593 (2005).
Mi, Bao-Xiu et al., "Thermally Stable Hole-Transporting Material for Organic Light-Emitting Diode: an Insoindole Derivative," Chem. Mater., 16(12):3148-3151 (2004).
Huang, Wei-Sheng et al., "Highly Phosphorescent Bis-Cyclometalated Iridium Complexes Containing Benzoimidazole-Based Ligands," Chem. Mater., 17(13):2480-2488 (2005).
Niu, Yu-Hua et al., "Highly Efficient Electrophosphorescent Devices with Saturated Red Emission from a Neutral Osmium Complex," Chem. Mater., 17(13):3532-3536 (2005).
Lo, Shih-Chun et al., "Blue Phosphorescence from Iridium(III) Complexes at Room Temperature," Chem. Mater., 18(21):5119-5129 (2006).
Takizawa, Shin-ya et al., "Phosphorescent Iridium Complexes Based on 2-Phenylimidazo[1,2-α]pyridine Ligands: Tuning of Emission Color toward the Blue Region and Application to Polymer Light-Emitting Devices," Inorg. Chem., 46(10):4308-4319 (2007).
Lamansky, Sergey et al., "Synthesis and Characterization of Phosphorescent Cyclometalated Iridium Complexes," Inorg. Chem., 40(7):1704-1711 (2001).
Ranjan, Sudhir et al., "Realizing Green Phosphorescent Light-Emitting Materials from Rhenium(I) Pyrazolato Diimine Complexes," Inorg. Chem., 42(4):1248-1255 (2003).
Noda, Tetsuya and Shirot, Yasuhiko, "5,5'-Bis(dimesitylboryl)-2,2'-bithiophene and 5,5"-Bis(dimesitylboryl)-2,2':5',2"-terthiophene as a Novel Family of Electron-Transporting Amorphous Molecular Materials," J. Am. Chem. Soc., 120(37):9714-9715 (1998).
Sakamoto, Youichi et al., "Synthesis Characterization and Electron-Transport Property of Perfluorinated Phenylene Dendrimers," J. Am. Chem Soc., 122(8):1832-1833 (2000).
Adachi, Chihaya et al., "Nearly 100% Internal Phosphorescence Efficency in an Organic Light Emitting Device," J. Appl. Phys., 90(10):5048-5051 (2001).
Shirota, Yasuhiko et al., "Starburst Molecules Based on π-Electron Systems as Materials for Organic Electroluminescent Devices," Journal of Luminescence, 72-74:985-991 (1997).
Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).
Kido, Junji et al., 1,2,4-Triazole Derivative as an Electron Transport Layer in Organic Electroluminescent Devices, Jpn. J. Appl. Phys., 32:L917-L920 (1993).
Van Slyke, S. A. et al. ,"Organic Electroluminescent Devices with Improved Stability," Appl. Phys. Lett., 69(15):2160-2162 (1996).
Guo, Tzung-Fang et al., "Highly Efficient Electrophosphorescent Polymer Light-Emitting Devices," Organic Electronics, 1:15-20 (2000).
Palilis, Leonidas C., "High Efficiency Molecular Organic Light-Emitting Diodes Based On Silole Derivatives And Their Exciplexes," Organic Electronics, 4:113-121 (2003).
Ikeda, Hisao et al., "P-185: Low-Drive-Voltage OLEDs with a Buffer Layer Having Molybdenum Oxide," SID Symposium Digest, 37:932-926 (2006).
T. Östergård et al., "Langmuir-Blodgett Light-Emitting Diodes of Poly(3-Hexylthiophene): Electro-Optical Characteristics Related to Structure," Synthetic Metals, 87:171-177 (1997).
Hu, Nan-Xing et al., "Novel High $T_g$ Hole-Transport Molecules Based on Indolo[3,2-b] carbazoles for Organic Light-Emitting Devices," Synthetic Metals, 111-112:421-424 (2000).
Salbeck, J. et al., "Low Molecular Organic Glasses for Blue Electroluminescence," Synthetic Metals, 91:209-215 (1997).
International Search Report and Written Opinion corresponding to the PCT/IB2007/004687 application mailed May 7, 2009.
Baldo et al., "High-efficiency fluorescent organic light-emitting devices using a phosphorescent sensitizer", Nature, Nature Publishing Group, London, UK, vol. 403, Feb. 17, 2000, pp. 750-753.
U.S. Appl. No. 60/763,189, filed Jan. 27, 2006.
E.E.Namdas, T.D.Anthopoulos, I.D.W.Samuel, Applied Physics Letters 86, 161104 (2005).
Baldo et al., "Highly Efficient Phosphorescent Emission from Organic Electroluminescent Devices," Nature, vol. 395, 151-154, 1998; ("Baldo-I").
Baldo et al., "Very high-efficiency green organic light-emitting devices based on electrophosphorescence," Appl. Phys. Lett., vol. 75, No. 3, 4-6 (1999) ("Baldo-II").
Vadim Adamovich, Novel materials and techniques of fabrication for Organic light emitting diodes. PhD, Thesis. Published Nov. 25, 2003.
T.D.Anthopoulos, M.J.Frampton, E.B.Namdas, P.L.Burn, I.D.W. Samuel, Adv. Mater.2004, 16, No. 6, Mar. 18, pp. 557-560.
So et al., 'Bipolar Carrier Transport in Organic Small Molecules for OLED,' Proceedings of the Society for Information Display. 38, 1497 (2007).
Search Report corresponding to the PCT/US2009/056066 application.
Tanaka et al.: "High Luminous Efficiency Blue Organic Light-Emitting Devices Using high Triplet Excited Energy Materials" Japanese Journal of Applied Physics, Japan Society of Applied Physics, Tokyo,JP, vol. 46, No. 4-7, Feb. 1, 2007, pp. L117-L119.
Kyung Soo Son et al.: "Blue organic electrophosphorescence diodes using diarylamino-substituted heterocyclic compounds as host material" Journal of Photopolymer Science and Technology, vol. 20, No. 1, 2007, pp. 47-51.
Adamovich V I et al., "Improving the performance of PHOLEDs by using dual doping" Proc. of SPIE, vol. 7051, Aug. 26, 2008, pp. 70510D-1-70510D-8.
Holmes R et al.: "Saturated deep blue organic electrophosphorescence using a fluorine-free emitter" Applied Physics Letters, AIP, American Institute of Physics, Melville, NY, US, vol. 87, No. 24, Dec. 7, 2005, pp. 243507-243507.
Park Y R at al.: "Organic light-emitting devices with In-doped (4 at. %) ZnO thin films as the anodic electrode" Japanese Journal of Applied Physics, Japan Society of Applied Physics, Tokyo, JP, vol. 47, No. 1, Jan. 1, 2008, pp. 468-471.
Dodabalapur et al, "Physics and applications of organic microcavity light emitting diodes," J. Appl. Phys. 80 (12), Dec. 15, 1996.
B. W. D'Andrade, J.-Y. Tsai, C. Lin, M. S. Weaver, P. B. Mackenzie, and J. J. Brown, Efficient white phosphorescent organic light-Emitting devices, Long Beach, CA, United States, 2007 (Society for Information Display, San Jose, CA 95112-4006, United States), p. 1026-1029.
B. D'Andrade, M. S. Weaver, and J. J. Brown, White phosphorescent organic light emitting devices, SPIE 6655, 6332-6334 (2007).
B. W. D'Andrade, R. J. Holmes, and S. R. Forrest, Efficient organic electrophosphorescent whitelight-emitting device with a triple doped emissive layer, Advanced Materials 16, 624-628 (2004).
B. W. D'Andrade and S. R. Forrest, White organic light-emitting devices for solid-state lighting, Advanced Materials 16, 1585-1595 (2004).
B. W. D'Andrade, J. Brooks, V. Adamovich, M. E. Thompson, and S. R. Forrest, White light emission using triplet excimers in electrophosphorescent organic light-emitting devices, Advanced Materials 14, 1032-1036 (2002).

(56) References Cited

OTHER PUBLICATIONS

Adamovich, J. Brooks, A. Tamayo, A. M. Alexander, P. I. Djurovich, B. W. D'Andrade, C. Adachi, S. R. Forrest, and M. E. Thompson, High efficiency single dopant white electrophosphorescent light emitting diodes, New Journal of Chemistry 26, 1171-1178 (2002).

U.S. Appl. No. 61/094,145, filed Sep. 4, 2008.

U.S. Appl. No. 61/065,131, filed on Feb. 9, 2008.

Gary L. Miessler and Donald A. Tarr "Inorganic Chemistry" (2nd Edition) Pentice-Hall, pp. 1-3; 422-424 (1998).

International Search Report in the corresponding PCT application No. PCT/US2009/030545.

Office Action received in related EP application No. 07875198.9.

Office Action received in related JP application No. 2009-543554.

Office Action received in related EP application No. 07875198,9.

\* cited by examiner

LONG LIFETIME PHOSPHORESCENT ORGANIC LIGHT EMITTING DEVICE (OLED) STRUCTURES

This application is a National Stage Application of PCT/IB2007/004687 filed Dec. 28, 2007 and claims priority to U.S. Application No. 60/877,696, filed Dec. 28, 2006 and U.S. Application No. 60/900,624, filed Feb. 8, 2007, the disclosures of which are incorporated herein by reference in their entirety.

This application claims priority to U.S. Provisional Application No. 60/877,696, filed on Dec. 28, 2006, and U.S. Provisional Application No. 60/900,624, filed on Feb. 8, 2007, which are incorporated by reference in their entireties.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices (OLEDs). More specifically, the present invention relates to OLEDs having particular structures that may enhance lifetime.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted $Ir(ppy)_3$, which has the structure of Formula I:

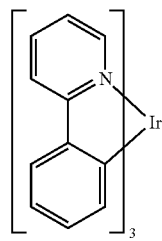

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand is referred to as "photoactive" when it is believed that the ligand contributes to the photoactive properties of an emissive material.

A first energy level (HOMO or LUMO) is considered "less than" or "lower" than a second energy level if it is lower on a conventional energy level diagram, which means that the first energy level would have a value that is more negative than the second energy level. A first energy level (HOMO or LUMO) is considered "higher" than a second energy level if it is higher on a conventional energy level diagram, which means that the first energy level would have a value that is less negative than the second energy level. For example, the HOMO of CBP −5.32 eV and the HOMO of TPBI is −5.70 eV, therefore the HOMO of CBP is 0.38 eV "higher" than the HOMO of TPBI. Similarly, the LUMO of mCP is −0.77 eV and the LUMO of CBP is −1.23 eV, therefore the LUMO of mCP is 0.46 eV "higher" than the LUMO of CBP. The above values were determined using density functional calculations performed using the Spartan 02 software package, available from Wavefunction Inc. of Irvine, Calif., at the B3LYP/6-31G* level. A pseudo potential option can be used for species containing heavy metals such as $Ir(ppy)_3$. Density functional calculations have been demonstrated in the literature to be able to qualitatively predict energies of organic and inorganic compounds.

More details on OLEDs, and the definitions described above, can be found in U.S. Pat. No. 7,279,704, which is incorporated herein by reference in its entirety.

As used herein, the term "consisting essentially of" one or more materials as applied to a layer in an organic light emitting device means that there may be materials present in addition to those listed, but any such additional materials are present only in minor quantities (such as impurities) and do not significantly affect the electronic properties or emissive of the device, i.e., they do not significantly contribute to the transport or trapping of holes or electrons, they do not result in a shift of the recombination location, and they do not significantly contribute to or participate in exciton decay, emissive or otherwise.

Unless otherwise indicated, percentages of organic compounds in various layers described herein are weight percentages.

The following two references including Samuel as a co-author describe solution processable phosphorescent OLEDs with doped emissive layer in direct contact with ITO. E. E. Namdas, T. D. Anthopoulos, I. D. W. Samuel, Applied physics letters 86, 161104 (2005). T. D. Anthopoulos, M. J. Frampton, E. B. Namdas, P. L. Burn, I. D. W. Samuel, Adv. Mater. 2004, 16, No. 6, March 18, pp. 557-560.

SUMMARY OF THE INVENTION

In a first aspect, an organic light emitting device with an interface in the emissive layer is provided. The device has an anode, a cathode, and an emissive layer disposed between the anode and the cathode. The emissive layer includes a first organic layer, which includes a first phosphorescent material and a first non-emissive material. The concentration of the first phosphorescent material in the first organic layer is 10-90 wt %, and the concentration of the first non-emissive material in the first organic layer is 10-90 wt %. The emissive layer also includes a second organic layer which includes a second phosphorescent material and a second non-emissive material. The concentration of the second phosphorescent material in the second layer is 3-25 wt %, and the concentration of the second non-emissive material in the second organic layer is 75-97 wt %. The concentration of the second phosphorescent material in the second organic layer is lower than the concentration of the first phosphorescent material in the first organic layer, preferably at least 5 wt % lower, and more preferably at least 10 wt % lower. The first non-emissive material and the second non-emissive material may be the same material or different materials, and the first phosphorescent material and the second phosphorescent material may be the same material or different materials. Thus, there are four combinations: (1) same phosphorescent material in both first and second organic layers, and same non-emissive material in both first and second organic layers; (2) different phosphorescent material in the first and second organic layers, and same non-emissive material in both first and second organic layers; (3) same phosphorescent material in both first and second organic layers, and different non-emissive material in first and second organic layers; and (4) different phosphorescent material in the first and second organic layers, and different non-emissive material in the first and second organic layers. There are advantages to each combination. The first organic layer may consist essentially of the first phosphorescent material and the first non-emissive material, and the second organic layer may consist essentially of the first phosphorescent material and the first non-emissive material of the first organic layer. Device architectures that mitigate damage in the device and extend device lifetime are also provided for use with the first aspect, either individually or in combination.

The first organic layer, the second organic layer, or both, may optionally further include a lower energy emissive material, wherein the concentration of the lower energy emissive material is 0.1-12 wt %.

In a second aspect, one architecture to mitigate damage is provided. All organic layers between the first organic layer and the anode have a hole mobility and an electron mobility such that the hole mobility is at least twice as great as the electron mobility, preferably at least ten times greater, and more preferably at least 100 times greater.

In a third aspect, another architecture to mitigate damage is provided. All organic layers between the first organic layer and the anode do not include any materials containing a group selected from the group consisting of triarylamine, napthyl, tri(N-carbazoyl)triphenylamine, tetraarylamine and carbazole.

In a fourth aspect, another architecture to mitigate damage is provided. There are no organic layers between the first organic layer and the anode.

In a fifth aspect, another architecture to mitigate damage is provided. A third organic layer is provided, disposed between the first organic layer and the anode. The third organic layer consists essentially of the first phosphorescent material. The third organic layer is in direct contact with the first organic layer and the anode, such that it is the only layer between the first organic layer and the anode.

In a sixth aspect, another architecture to mitigate damage is provided. The device includes no more than three different organic materials, minimizing the number of materials subject to damage.

In a seventh aspect, another architecture to mitigate damage is provided. The device includes no more than four different organic materials, where one of the organic materials is an electron transport material present in the device only between the emissive layer and the cathode. The limitation on the number of materials minimizes the number of materials subject to damage.

In an eighth aspect, another architecture to mitigate damage is provided. All organic layers between the first organic layer and the anode consist essentially of organometallic materials.

In a ninth aspect, another architecture to mitigate damage is provided. All organic layers between the first organic layer and the anode have a hole conductivity sufficiently large such that an additional 10 nm thickness in the layer results in a voltage rise of 0.1 V or less at a current of 10 mA/cm$^2$.

In a tenth aspect, another architecture to mitigate damage is provided. The first non-emissive material has a triplet energy of 2.7 eV or greater.

In an eleventh aspect, a lower energy emissive material is provided that may be used with the first aspect, with or without the various damage mitigation architectures. The lower energy emissive material may be a fluorescent emissive material, a phosphorescent material, or a combination of the two where there are multiple lower energy emissive materials. The concentration of the lower energy emissive material may be 0.1-12 wt %, and a lower energy emissive material may be present in only the first organic layer, only the second organic layer, or in both layers. An organic layer including a lower energy emissive material may consist essentially of a phosphorescent material, a non-emissive material, and a lower energy emissive material.

In a twelfth aspect, a device similar to that of the first aspect is provided, but where the wherein the concentration of the phosphorescent material in the second organic layer is higher than the concentration of the phosphorescent material in the first organic layer, as opposed to lower. The concentration of the first phosphorescent material in the first organic layer is 3-25 wt %, and the concentration of the first non-emissive material in the first organic layer is 75-97 wt %. The concentration of the phosphorescent material in the second layer is 10-90 wt %, and the concentration of the non-emissive material in the second organic layer is 10-90 wt %. Various other aspects as described above may be used in conjunction with the twelfth aspect.

In various aspects, the first organic layer may consist essentially of the first phosphorescent material and the first non-emissive material, and the second organic layer may consist essentially of the second phosphorescent material and the second non-emissive material of the first organic layer.

In various aspects, the total thickness of the first and second organic layers is preferably at least 400 Å. The thickness of the first organic layer is preferably at least 50 Å and the thickness of the second organic layer is preferably at least 50 Å.

In various aspects, the first phosphorescent material preferably has a highest occupied molecular orbital that is at least 0.3 eV higher than the highest occupied molecular orbital of the first non-emissive material, and the second phosphorescent material preferably has a highest occupied molecular orbital that is at least 0.3 eV higher than the second occupied molecular orbital of the first non-emissive material.

In various aspects, a fourth organic layer may be provided disposed between the second organic layer and the cathode. The fourth organic layer consists essentially of the second non-emissive material, and is in direct contact with the second organic layer.

In various aspects, a fourth organic layer may be provided disposed between the second organic layer and the cathode. The fourth organic layer consists essentially of materials having a triplet energy at least 0.1 eV greater than the triplet energy of the second phosphorescent material, and the fourth organic layer is in direct contact with the second organic layer.

In various aspects, the first non-emissive material may be selected from materials containing a group selected from the group consisting of triphenylene, carbazole, dibenzothiophene and dibenzothiophene coupled with carbazole.

In various aspects, the first organic layer may be in direct contact with the second organic layer.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
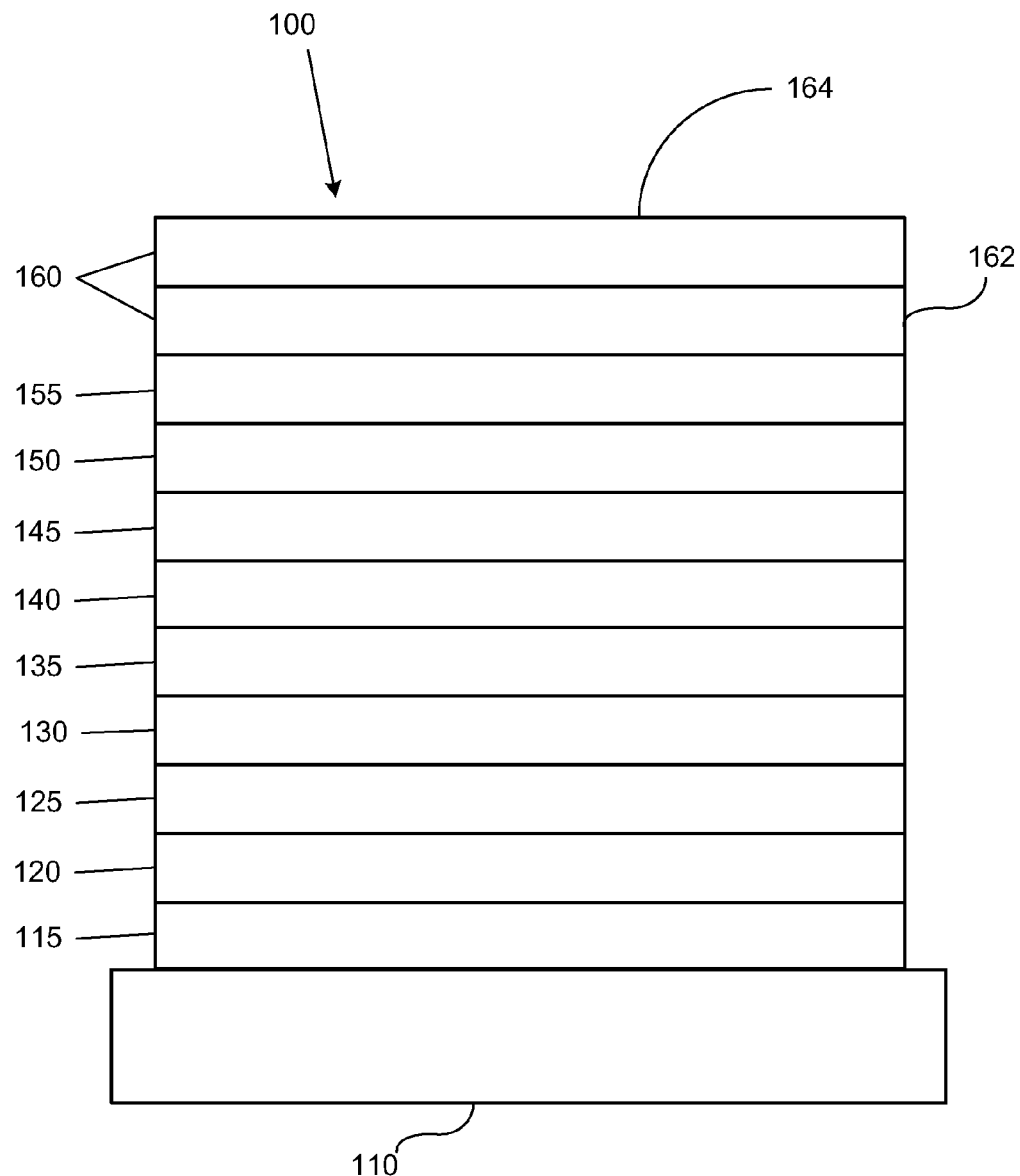
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F.sub.4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
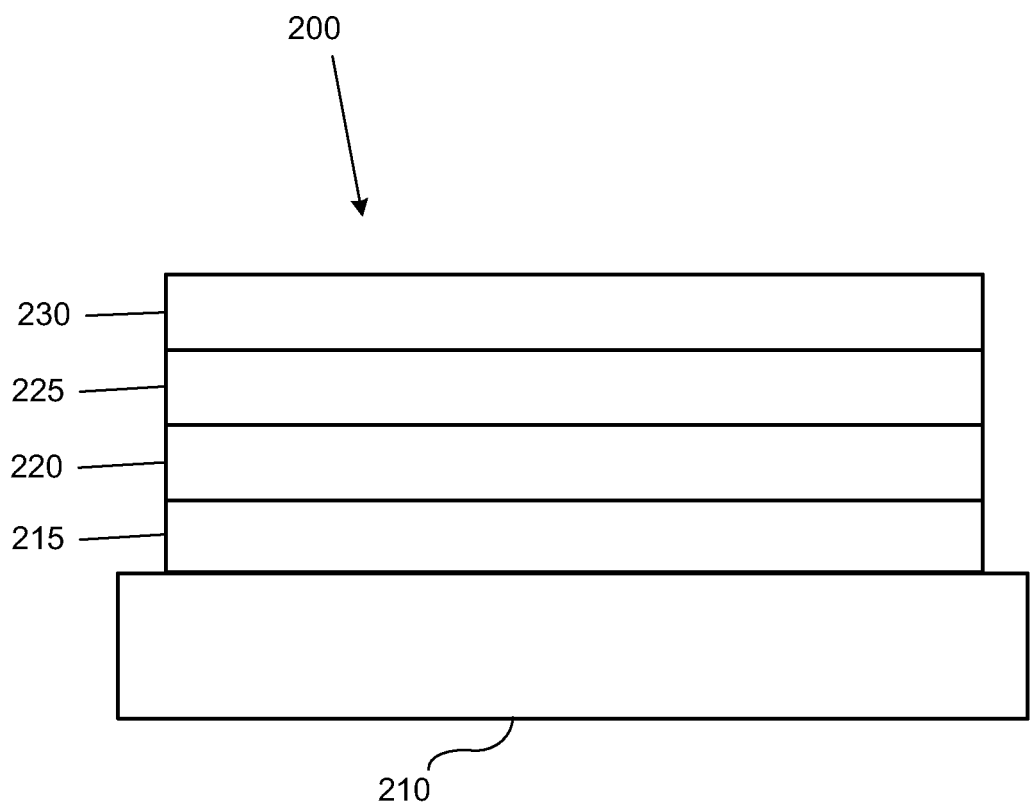
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures.

More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

As used herein, the following compounds have the following structures:

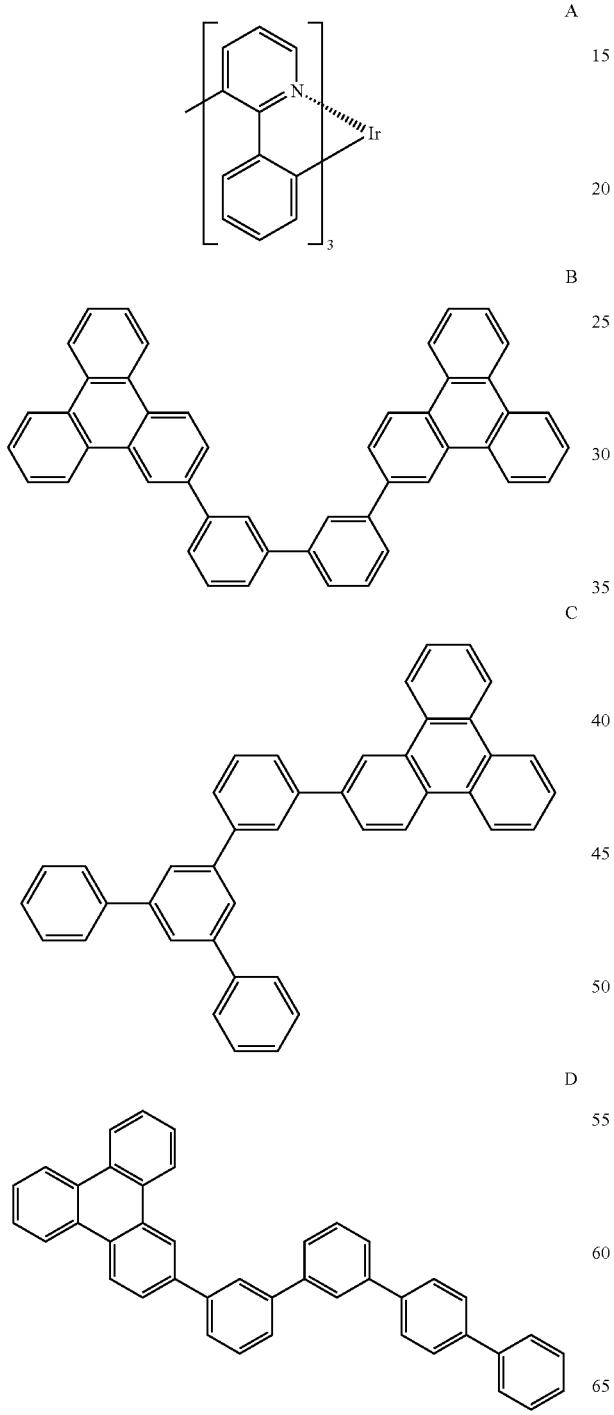

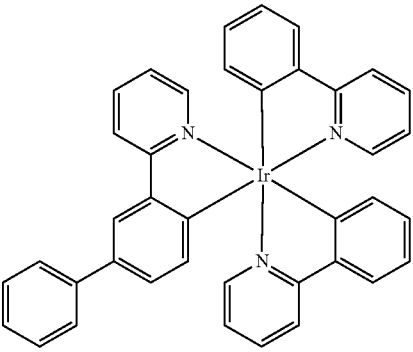

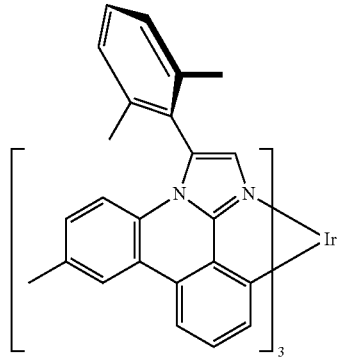

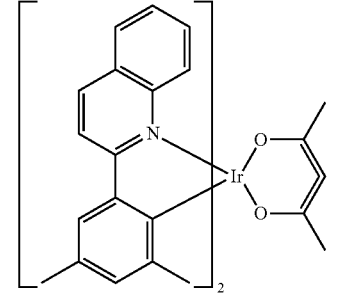

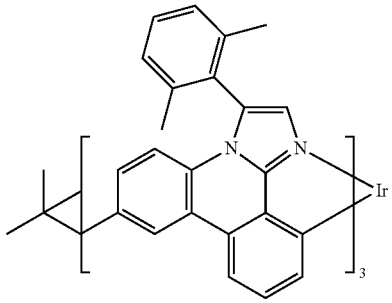

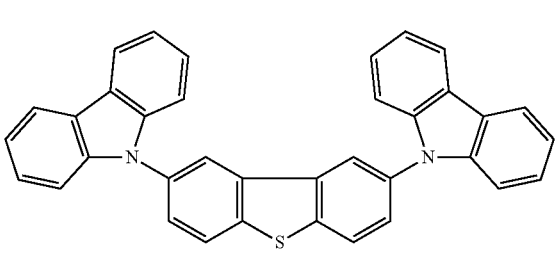

K
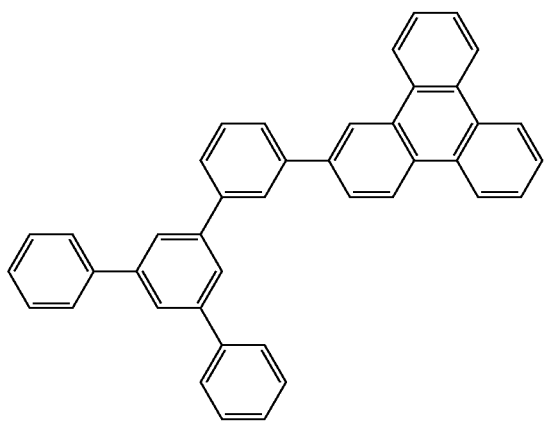
M
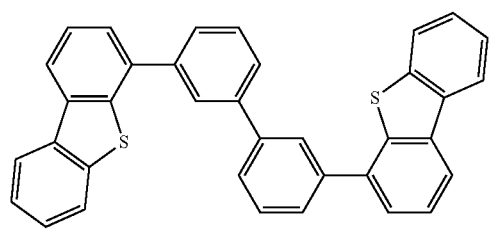
N
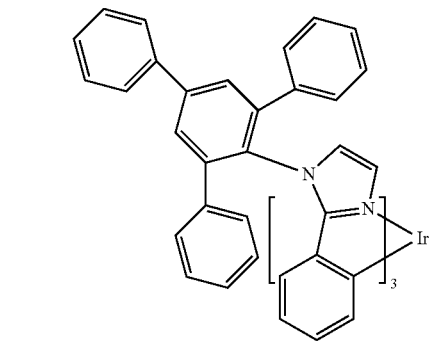
O
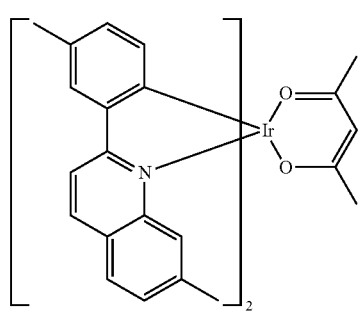
P
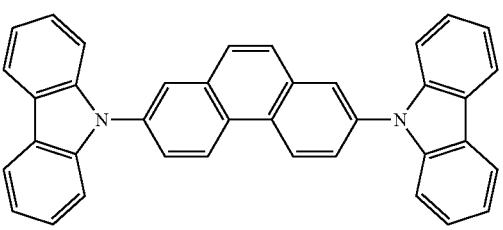
R
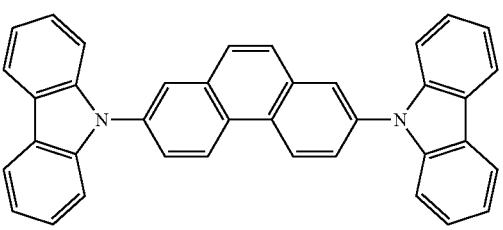
S
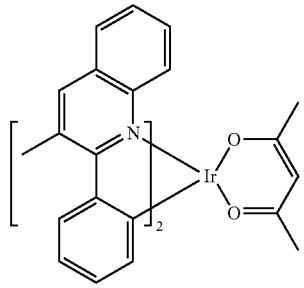
T
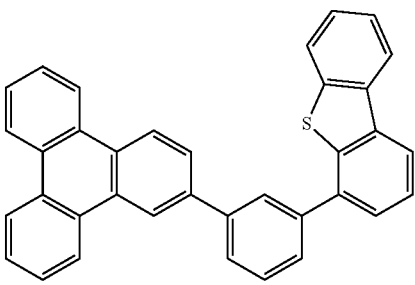
U
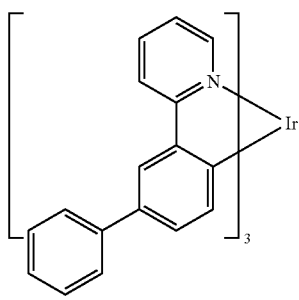

-continued

HPT

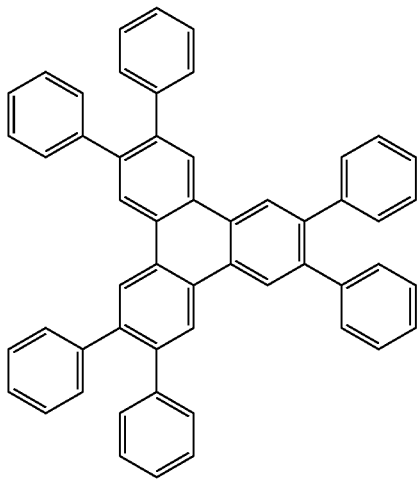

Figure 8:
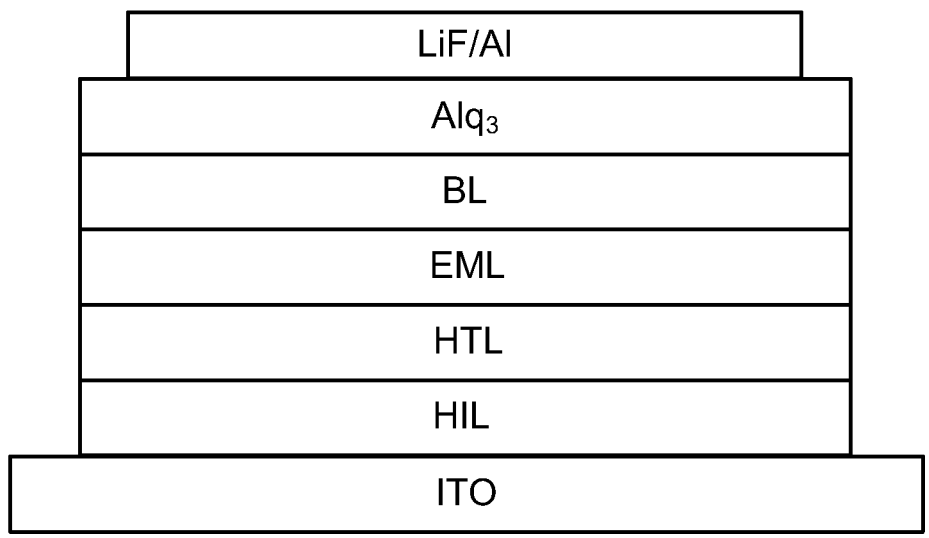
FIG. 8 shows a general phosphorescent OLED structure.
Figure 9:
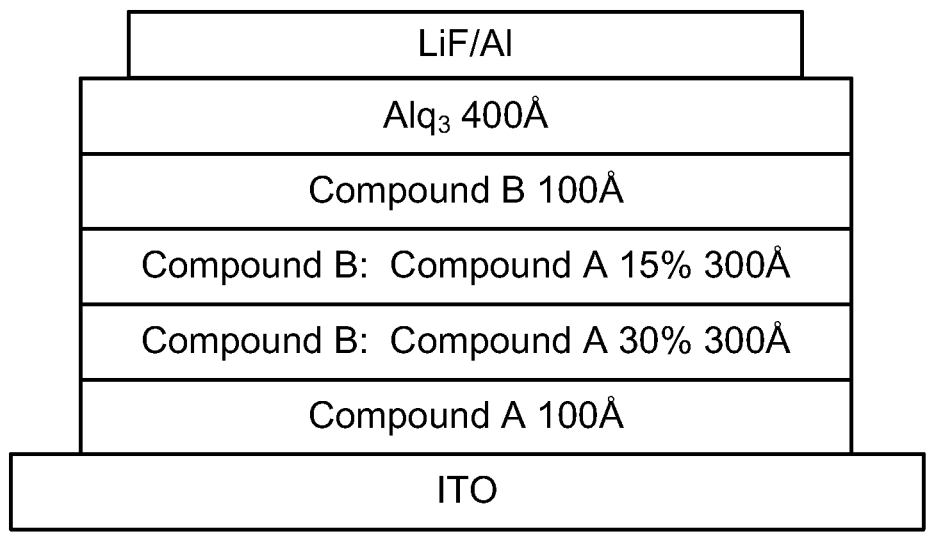
FIG. 9 shows a specific organic light emitting device that was fabricated and tested, having first and second organic layers with different concentrations of phosphorescent material and non-emissive materials.

FIG. 8 shows a general phosphorescent OLED structure. In some aspects, a new architecture for a phosphorescent OLED is disclosed. FIG. 9 shows a simplified device architecture that incorporates a thick emissive layer (EML) between a hole injection layer (HIL) and a blocking layer (BL). It is demonstrated that when the NPD HTL is replaced with a COMPOUND B:COMPOUND A doped layer in a phosphorescent OLED, this leads to extremely long lifetime of a new green phosphorescent OLED. A green device has been demonstrated with 600 Å COMPOUND B:COMPOUND A 15% EML with an efficiency of 44 cd/A and an 80% lifetime of 65,000 h at 1000 nits, see Table 2, compare Example 1 to Comparative Example 2. In this device, the 600 Å COMPOUND B:COMPOUND A layer provides both electron and hole transport capabilities. COMPOUND B provides very stable matrix. COMPOUND A is provided as a hole-transporting dopant, because COMPOUND B has preferential electron transporting characteristics. The doped COMPOUND B:COMPOUND A layer can also be used as the HTL for red and blue structures. COMPOUND B:COMPOUND A is an example to demonstrate the concept of a doped HTL. COMPOUND A can also be used as a hole injection layer, and COMPOUND B can function as a layer between the emissive layer and the electron transport layer (if present) and subsequent cathode.

Some features disclosed herein enable a significant improvement in phosphorescent OLED stability. This includes the utilization of a material (COMPOUND B), which was originally designed to be a host and has now been demonstrated to be an effective BL (blocking layer) and HTL (Hole transport layer).

The following references are incorporated by reference in their entireties: Vadim Adamovich, Novel materials and techniques of fabrication for Organic light emitting diodes. PhD, Thesis. Published Nov. 25, 2003; Peter Mackenzie, Vadim Adamovich, Yeh Tung, Michael S. Weaver. EML ON ITO OLED DEVICES, Provisional application No. 60/763,189; U.S. Pat. No. 7,022,421; U.S. Pat. No. 7,078,113; US Patent Publication No. 2006/0280965.

The low stability of CBP host, HPT blocking layer (BL) and NPD hole transporter layer (HTL) materials presents significant impediments to the realization of a stable and long-lived green phosphorescent OLED. Utilization of a more stable material such as, for example, COMPOUND B in a green Phosphorescent OLED in the emissive layer, BL and HTL allowed about 10 fold improvement of green phosphorescent OLED lifetime. The replacement of a NPD HTL with a layer of COMPOUND B doped with COMPOUND A for green devices dramatically improves device lifetime. The concept is also applicable to blue devices.

Compound B is a very stable host material. Green structure and performance with Compound B used in various layers within a device as a host, blocking layer and component of the hole-transporting layer is disclosed. Table 1 shows device data on improving green Phosphorescent OLED stability. FIG. 8 shows a general device structure showing the structure of the layers from Table 1.

TABLE 1

Evolution of green phosphorescent OLED performance due to new materials in device structure

| Structure | 1 | 2 | 3 | 4 | 5 | 6 |
|---|---|---|---|---|---|---|
| HIL 100 Å | Compound A | Compound A | Compound A | Compound A | Compound A | CuPc |
| HTL 300 Å | NPD | NPD | NPD | Compound B:Compound A 15% | Compound B:Compound A 30% | Compound B:Compound A 15% |
| EML 300 Å | CBP:Compound A 10% | Compound B:Compound A 10% | Compound B:Compound A 15% | Compound B:Compound A 15% | Compound B:Compound A 15% | Compound B:Compound A 15% |
| BL | HPT 50 Å | HPT 50 Å | Compound B 100 Å | Compound B 100 Å | Compound B 100 Å | Compound B 100 Å |
| ETL | Alq 450 Å | Alq 450 Å | Alq 400 Å | Alq 400 Å | Alq 400 Å | Alq 400 Å |
| Voltage at 1000 nits [V] | 5.8 | 5.7 | 6.4 | 7.6 | 6.4 | 8.8 |
| Luminous efficiency at 1000 nits [cd/A] | 61 | 59 | 54.7 | 44.2 | 51.8 | 25.6 |
| EQE at 1000 nits [%] | 17.7 | 16.3 | 15.3 | 12.3 | 14.4 | 6.9 |
| Initial luminance at 40 mA/cm$^2$ [cd/m$^2$] | 16155 | 16840 | 17300 | 13714 | 15666 | 8229 |
| $T_{80\%}$ at 40 mA/cm$^2$ [h] | 80 | 160 | 185 | 870 | ~900 | 2000 |
| $T_{50\%}$ at 1000 nits [h]* | 25,000 | 55,000 | 75,000 | 280,000 | >500,000 | >600,000 |

*predicted form accelerated LT

As follows from Table 1 the introduction of COMPOUND B stable material into the device as a various layers significantly improves lifetime of the device. While not intending to be limited by theory, HTL replacement improves the device. It is believed that this may be especially important for green devices. NPD is not as stable in green devices as it is in other devices, such as red devices. Again, not intending to be limited by theory, it is believed that NPD may be degraded by electrons leaking through the emissive layer, and (or) by phosphorescent excitons. As shown in Table 1, the replacement of the NPD HTL for the more stable COMPOUND B:COMPOUND A layer improved device lifetime by a factor of 4. COMPOUND B transports electrons, and COMPOUND A dopant transports holes in the layers including both COMPOUND A and COMPOUND B. Replacement of NPD makes the lifetime of green devices similar to those of red devices (>100,000 h). The same concept of a doped HTL can be used utilizing other materials and can be applied to red and blue Phosphorescent OLEDs.

Other device architectures that can considered include graded structures where the HIL is 100% the p-type dopant e.g. COMPOUND A and then a host material is introduced, e.g., COMPOUND B as one looks further from the anode. Multiple layers of differing concentrations (0-100%) of dopant and host can also be employed between the anode and BL or ETL.

COMPOUND B may also be used as the host for red and blue-green emitters.

COMPOUND B may also be used as the BL in red green, blue, or white devices or any other color.

Devices with 600 Å COMPOUND B:COMPOUND A layer and COMPOUND B as a blocker were grown on different HILs (CuPc, Compound A and no HIL).

Figure 21:
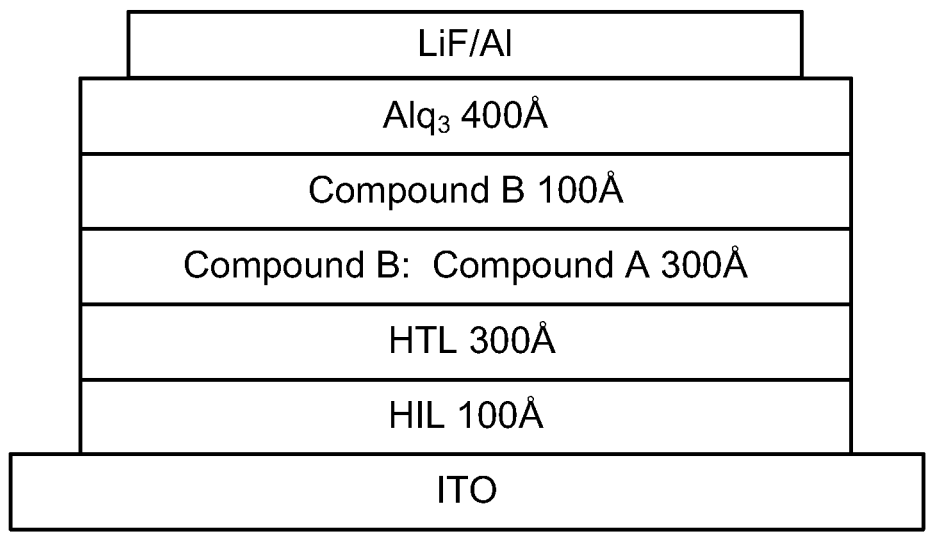
FIG. 21 shows an organic light emitting device that was fabricated using the parameters in Table 2, having first and second organic layers with different concentrations of phosphorescent material and non-emissive materials.

Specific device examples with Compound B:Compound A doped HTL are summarized in Table 2. FIG. 21 provides the structure for the devices described in Table 2.

The replacement of NPD with a stable doped HTL (COMPOUND B:COMPOUND A) results in significant enhancement of green device lifetime. The experimental results are shown in Tables 1 and 2 and the associated FIGs. Devices with 600 Å of COMPOUND B:COMPOUND A 15% layer, having both electron transport and hole transport capabilities due to the mixture of materials, was grown on various HILs (CuPc, COMPOUND A and no HIL) (Examples 2, 1 and 3, respectively of Table 2). The same device structure with 300 Å NPD HTL and 300 Å COMPOUND B:COMPOUND A 15% EML is shown as a comparative example. The device without NPD is far more stable than device with NPD HTL. In this device COMPOUND B host (matrix) and COMPOUND A (hole transporting and emissive dopant) are used in one layer.

A superior performance, and the best performance for the devices measured in the particular experiment shown in Table 2, which is long lifetime in combination with high device efficiency and low operating voltage, is Example 5 from Table 2. The structure of Example 5 is shown in FIG. 9. This device has only three organic materials. HIL, EML and BL of this device can be considered as a Compound A: Compound B layer with graded concentrations from 100% of compound A next to ITO (hole injection interface) and 100% of compound B next to Alq ETL (electron injection interface).

The devices of Tables 1 and 2 illustrate several points that are associated with superior device performance.
- Utilization of doped HTL (stable matrix (does not have to be hole transporting) and hole-transporting dopant) (potentially ETL as well)
- Utilization of the same materials (host and dopant) for HTL and emissive layer
- Utilization of the same material (COMPOUND A example) as emissive phosphorescent green dopant and hole transporting dopant and hole injection layer

TABLE 2

Device performance comparison when NPD HTL is replaced in device

| Parameters | Example 1 | Example 2 | Example 3 | Example 4 | Example 5 | Comparative Example |
|---|---|---|---|---|---|---|
| HIL 100 Å | Compound A | CuPc | none | Compound A | Compound A | Compound A |
| HTL 300 Å | Compound B:Compound A 15% | Compound B:Compound A 15% | Compound B:Compound A 15% | Compound B:Compound A 30% | Compound B:Compound A 15% | NPD |
| EML 300 Å | Compound B:Compound A 15% | Compound B:Compound A 15% | Compound B:Compound A 15% | Compound B:Compound A 15% | CBP:Compound A 10% | Compound B:Compound A 15% |
| CIE [x, y] | 0.38 0.59 | 0.36 0.61 | 0.36 0.60 | 0.37 0.60 | 0.37 0.60 | 0.38 0.59 |
| Voltage at 1000 nits [V] | 7.6 | 8.8 | 8.6 | 6.4 | 7.8 | 6.4 |
| Luminous efficiency at 1000 nits [Cd/A] | 44.2 | 25.6 | 34 | 51.8 | 45.8 | 54.7 |
| EQE at 1000 nits [%] | 12.3 | 6.9 | 9.3 | 14.39 | 12.78 | 15.3 |
| $T_{90\%}$ at 70° C. 1000 nits [h] | 625 | 900 | 482 | — | — | 293 |
| Initial luminance at 40 mAa/cm² [cd/m²] | 13714 | 8229 | 9434 | 15666 | 13697 | 17300 |
| $T_{80\%}$ at 40 mA/cm² [h] | 870 | 2000 | 1200 | ~900 | ~460 | 185 |
| $T_{80\%}$ at 1000 nits [h]* | 65,000 | 140,000 | >150,000 | 98,000 | | >15,000 |
| $T_{50\%}$ at 1000 nits [h]* | 280,000 | >600,000 | >500,000 | >400,000 | | >75,000 |

*predicted form accelerated LT

Utilization of the same material (COMPOUND B example) as host in EML, matrix in HTL, neat as a blocking layer in the device.

Only 3 materials (example COMPOUND A, COMPOUND B, Alq) in the device

High stability green phosphorescent structures (over 300,000 h lifetime at 1000 nits)

In addition, device architectures are disclosed having the following favorable architecture, which may be used alone or in combination:

Utilization of Stable Hosts, Such as Triphenylene Compounds, for Example Compound B
1. Triphenylene compounds as a host for PHOLEDs
2. Triphenylene compounds as a blocking or impedance layer in PHOLEDs
3. Triphenylene compounds as host and blocking layer in the same OLED
4. Triphenylene compounds as a host and HTL component in the same OLED
5. Triphenylene compounds as a component of HTL and a blocking layer in the same OLED
6. Tryphenylene compounds as a component of HTL, host and blocking layer in the same device, for example a 3 component device.
7. Architectures 1-6, with or without an electron transport layer.
8. Architectures 1-7, using Compound B as the specific triphenylene compound.
9. Architectures 1-7 above, but using a carbazole compound instead of a triphenylene compound as the stable host.
10. Architecture 9, using mCBP or Compound R as the specific carbazole compound.

Devices may be fabricated using a stable host material that is a triphenylene compound or a carbazole compound. The devices may include only 3 or only 2 organic components, and may include layers having different concentrations of the same materials. Table 3 shows examples of such devices. The structure for the devices of Table 3 is shown in FIG. 8. The designations in FIG. 8 regarding HTL and ETL are somewhat flexible, in that both of these layers are believed to emit in many of the structures, particularly those where the HTL and ETL have the same materials but in different concentrations. Devices 1 and 2 of Table 3 were actually fabricated, while devices 3 and 4 were not but are included for illustrative purposes. It is believed that Compound S is an example of a phosphorescent molecule that may transport electrons in an emissive layer.

TABLE 3

Examples of "3 component" and "2 component" phosphorescent OLED structures based on different concentrations of the same materials in different layers

| | Layer | | | | |
|---|---|---|---|---|---|
| Structure | HIL | HTL | EML | BL | ETL |
| 1 | A | B:A (30%) | B:A (15%) | B | Alq (if any) |
| 2 | A | CBP:A (30%) | CBP:A (10%) | B | Alq (if any) |
| 3 | A | R:A (30%) | R:A (10%) | R | Alq (if any) |
| 4 | NPD | NPD | NPD:S (15%) | S | Alq (if any) |

The devices have application in flat panel displays and in lighting applications. The superior devices demonstrated have the advantage of enabling longer lifetime in high efficiency phosphorescent OLEDs. No special fabrication equipment is necessary, and devices may be fabricated by methods known in the art. Shadow masking may be a consideration depending on whether common layers can be employed in the case of side by side RGB applications.

Figure 3:
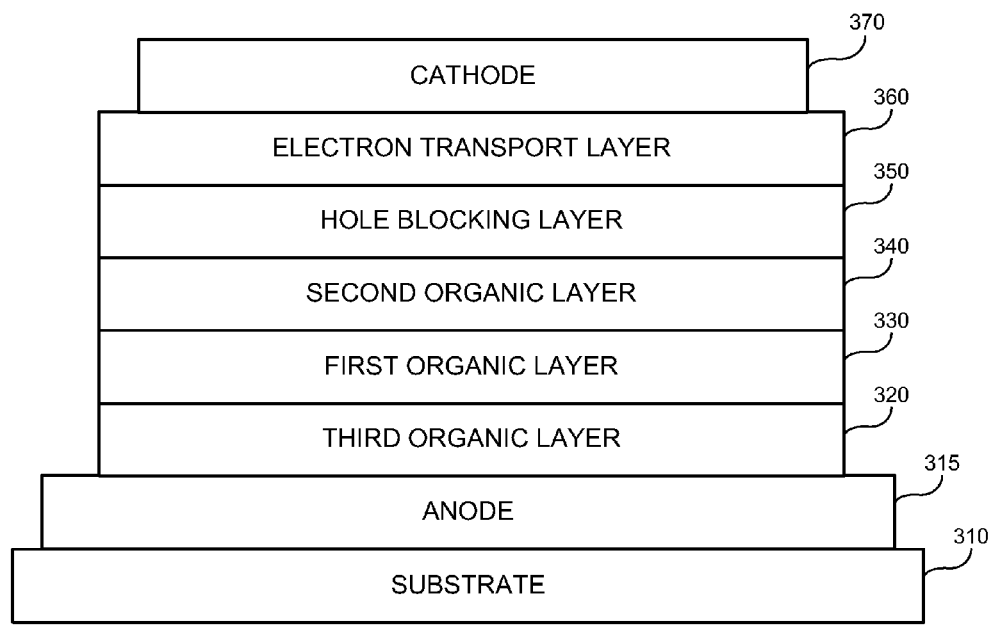
FIG. 3 shows an organic light emitting device having first and second organic layers with different concentrations of phosphorescent material and non-emissive materials, and organic layers between the first organic layer and the anode with specific charge carrier mobility characteristics.

FIG. 3 shows an organic light emitting device having first and second organic layers with different concentrations of phosphorescent material and non-emissive materials, and organic layers between the first organic layer and the anode with specific charge carrier mobility characteristics. As illustrated, the device of FIG. 3 includes a substrate 310, an anode 315, a third organic layer 320, an emissive layer having a first organic layer 330 and a second organic layer 340, a hole blocking layer 350, an electron transport layer 360, and a cathode 370. Hole blocking layer 350 and electron transport layer 360 are optional. The device of FIG. 3, and various other devices shown herein, is shown with the anode adjacent to the substrate, as is common for many devices, but the devices could also have the cathode adjacent to the substrate.

First organic layer 330 is disposed between the anode and the cathode, and includes a phosphorescent material and a non-emissive material. The concentration of the phosphorescent material in the first organic layer is 10-90 wt %. The concentration of the non-emissive material in the first organic layer is 10-90 wt %. Second organic layer 340 is disposed between the first organic layer and the cathode. Second organic layer 340 is preferably in direct contact with first organic layer 330, but there may also be a thin organic layer in between first and second organic layers 330 and 340 that is capable of transporting both electrons and holes. Second organic layer also include a phosphorescent material and a non-emissive material. The concentration of the phosphorescent material in the second layer is 3-25 wt %. The concentration of the non-emissive material in the second organic layer is 75-97 wt %. The concentration of the phosphorescent material in the second organic layer is lower than the concentration of the phosphorescent material in the first organic layer. As a result of the different concentrations of phosphorescent materials in first and second organic layers 330 and 340, there is an "interface" between these layers. In one aspect, first and second organic layers 330 and 340 include only the phosphorescent material and the non-emissive material. This is favorable because minimizing the number of materials simplifies fabrication, and avoids failure mechanisms that may be associated with additional materials.

FIG. 3, as well as other Figures, show organic layers that include a "phosphorescent" material and a "non-emissive" material.

As used herein, the "phosphorescent" material is a material capable of emitting light from a triplet excited state at room temperature, for example, at about 18-25 degrees C. However, any given phosphorescent material may or may not emit light in a particular layer or in a particular device. In many of the architectures disclosed herein, the phosphorescent material does emit light. However, in other architectures, the phosphorescent material does not emit light, but rather transfers excitons to other molecules, which may be phosphorescent or fluorescent, which then emit light. The phosphorescent nature of the material still plays a role in these devices, because the ability to emit light from a triplet excited state at room temperature is correlated with other properties, such as intersystem crossing and strong spin orbit coupling, which allow triplets to efficiently form on the molecule and transfer to other molecules, even though it may not emit light. In addition, many phosphorescent materials are also good hole transporters. The definition of the term "phosphorescent" as defined this application is believed to be generally consistent with its use in the art, but is not intended to extend to other applications where the term may be used in a different manner.

As used herein, the "non-emissive" material does not emit light in the device for which the material is described as "non-emissive." However, the non-emissive material is not necessarily electrically inert in the device, and may often be involved with charge transport, most often electron transport. The material may be emissive in other contexts, for example in solution or in other devices. Generally, if the "non-emissive" material is capable of emitting light in contexts other than the device in which it is included as a non-emissive material, solid-state considerations in the particular device make it such that the material does not emit light in the device. For example, the "non-emissive" material may be doped with a phosphorescent material having a triplet energy that is at least 0.1 eV lower than that of the non-emissive material, such that any triplets that do form on the non-emissive material transfer to the phosphorescent material rather than emit light.

Without being limited to any theory as to how aspects of the invention work, it is believed that, in many phosphorescent OLEDs, recombination occurs at or near an interface somewhere in the device, because electron and hole mobilities may be different on either side of the interface, and because electrons and holes may have difficulty crossing the interface. If the emissive layer does not include any internal interfaces, recombination may be likely to occur at or near the interface of the emissive layer with a non-emissive layer. Thus, excitons and both types of charge carriers are located in significant concentrations near the non-emissive layer in question. Where the non-emissive layer is susceptible to damage from excitons and/or charge carriers, device lifetime may be adversely affected. In addition, the proximity of a non-emissive layer to the recombination zone may provide non-emissive decay routes for excitons, adversely affecting device efficiency.

It is further believed that, in many phosphorescent devices, the phosphorescent material is responsible for the transport of holes in the emissive layer, and that a non-emissive host material is responsible for the transport of electrons. It is believed that the change in concentration of phosphorescent material between first organic layer 330 and second organic layer 340 may cause the mobility of electrons to be higher in first organic layer 330 than in second organic layer 340, and the mobility of holes to be higher in second organic layer 340 than in first organic layer 330. As a result, recombination of electrons and holes may occur at or near the interface between first organic layer 330 and second organic layer 340. The concentration of phosphorescent material in second organic layer 340 is preferably at least 5 wt % lower than the concentration in first organic layer 330, and is more preferably at least 10 wt % lower. Together, first organic layer 330 and second organic layer 340 may form the emissive layer of the device. Because recombination occurs at or near an interface between first and second organic layers 330 and 340, i.e., at an interface within the emissive layer, issues caused by recombination near interfaces with a non-emissive layer may be avoided. The reasoning described in these paragraph applies to various devices described herein that have an emissive layer with an internal interface, i.e., an interface between the first and second organic layers.

The phosphorescent material of first organic layer 330 and second organic layer 340 may be the same material, or may be different phosphorescent materials. The non-emissive material of first organic layer 330 and second organic layer 340 may be the same material, or different materials. Thus, there are four combinations: (1) same phosphorescent material in both first and second organic layers, and same non-emissive material in both first and second organic layers; (2) different phosphorescent material in the first and second organic layers, and same non-emissive material in both first and second organic layers; (3) same phosphorescent material in both first and second organic layers, and different non-emissive material in first and second organic layers; and (4) different phosphorescent material in the first and second organic layers, and different non-emissive material in the first and second organic layers. There are advantages to each combination.

Using the same non-emissive material in both first organic layer 330 and second organic layer 340 simplifies fabrication by reducing the number of materials in the device. In addition, since each new material may introduce new failure mechanisms, using the same material in multiple layers may reduce failure mechanisms. Using the same non-emissive material may also assist in spreading out the recombination zone for the device, which is also helpful to achieving higher device lifetime, while still allowing recombination to occur near an interface between first organic layer 330 and second organic layer 340 by adjusting the concentration of non-emissive materials at the interface.

However, using different non-emissive materials in first organic layer 330 and second organic layer 340 also has advantages. Different materials may have different charge transport properties. Where the non-emissive materials are predominantly responsible for the transport of a particular charge carrier, most often electrons, using different non-emissive materials in first organic layer 330 and second organic layer 340 may make it easier to control where recombination occurs in the device. Specifically, by choosing different non-emissive materials for first organic layer 330 and second organic layer 340, it may be easier to create a gradient of charge carriers near an interface between first organic layer 330 and second organic layer 340, because the difference in non-emissive materials may be used for this purpose in addition to the concentration of non-emissive materials.

Using the same phosphorescent material in both first organic layer 330 and second organic layer 340, but at different concentrations, has many of the same advantages as described above with respect to use of the same non-emissive material. Fewer materials may mean fewer failure mechanisms. The different concentrations may allow recombination to be controlled to occur near an interface between first organic layer 330 and second organic layer 340, while the use of the same phosphorescent material allows the recombination zone to be relatively broad.

Using different phosphorescent materials in both first organic layer 330 and second organic layer 340, at different concentrations, has many of the same advantages as described above with respect to the use of different non-emissive materials. The use of different materials may add an extra parameter that may be used to control where recombination occurs.

In addition, the phosphorescent materials may or may not emit light in the device. Where highly efficient saturated emission is desired, perhaps for use in a display device that requires saturated emission, it may be preferable to use the same phosphorescent material in both first organic layer 330 and second organic layer 340 as the emissive material. In a configuration where the phosphorescent material(s) transports charge but do not emit, an additional material, described as an "lower energy" material, may be added to first organic layer 330 and second organic layer 340, and emit light. By "lower energy," it is meant that the peak of the emission spectra of the lower energy emissive material is at least 20 nm higher than the peak of the emission spectra of the phosphorescent material in the same layer. Higher wavelengths correspond to lower energies. Excitons may be present on the lower energy emissive material through a variety of mechanisms, and the way in which excitons reach the lower energy emissive material is not intended to be limiting. For example, excitons may form on the phosphorescent material and transfer to the lower energy emissive material, or excitons may form directly on the lower energy emissive material. In one configuration, the lower energy emissive material may be a fluorescent material that accepts excitons from the phosphorescent material, including excitons that form as triplets on the phosphorescent material.

However, where less saturated emission is desired, perhaps white emission for general illumination purposes, it may be desirable to have multiple molecules emitting in the same device. To this end, different phosphorescent materials may be used in first and second organic layers 330 and 340 as the emitters in those layers, such that there are multiple emissive materials in the device. An additional material or materials, described as "lower energy" materials, may also be added to one or both of first and second organic layers 330 and 340. Where emission from multiple materials is desired, different lower energy emissive materials may be used in both first and second organic layers 330 and 340, or a lower energy emissive material may be used in one of the first and second organic layers 330 and 340 while the phosphorescent material emits from the other of the first and second organic layers 330 and 340.

However, devices having emissive layers with a first and second organic layer having an interface between them may still be subject to short lifetimes. It is believed that a leading failure mechanism in many phosphorescent organic light emitting devices involves electrons passing from the cathode, through the emissive layer, to organic layers on the anode side of the emissive layer. It is believed that many organic materials that are used on the anode side of OLEDs are vulnerable to damage from such electrons. FIGS. 44-50 and the associated text show the role of a common hole transport material, NPD, in shortening device lifetime. The use of an emissive layer having first and second organic layers 330 and 340 favorably allows recombination to occur at an interface within the emissive layer. As a result, the number of excitons that reach a non-emissive layer, and the number of charge carriers that cross the entire emissive layer to reach the other side (i.e., electrons reaching the anode side of the emissive layer and holes reaching the cathode side of the emissive layer) may be reduced. However, it is favorable to have a recombination zone that is spread out, which is enabled by the device architectures described herein, such that excitons and/or charge carriers may reach and damage a non-emissive layer, adversely affecting device lifetime. It is believed that one common failure mechanism involves electrons crossing the emissive layer to reach the anode side of the emissive layer, and damaging the adjacent non-emissive layer.

One way to avoid the damage and shorter device lifetimes caused by electrons damaging organic materials on the anode side of the emissive layer is to use on the anode side of the emissive layer only materials that have a hole mobility that is significantly higher than the electron mobility. The difference should be significant enough that the majority of charge carriers is of one type in that layer. With reference to FIG. 3, third organic layer 320 is on the anode side of the emissive layer, i.e., first and/or second organic layers 330 and 340. There may be more than one organic layer in the position occupied by third organic layer 320. Each organic layer between the emissive layer and the anode may include a single organic material, or multiple organic materials. For single material layers, this means that the material of each layer has a hole mobility that is significantly higher than the electron mobility of that layer. For a layer including multiple materials, this means that the hole mobility of the layer is significantly higher than the electron mobility of the layer. The hole mobility of a "layer" is strongly correlated with the hole mobility of the material in that layer that is predominantly responsible for transporting holes in the layer, particularly where the material in question is present in significant quantities. Electron and hole mobilities may be measured by various methods, including time of flight, dark current injection, and admittance spectroscopy. By significantly higher, it is meant that the hole mobility is at least twice the electron mobility, preferably at least ten times as great as the electron mobility, and most preferably at least 100 times as great as the electron mobility.

Figure 38:
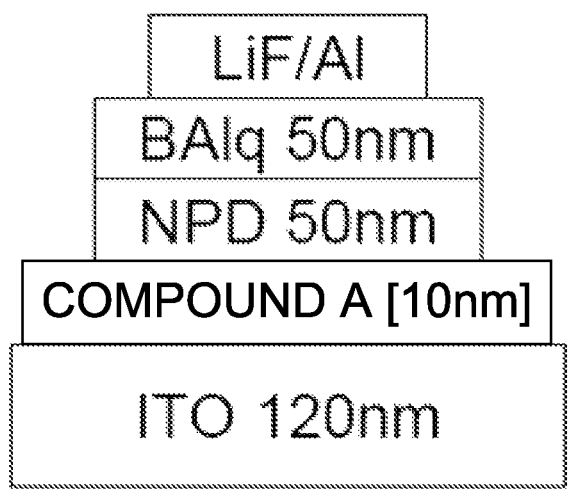
FIG. 38 shows an organic light emitting device that has emission from both NPD and BAlq.
Figure 43:
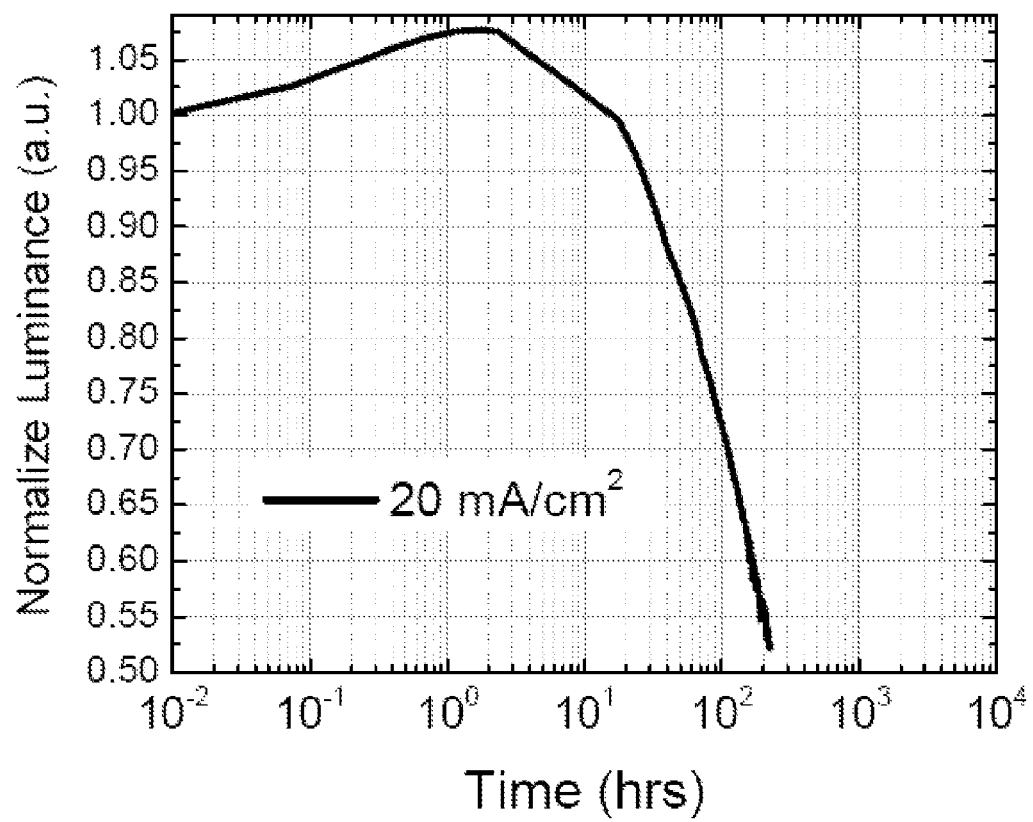
FIG. 43 shows a plot of normalized luminance versus time for the device of FIG. 38.

NPD is traditionally used a hole transport layer (HTL) and it is often in contact with the EML. However, So et al. report that NPD has an electron mobility that is similar to its hole mobility ($\sim 5\times 10^{-4}$ cm$^2$V$^{-1}$s$^{-1}$). See, So et al., 'Bipolar Carrier Transport in Organic Small Molecules for OLED,' Proceedings of the Society for Information Display. 38, 1497 (2007). This suggests that electrons may easily be transported by NPD in conventional structures. This enables two potentially unfavorable situations. Firstly, electrons and holes may recombine in NPD. NPD may be a stable hole transport layer but devices that exhibit NPD emission are not expected to be operationally stable because the emission is inefficient and NPD was not included in the device for this purpose. For example, a device with NPD and BAlq emissions is shown in FIG. 38. The lifetime (LT50) of this device, shown in FIG. 43, is less than 300 hrs when the device is drive at a constant current of 20 mA/cm$^2$. For comparison, a similar device (see FIG. 44) with only Alq emission has a much longer life time. The luminance of the Alq emitting device drops to about 86% (see FIG. 49) of its initial value after 300 hrs and for a continuous drive current of 40 mA/cm$^2$. Secondly, NPD may be intrinsically unstable to electrons. There is ample evidence to believe that NPD is stable in hole only devices; however, its stability to electrons is not established.

In a preferred aspect, third organic layer 320 is a single organic layer disposed between first organic layer 330 and anode 315, i.e., third organic layer 320 is in direct contact with first organic layer 330 and anode 315. Also in this preferred aspect, third organic layer 320 includes only the phosphorescent material of first organic layer 330. In general, electrons are present in the emissive layer of a device, and the emissive material of a device is exposed to electrons in the emissive layer. As a result, most phosphorescent emissive molecules that are used in devices having reasonably long lifetimes are resistant to damage from electrons. Thus, using the phosphorescent material of first and second organic layers 330 and 340 in an additional role, as the only organic material between first organic layer 330 and anode 315, i.e. as a hole transport molecule, may result in a device that avoids failure mechanisms associated with electron damage to organic layers on the anode side of the emissive layer.

Another way to avoid damage and shorter lifetimes caused by electrons damaging organic materials on the anode side of the emissive layer is to avoid using classes of materials on the anode side of the emissive layer that are susceptible to damage from electrons. It is believed that many materials commonly used on the anode side of the emissive layer are susceptible to such damage. NPD is one example of such materials. More generally, materials that may be favorably avoided on the anode side of the emissive layer include molecules having a group from the following list: triarylamine, napthyl, tri(N-carbazoyl)triphenylamine, tetraarylamine and carbazole.

Another way to avoid damage and shorter lifetimes caused by electrons damaging organic materials on the anode side of the emissive layer is to use materials on the anode side of the emissive layer having a high hole conductivity. A high hole conductivity may allow holes to be injected into the emissive layer at a rate sufficient to minimize the number of electrons reaching the anode side of the emissive layer. In an OLED, a useful measure of the conductivity of a layer is the voltage rise caused in a device by making a particular layer thicker. Specifically, several otherwise identical devices may be fabricated, except for one difference—the devices have a particular layer for which conductivity is being measured that has different thicknesses in different devices. Because the devices are otherwise identical, the voltage difference caused by an increase in the thickness of a particular layer may be isolated from the voltage difference due to various interfaces and layers other than the one for which conductivity is being measured. Hole conductivity specifically may be measured by performing such a measurement in a device where the layer of varying thickness is located in the device at a location where, based on the other layers in the device, electrons do not reach in large quantities and holes are the predominant charge carrier. Parameters such as carrier mobility that affect conductivity may be a function of current, although it is believed that the dependence is mild. To control for this factor, the measurements may be performed at a particular current density. 10 mA/cm$^2$ is a suitable current density that was used for the measurements described herein. The hole conductivity of NPD has been measured in this way, and it was demonstrated that the voltage across the device at a current of 10 mA/cm$^2$ increases by 0.6 V for each additional 10 nm of NPD thickness. The hole conductivity of LG101™ (available from LG, Korea) was measured in a similar way, and it was demonstrated that the voltage across the device at a current of 10 mA/cm$^2$ increases by less than 0.5 V for each additional 10 nm of LG101 thickness. These measurements are repeatable across a wide variety of device structures. A device having between the emissive layer and the anode only layers for which the voltage across the device rises by 0.1 V or less per additional 10 nm of layer thickness may favorably minimize damage to organic layers on the anode side of the emissive layer. A layer of LG101 is one example of such a layer.

Another way to avoid damage and shorter lifetimes caused by electrons damaging organic materials on the anode side of the emissive layer is to use only organometallic materials on the anode side of the emissive layer. It is believed that organometallic materials, particularly those known for use as phosphorescent emitters in organic light emitting device, are generally more resistant to damage from electrons than certain materials commonly used in hole transport layers, such as NPD. Indeed, organometallic materials used as emitters are exposed to an environment relatively rich in electrons in the emissive layer(s) of a device. Using such materials in the relatively electron poor anode side of the device should not result in significant electron damage. In addition, many organometallic materials used as emitters in organic light emitting devices are good hole transporters, and are believed in many cases to be responsible for hole transport in the emissive layers of an organic light emitting device.

Another way to avoid damage and shorter lifetimes caused by electrons damaging organic materials on the anode side of the emissive layer is to use a high triplet energy material for the first non-emissive material (i.e. the non-emissive material of the first organic layer), such as first organic layer 330. It is believed one damage mechanism that reduces device lifetime may involve triplets reaching the anode side of the emissive layer, and damaging organic materials on the anode side of the emissive layer. In a device architecture having an interface within the emissive layer, it is believed that recombination (i.e., exciton formation, including triplet formation) occurs at or near this interface. Depending upon the relative triplet energies of the various materials in the emissive layer, triplets may be present on the non-emissive material as well as the phosphorescent material. By choosing a high triplet energy material for the non-emissive material of the first organic layer, the number of triplets that are able to form on and/or transfer to the non-emissive material from other materials may be reduced. In addition, it would be energetically favorable for any triplets that are present on this non-emissive material to transfer to other molecules in the emissive layer having lower triplet energies. Because the first organic layer is within the emissive layer but on the anode side, the concentration of phosphorescent material is higher than in the second organic layer, providing more sites to which triplets can transfer from the non-emissive material of the first organic layer. Thus, using a high triplet energy material for the first non-emissive material may reduce the number of excitons reaching the anode side of the emissive layer. In this context, a "high" triplet energy material is a material having a triplet energy of 2.7 eV or greater.

Another way to achieve high device lifetimes is to use for the non-emissive material of the first organic layer a material containing a group selected from the group consisting of triphenylene, carbazole, metal quinolate, dibenzothiophene and dibenzothiophene coupled with carbazole. These materials are most useful when used in combination with other ways of avoiding damage and shorter lifetimes caused by electrons damaging organic materials on the anode side of the emissive layer Device lifetime is a particularly important issue for blue emitting phosphorescent devices, i.e., devices having a phosphorescent material with an emission spectra with its peak at a wavelength between 440 nm and 500 nm. This is because blue photons are the highest energy photons in the visible spectrum, such that blue emitting organic molecules generally have correspondingly higher triplet and/or singlet energies. As a result, many materials in a blue emitting device may be exposed to higher energy excitons and/or charge carriers than other devices. Also, the selection of materials available for use in a blue device may be limited by constraints on particular properties relating to highest occupied molecular orbitals, lowest unoccupied molecular orbitals, band gap, etc., in order to ensure proper charge transport in the device, whereas the constraints on devices emitting lower energy photons may be more relaxed. Because the selection of materials for blue devices is limited, some of the more desirable materials used for devices that emit green or red may not be viable choices for blue emitting devices. Device lifetime is also important for green emitting devices, i.e., devices having a phosphorescent material with an emission spectra with its peak at a wavelength between 500 nm and 530 nm. Some of the same issues described for blue devices apply to green devices, but to a lesser extent. Thus, many of the features described herein are particularly desirable for use in devices having these wavelengths, particularly blue. However, the features may be used in devices that emit any color.

Preferably, the total thickness of first organic layer 330 and second organic layer 340 is at least 400 Å, and the thickness of first organic layer 330 is at least 50 Å and the thickness of second organic layer 340 is at least 50 Å. At these thicknesses, the total thickness of first and second organic layers 330 and 340 is sufficiently large to allow for a wide recombination zone. Also, the minimum thicknesses for each of the layers means that the interface between first and second organic layers 330 and 340, at which or near much of the recombination may occur, is at least 50 Å away from other layers that may contain other materials. As a result, any device lifetime issues caused by such other materials may be reduced.

Preferably, the phosphorescent material has a highest occupied molecular orbital that is at least 0.3 eV higher than the highest occupied molecular orbital of the non-emissive material. As a result, it is likely that hole transport in first and second organic layers 330 and 340 will occur predominantly on the phosphorescent material. As a result, the difference in concentration of the phosphorescent material between first and second layers 330 and 340 is likely to result in a significant difference in the hole transport properties of the two layers, such that recombination occurs at or near the interface between the two layers.

When hole blocking layer 350 is present, there are several preferred material selections for the layer. Without intending to be limited to any theory as to why aspects of the invention work, the purpose of hole blocking layer 350 is to prevent holes from moving from second organic layer 340 into hole blocking layer 350. Hole blocking layer 350 is disposed between second organic layer 340 and cathode 360, and is in direct contact with second organic layer 340. Layer 350 may also be referred to as a "fourth" organic layer.

One way to prevent holes from moving into hole blocking layer 350 is to use the non-emissive material of first and second organic layers 330 and 340 for hole blocking layer 350. Because the phosphorescent material of first and second organic layers 330 and 340 is not present in hole blocking layer 350, and that material is responsible for hole transport in first and second organic layers 330 and 340, holes may not be able to enter hole blocking layer 350. This is particularly true where the phosphorescent material has a highest occupied molecular orbital that is at least 0.3 eV higher than the highest occupied molecular orbital of the non-emissive material, as described above. The use of this particular non-emissive material in hole blocking layer 350 is desirable for several reasons. First, the material is already present in first and second organic layers 330 and 340, so the use of this material in hole blocking layer 350 should not introduce any additional materials related failure mechanisms to the device. Second, it is believed that, in many devices, the non-emissive material of an emissive layer is predominantly responsible for electron transport in the emissive layer, such that there should not be any issues caused by the use of this material for transporting electrons from the cathode side of the emissive layer and injecting them into the emissive layer. In addition, fabrication is simplified by keeping the number of different materials to a minimum. Preferably, hole blocking layer includes only the non-emissive material of first and second organic layers 330 and 340, possibly with minor impurities that do not affect device properties. However, other materials may also be used for hole blocking layer 350, such as materials having highest occupied molecular orbitals at least 0.3 eV higher then that of the phosphorescent material of second organic layer 340.

Layer 350 may also serve to block excitons from leaving second organic layer 340. Preferably, layer 350 includes only materials having a triplet energy at least 0.1 eV higher than the triplet energy of the emissive dopant.

Figure 4:
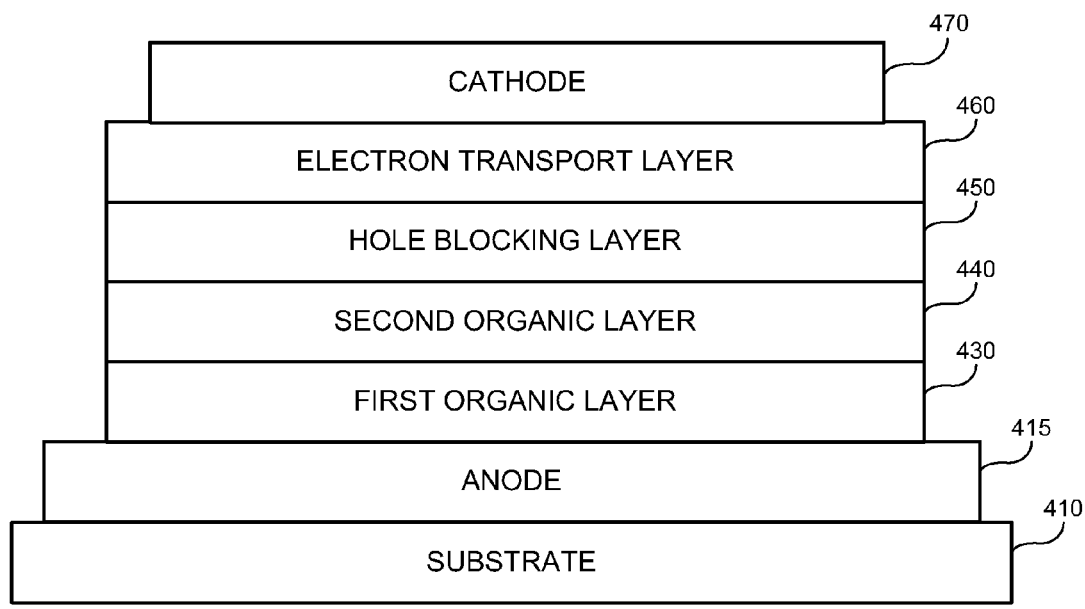
FIG. 4 shows an organic light emitting device having first and second organic layers with different concentrations of phosphorescent material and non-emissive materials, and no organic layers between the first organic layer and the anode.

Another way to avoid damage and shorter lifetimes caused by electrons damaging organic materials on the anode side of the emissive layer is to simply avoid using any organic materials on the anode side of the emissive layer. FIG. 4 shows an organic light emitting device with an emissive layer having first and second organic layers with different concentrations of phosphorescent material and non-emissive materials, and no organic layers between the first organic layer and the anode. As illustrated, the device of FIG. 4 includes a substrate 410, an anode 415, an emissive layer having a first organic layer 430 and a second organic layer 440, a hole blocking layer 450, an electron transport layer 460, and a cathode 470. Hole blocking layer 450 and electron transport layer 460 are optional.

First organic layer 430 is disposed between the anode and the cathode, and includes a phosphorescent material and a non-emissive material. The concentration of the phosphorescent material in the first organic layer is 10-90 wt %. The concentration of the non-emissive material in the first organic layer is 10-90 wt %. Second organic layer 440 is disposed between the first organic layer and the cathode, and is in direct contact with first organic layer 430. Second organic layer includes the phosphorescent material and the non-emissive material of the first organic layer. The concentration of the phosphorescent material in the second layer is 3-25 wt %. The concentration of the non-emissive material in the second organic layer is 75-97 wt %. The concentration of the phosphorescent material in the second organic layer is lower than the concentration of the phosphorescent material in the first organic layer. In one aspect, first and second organic layers 430 and 440 include only the phosphorescent material and the non-emissive material.

The device of FIG. 4 relies on a combination of features to achieve a long-lived device. Simply avoiding the use of any organic layers between the anode and an emissive layer is not likely to result in a good device, because of issues caused by the anode-emissive layer interface, and particularly by recombination at or near that interface. However, the device of FIG. 4 also includes different layers with different concentrations of phosphorescent emissive dopant. As with the device of FIG. 3, it is believed that the change in concentration of phosphorescent material between first organic layer 430 and second organic layer 440, resulting in an interface within the emissive layer, may cause the mobility of electrons to be higher in first organic layer 430 than in second organic layer 440, and the mobility of holes to be higher in second organic layer 440 than in first organic layer 430. As a result, recombination of electrons and holes may occur at or near the interface between first organic layer 430 and second organic layer 440. Thus, the device of FIG. 4 avoids issues that may have been present in prior devices with an emissive layer in contact with an anode. The device of FIG. 4 also avoids issues that may have been present in prior devices caused by electron damage to organic materials between the emissive layer and the anode, because the device of FIG. 4 does not have any such organic materials to be damaged by electrons.

Figure 5:
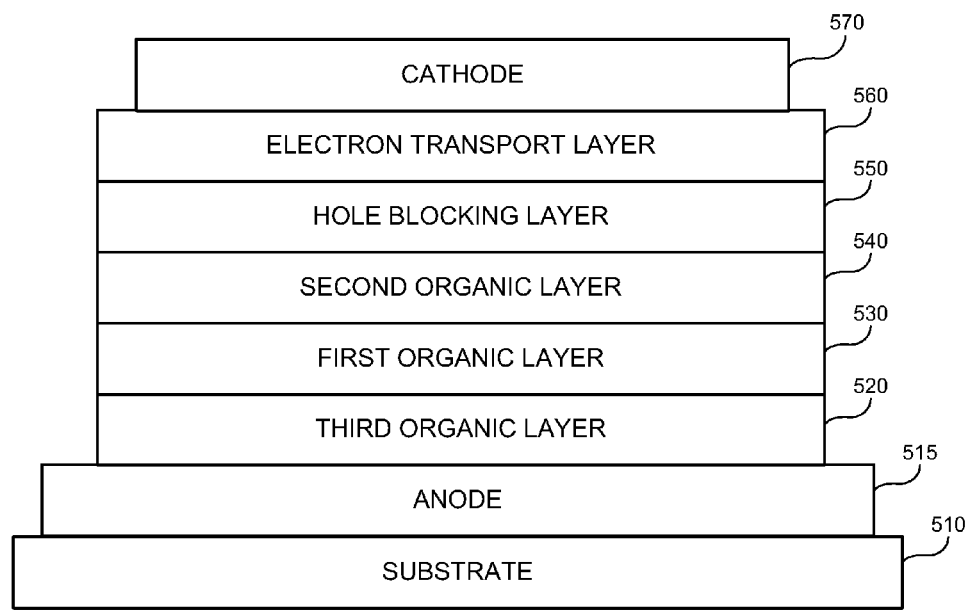
FIG. 5 shows an organic light emitting device having only three organic materials.

FIG. 5 shows an organic light emitting device having only three organic materials. As illustrated, the device of FIG. 5 includes a substrate 510, an anode 515, a third organic layer 520, an emissive layer having a first organic layer 530 and a second organic layer 540, a hole blocking layer 550, an electron transport layer 560, and a cathode 570.

First organic layer 530 is disposed between the anode and the cathode, and includes a phosphorescent material and a non-emissive material. The concentration of the phosphorescent material in the first organic layer is 10-90 wt %. The concentration of the non-emissive material in the first organic layer is 10-90 wt %. Second organic layer 540 is disposed between the first organic layer and the cathode, and is in direct contact with first organic layer 530. Second organic layer includes the phosphorescent material and the non-emissive material of the first organic layer. The concentration of the phosphorescent material in the second layer is 3-25 wt %. The concentration of the non-emissive material in the second organic layer is 75-97 wt %. The concentration of the phosphorescent material in the second organic layer is lower than the concentration of the phosphorescent material in the first organic layer. First and second organic layers 530 and 540 include only the phosphorescent material and the non-emissive material.

Third organic layer 520 includes only the phosphorescent material of first organic layer 530, and is in direct contact with first organic layer 530. In third organic layer 520, the phosphorescent material may not actually emit, but rather may serve to transport holes from anode 515 and inject the holes into first organic layer 530.

Hole blocking layer 550 includes only the non-emissive material of first organic layer 530. Without being limited to any theory as to how aspects of the invention work, it is believed that hole transport in first and second layers 530 and 540 occurs on the phosphorescent material, and that such transport does not occur on the non-emissive material. As a result, hole blocking layer 550 is unable to transport holes from second organic layer 540, and acts as a hole blocking layer.

Thus, there are only two organic materials used between third organic layer 520, first organic layer 530, second organic layer 540, and third organic layer 550. The third organic material in the device of FIG. 5 is an electron transporting material present as the only material in electron transport layer 560.

While many of the devices illustrated herein have various layers that may or may not be present in aspects of the invention as practiced, the specific device illustrated in FIG. 5 is intended to have exactly the layers shown, with no additions and no omissions, and is intended to include only three organic materials. As a result, damage mechanisms associated with extra layers and extra organic materials may be avoided. The phosphorescent material is the emissive material of the device.

In a different aspect, the device of FIG. 5 may be modified in a limited way to include a fourth organic material, such that the device includes only four organic materials, and one of the organic materials is an electron transport material present in the device only between the emissive layer and the cathode. This aspect allows for three organic materials to be present in the emissive layer of the device, plus any hole transport, hole injection, and/or blocking layers that are present in the device. For example, the device may include two different phosphorescent materials and a single non-emissive material in the emissive layer, a single phosphorescent material and two different non-emissive materials in the emissive layer, or a phosphorescent material, a non-emissive material, and a lower energy emissive material.

Figure 6:
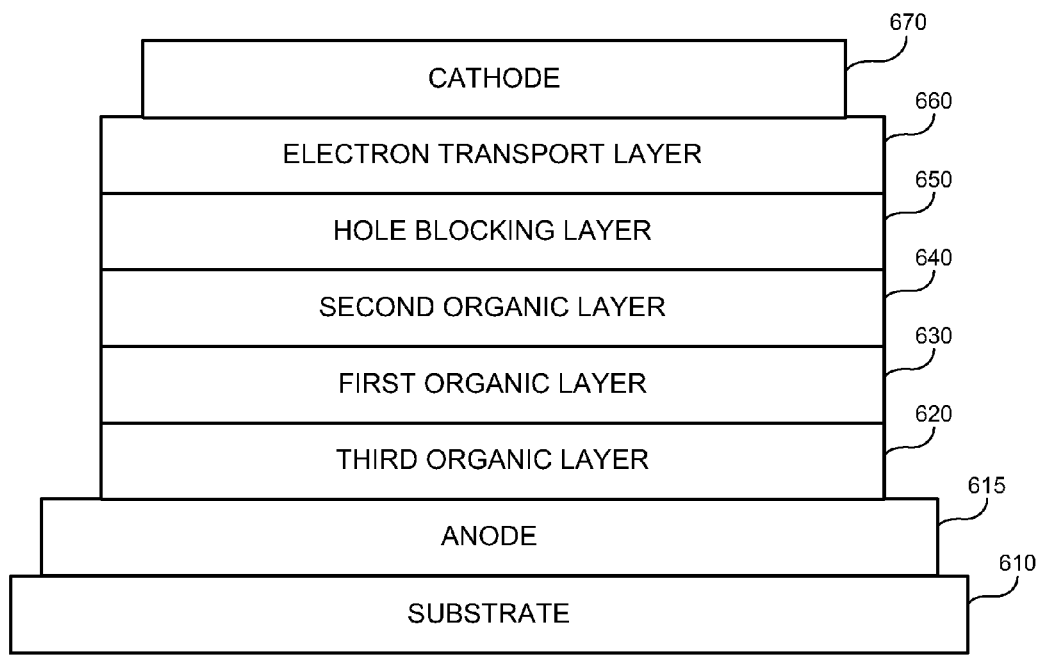
FIG. 6 shows an organic light emitting device similar to that of FIG. 3, but including multiple phosphorescent materials.

FIG. 6 shows an organic light emitting device similar to that of FIG. 3, but including multiple phosphorescent materials. As illustrated, the device of FIG. 6 includes a substrate 610, an anode 615, a third organic layer 620, an emissive layer having a first organic layer 630 and a second organic layer 640, a hole blocking layer 650, an electron transport layer 660, and a cathode 670. Third organic layer 620, hole blocking layer 650 and electron transport layer 660 are optional.

First organic layer 630 is disposed between the anode and the cathode, and includes a first phosphorescent material and a non-emissive material. The concentration of the first phosphorescent material in the first organic layer is 3-50 wt %. The concentration of the non-emissive material in the first organic layer is 10-97 wt %. Second organic layer 640 is disposed between first organic layer 630 and the cathode, and is in direct contact with first organic layer 630. Second organic layer 640 includes the first phosphorescent material and the non-emissive material of the first organic layer. The concentration of the first phosphorescent material in the second layer is 3-25 wt %. The concentration of the non-emissive material in the second organic layer is 10-90 wt %. The concentration of the first phosphorescent material in the second organic layer is lower than the concentration of the phosphorescent material in the first organic layer.

First organic layer 630, second organic layer 640, or both, include a lower energy emissive material present in a concentration 0.1-12 wt %. The lower energy emissive material may be a fluorescent emissive material. Where the lower energy emissive material is fluorescent, the device may exhibit phosphorescent-sensitized fluorescent emission, i.e., energy may be transferred from triplets on the first phosphorescent material to the fluorescent emissive material.

Both first organic layer 630 and second organic layer 640 may include the lower energy emissive material present in a concentration 0.1-12 wt %. Or, only first organic layer 630 may include the lower energy emissive material present in a concentration 0.1-12 wt %, while second organic layer 640 does not include the lower energy emissive material. Or, only second organic layer 640 may include the lower energy emissive material present in a concentration 0.1-12 wt %, while first organic layer 630 does not include the lower energy emissive material.

In one aspect, first organic layer 630 includes only the first phosphorescent material and the non-emissive material, and second organic layer 640 includes only the first phosphorescent material, the non-emissive material, and the lower energy emissive material. In this particular aspect, because the sum of the percentages from all of the materials in any given layer adds to 100%, the concentration of the non-emissive material in the first organic layer is 50-97 wt %, and the concentration of the non-emissive material in the second organic layer is 63-90 wt %.

Both the first phosphorescent material and the lower energy emissive material may emit in the device of FIG. 6. For example, if the first phosphorescent material is the only emissive material present in first organic layer 630, it may emit from that layer. If both the first phosphorescent material and the lower energy emissive material are present in second organic layer 640, and the lower energy emissive material is phosphorescent with a lower triplet energy than the first phosphorescent material, emission from the second phosphorescent material may be favored in second organic layer 640. However, depending upon the concentrations of the first and second phosphorescent materials in second organic layer 640, there may still be some emission from the first phosphorescent material in second organic layer 640. In any event, first phosphorescent material may emit from first organic layer 630. As a result, the device of FIG. 6 may have multiple emissive materials with different emission spectra, such that a broad overall emission for the device may be achieved. Such an emission spectrum is desirable for certain applications, such as general illumination.

Figure 7:
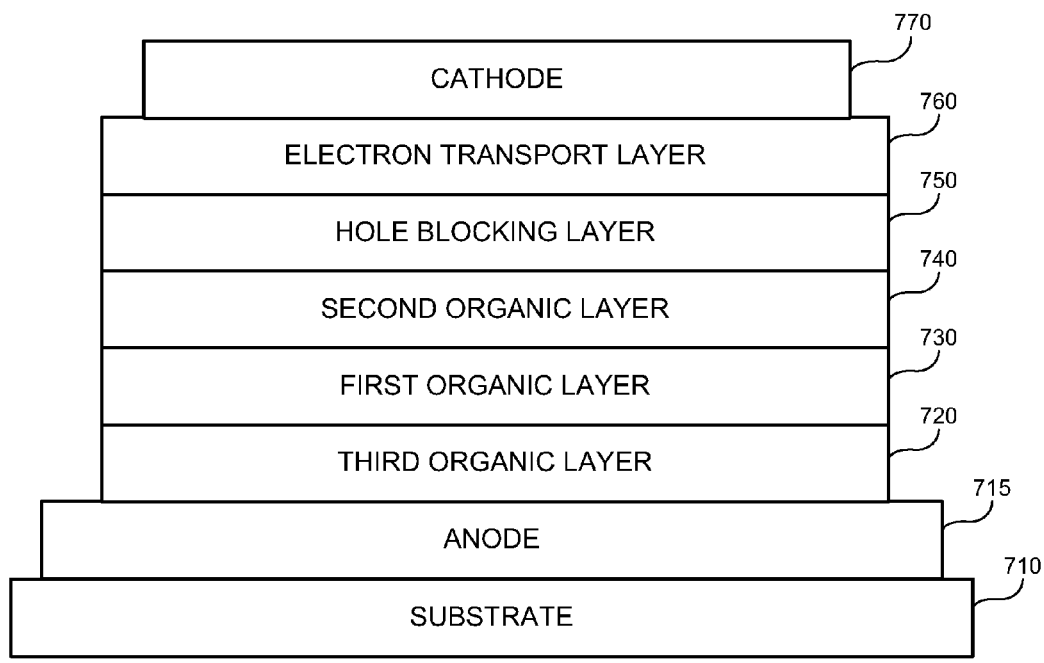
FIG. 7 shows an organic light emitting device having first and second organic layers with different concentrations of phosphorescent material and non-emissive materials, and organic layers between the first organic layer and the cathode with specific charge carrier mobility characteristics.

FIG. 7 shows an organic light emitting device with an emissive layer having first and second organic layers with different concentrations of phosphorescent material and non-emissive materials, and organic layers between the first organic layer and the cathode with specific charge carrier mobility characteristics. The device of FIG. 7 applies concepts similar to those described for FIG. 3, but as applied to a device where a phosphorescent material is predominantly responsible for electron transport in the emissive layer and not hole transport. While the most common phosphorescent devices do not include an emissive layer where electrons are transported on the phosphorescent material, it is believed that Compound S is an example of a phosphorescent molecule that may transport electrons in an emissive layer. As illustrated, the device of FIG. 7 includes a substrate 710, an anode 715, a third organic layer 720, a first organic layer 730, a second organic layer 740, a hole blocking layer 750, an electron transport layer 760, and a cathode 770. Third organic layer 720, hole blocking layer 750 and electron transport layer 760 are optional.

First organic layer 730 is disposed between the anode and the cathode, and includes a phosphorescent material and a non-emissive material. The concentration of the phosphorescent material in the first organic layer is 3-25 wt %. The concentration of the non-emissive material in the first organic layer is 75-97 wt %. Second organic layer 740 is disposed between the first organic layer and the cathode, and is in direct contact with first organic layer 730. Second organic layer 740 includes the phosphorescent material and the non-emissive material of the first organic layer. The concentration of the phosphorescent material in the second organic layer is 10-90 wt %. The concentration of the non-emissive material in the second organic layer is 10-90 wt %. The concentration of the phosphorescent material in the second organic layer is higher than the concentration of the phosphorescent material in the first organic layer.

The device of FIG. 7 operates on a principle similar to that of FIG. 3, but different in that is intended for material combinations where a phosphorescent emissive dopant is responsible for electron transport, but not hole transport. Thus, second organic layer 740, which closer to cathode 770 than first organic layer 730, has a higher concentration of the electron-transporting phosphorescent material than first organic layer 730. Thus, electron mobility should drop in first organic layer 730 relative to second organic layer 740, such that recombination may occur at or near the interface between first organic layer 730 and second organic layer 740.

FIG. 8 shows an organic light emitting device that was fabricated using the parameters in Tables 1 and 3.

FIG. 9 shows a specific organic light emitting device that was fabricated and tested, having first and second organic layers with different concentrations of phosphorescent material and non-emissive materials.

Figure 10:
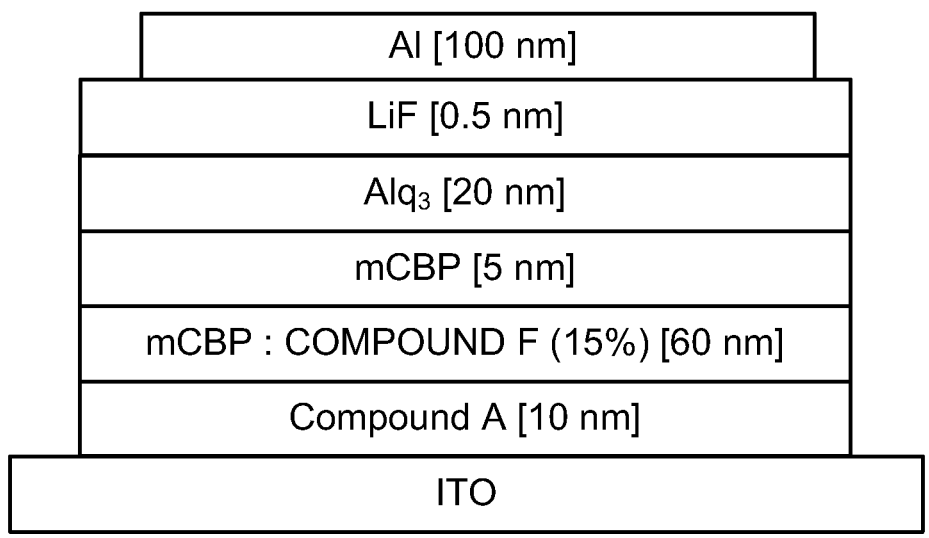
FIG. 10 shows a specific organic light emitting device that was fabricated and tested.

FIG. 10 shows a specific organic light emitting device that was fabricated and tested. The device of FIG. 10 includes only four organic materials: COMPOUND A, COMPOUND F, mCBP and Alq. Specifically, the device of FIG. 10 includes, in order, an ITO anode, a 10 nm thick hole injection layer of COMPOUND A, a 60 nm thick emissive layer of mCBP doped with 15% COMPOUND F, a 5 nm thick hole blocking layer of mCBP, a 20 nm thick electron transport layer of Alq, a 0.5 nm thick inorganic electron injection layer of LiF, and a 100 nm thick Al cathode.

Figure 11:
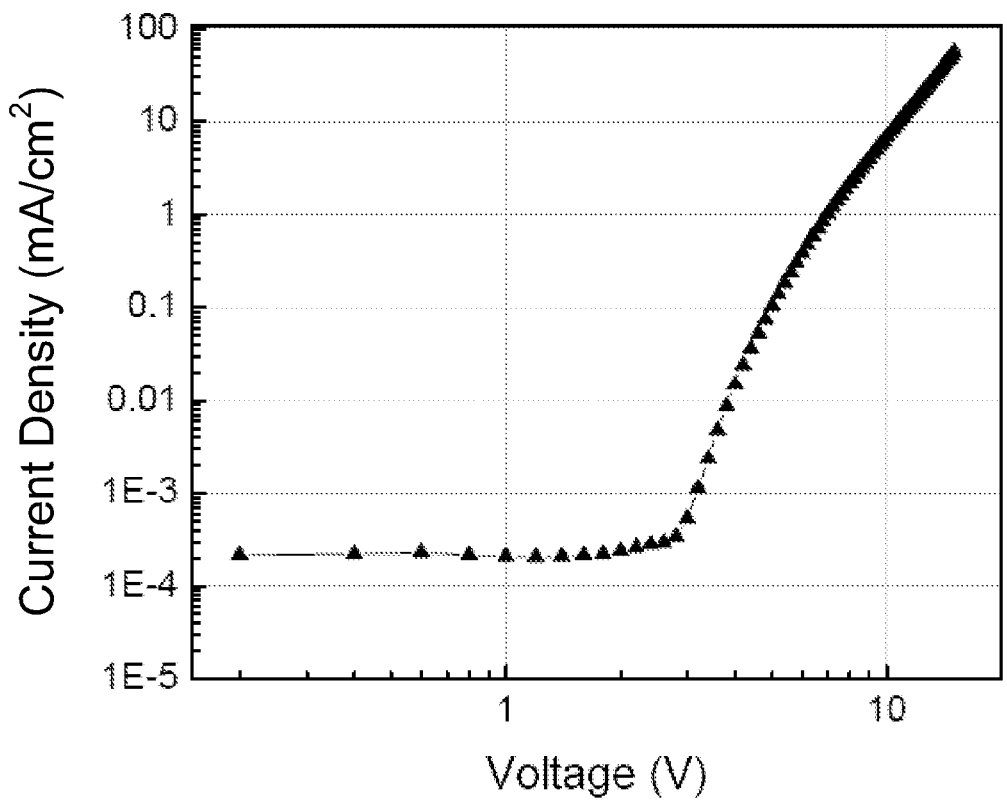
FIG. 11 shows a plot of current density versus voltage for the device of FIG. 10.

FIG. 11 shows a plot of current density versus voltage for the device of FIG. 10.

Figure 12:
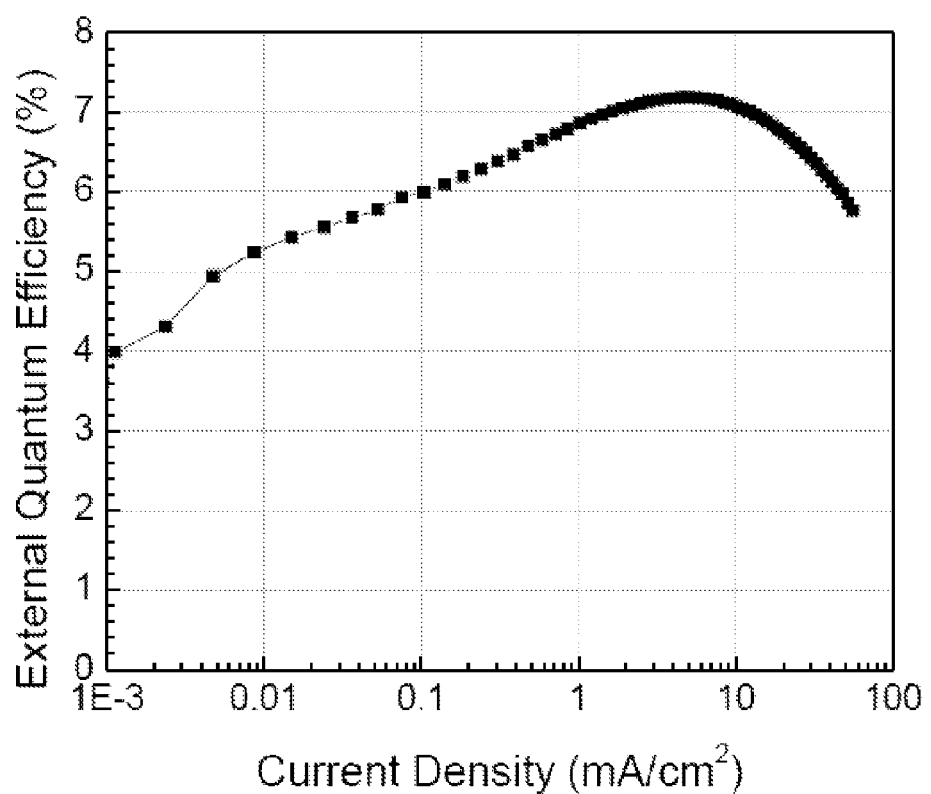
FIG. 12 shows a plot of external quantum efficiency (EQE) versus current density for the device of FIG. 10.

FIG. 12 shows a plot of external quantum efficiency (EQE) versus current density for the device of FIG. 10.

Figure 13:
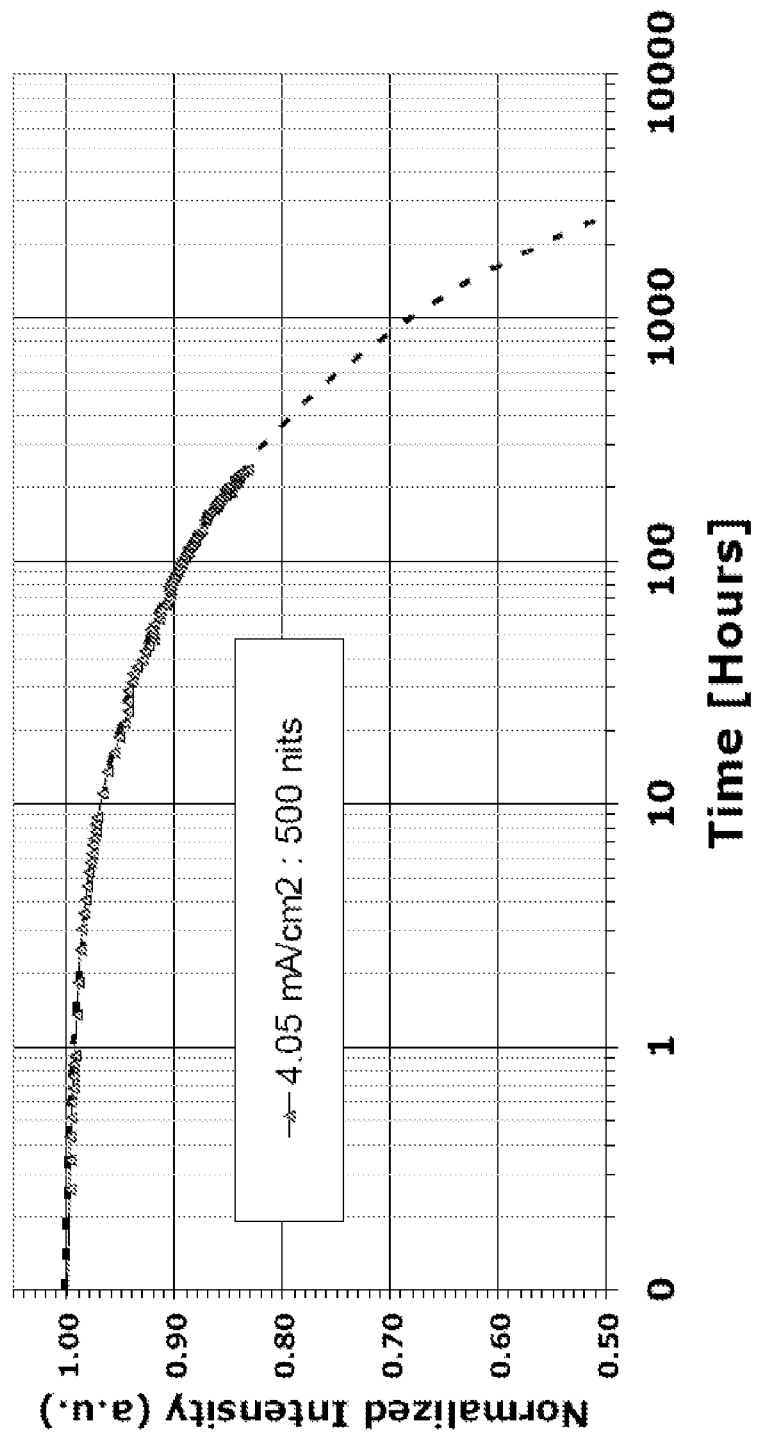
FIG. 13 shows a plot of normalized intensity (arbitrary units) versus time for the device of FIG. 10.

FIG. 13 shows a plot of normalized intensity (arbitrary units) versus time for the device of FIG. 10.

Figure 14:
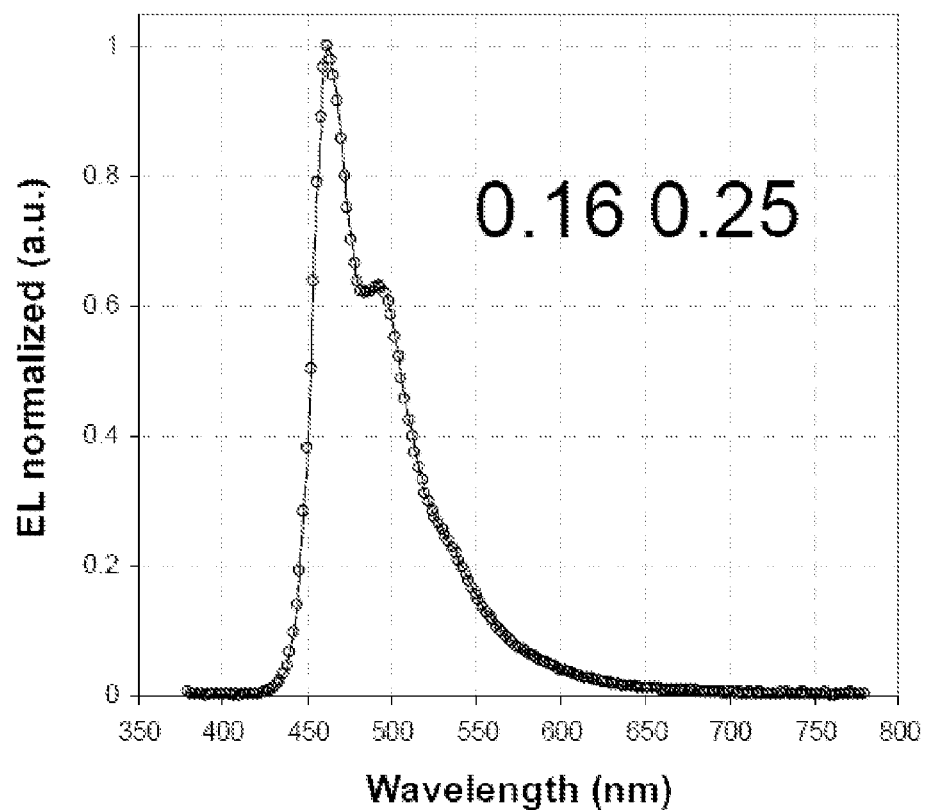
FIG. 14 shows a plot of normalized electroluminescent intensity versus wavelength for the device of FIG. 10.

FIG. 14 shows a plot of normalized electroluminescent intensity versus wavelength for the device of FIG. 10.

Figure 15:
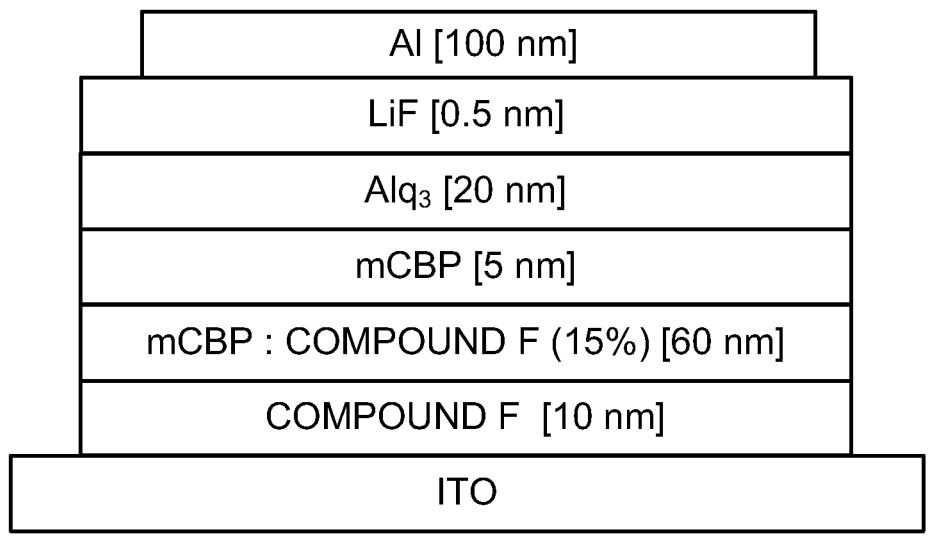
FIG. 15 shows a specific organic light emitting device that was fabricated and tested.

FIG. 15 shows a specific organic light emitting device that was fabricated and tested. The device of FIG. 15 includes only three organic materials: COMPOUND F, mCBP and Alq. Specifically, the device of FIG. 15 includes, in order, an ITO anode, a 10 nm thick hole injection layer of COMPOUND F, a 60 nm thick emissive layer of mCBP doped with 15% COMPOUND F, a 5 nm thick hole blocking layer of mCBP, a 20 nm thick electron transport layer of Alq, a 0.5 nm thick inorganic electron injection layer of LiF, and a 100 nm thick Al cathode. The device of FIG. 15 is similar to the device of FIG. 10, except that COMPOUND F is used for the hole injection layer instead of COMPOUND A. Notably, COMPOUND F is also the emissive material in the device of FIG. 15.

Figure 16:
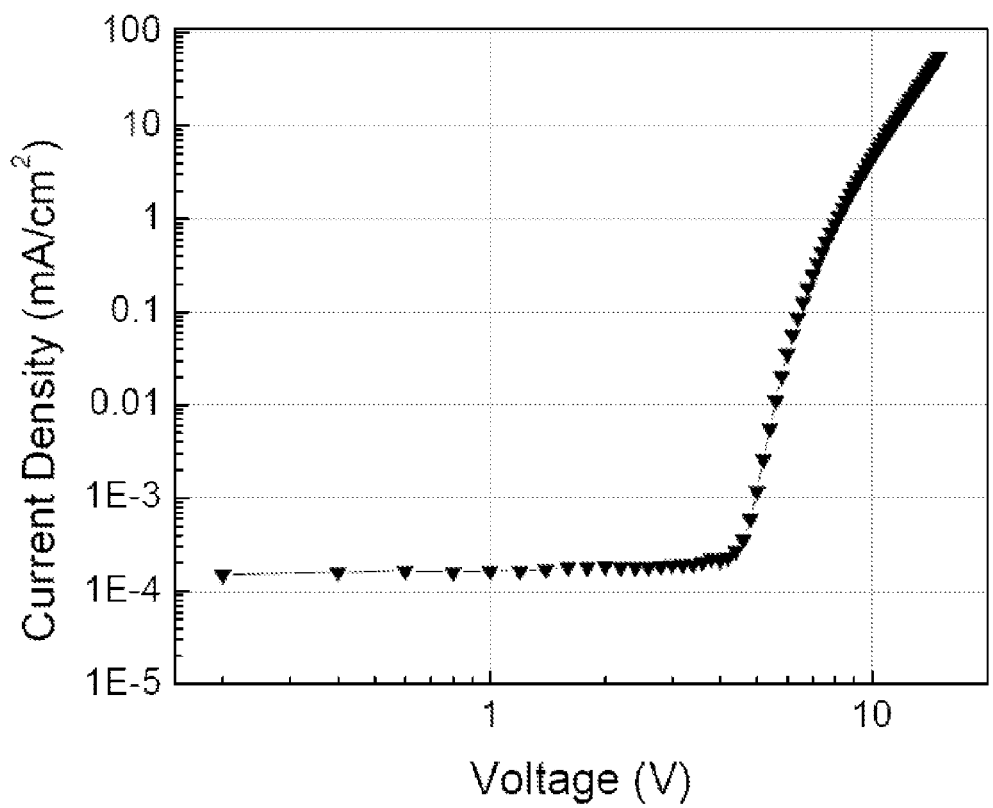
FIG. 16 shows a plot of current density versus voltage for the device of FIG. 15.

FIG. 16 shows a plot of current density versus voltage for the device of FIG. 15.

Figure 17:
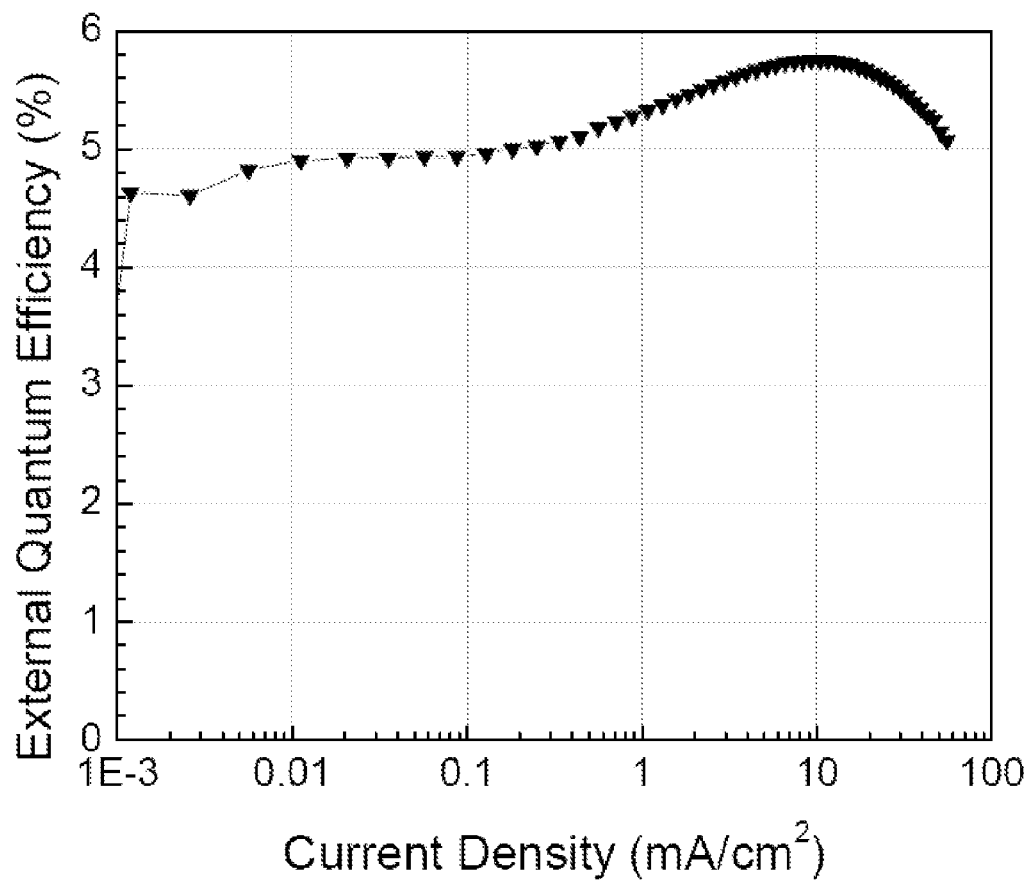
FIG. 17 shows a plot of external quantum efficiency (EQE) versus current density for the device of FIG. 15.

FIG. 17 shows a plot of external quantum efficiency (EQE) versus current density for the device of FIG. 15.

Figure 18:
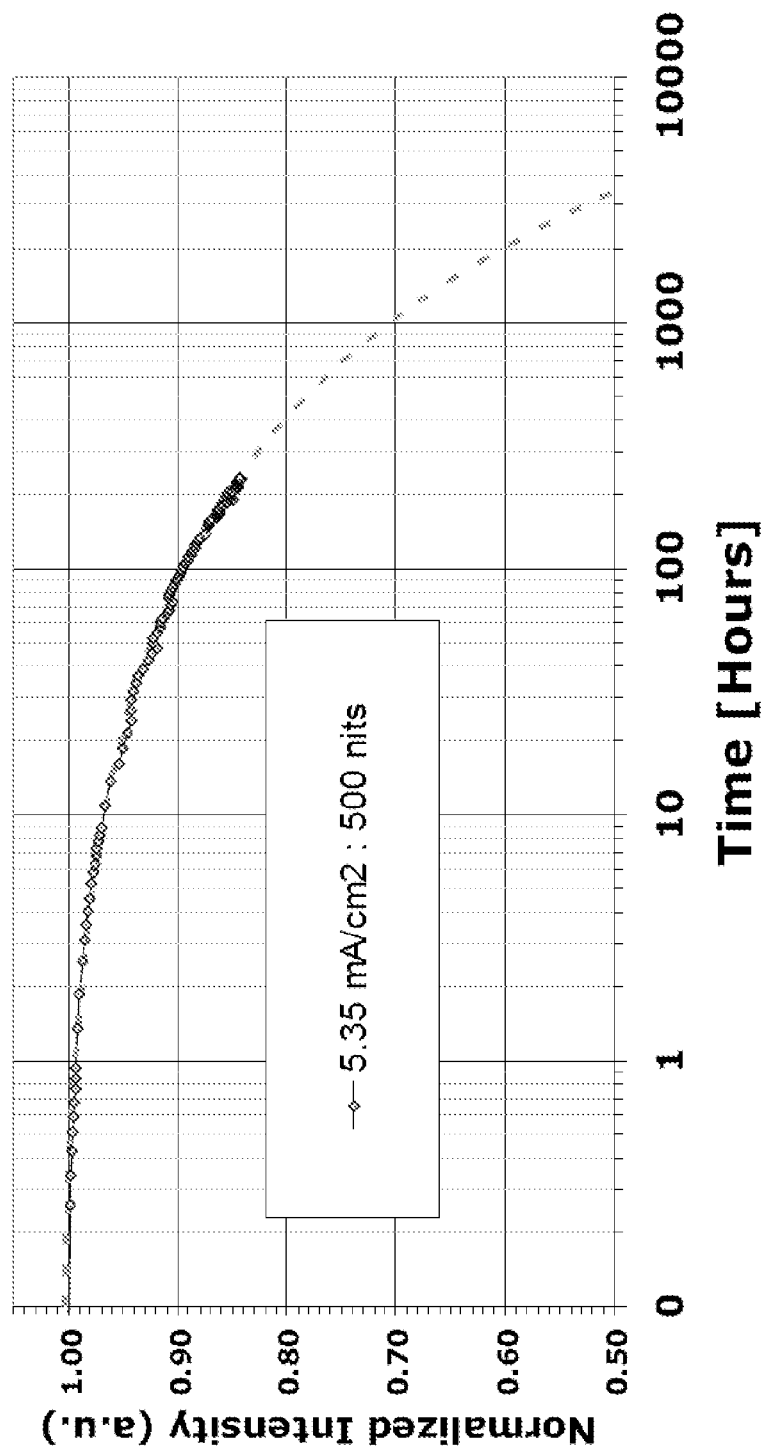
FIG. 18 shows a plot of normalized intensity (arbitrary units) versus time for the device of FIG. 15.

FIG. 18 shows a plot of normalized intensity (arbitrary units) versus time for the device of FIG. 15.

Figure 19:
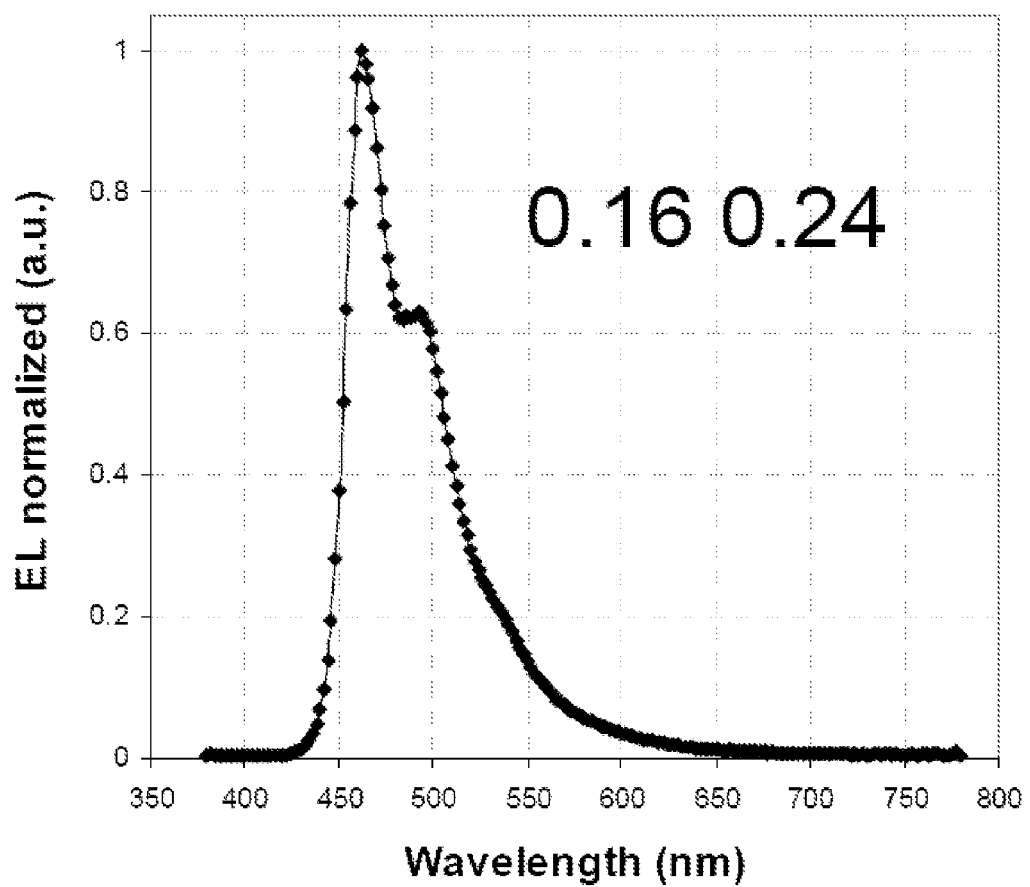
FIG. 19 shows a plot of normalized electroluminescent intensity versus wavelength for the device of FIG. 15.

FIG. 19 shows a plot of normalized electroluminescent intensity versus wavelength for the device of FIG. 15.

Figure 20:
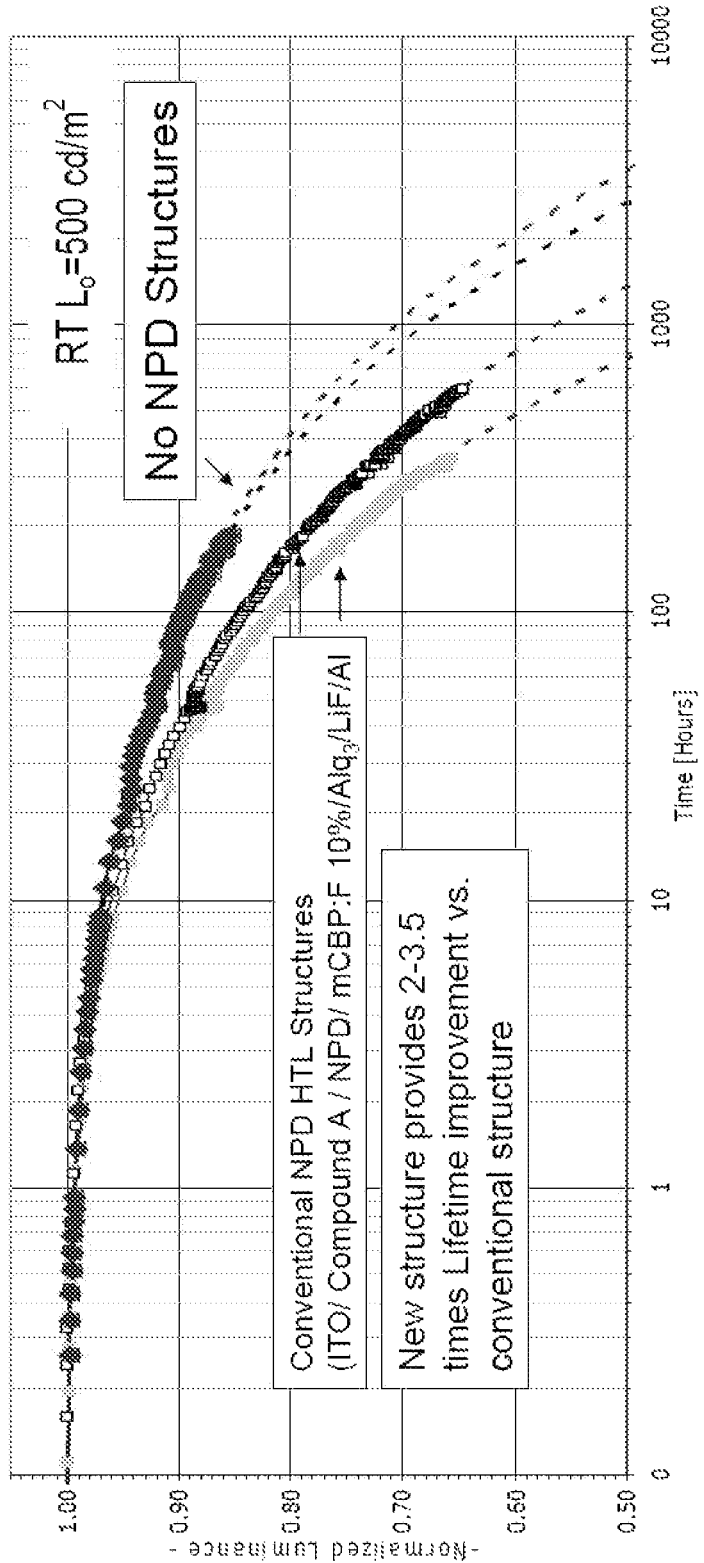
FIG. 20 shows plots of normalized luminescence versus time for various device structures.

FIG. 20 shows plots of normalized luminescence versus time for various device structures.

The device of FIG. 15, and the experimental results plotted in FIGS. 16-19, show that the device of FIG. 15 has measured results similar to that of FIG. 10. This is evidence that COMPOUND F is a good hole transporter, similar to COMPOUND A. If COMPOUND F did not have hole transport properties comparable to those of COMPOUND A, it would be expected that the device of FIG. 15 would exhibit poorer performance than that of FIG. 10 as a result of COMPOUND F being less able to transport holes.

FIG. 21 shows an organic light emitting device that was fabricated using the parameters in Table 2, having first and second organic layers with different concentrations of phosphorescent material and non-emissive materials.

Figure 22:
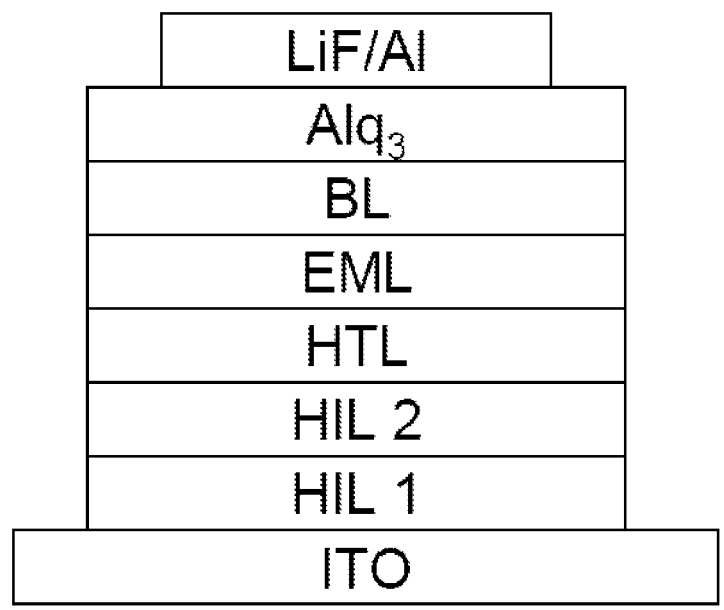
FIG. 22 shows an organic light emitting device that was fabricated using the parameters in Table 4, having first and second organic layers with different concentrations of phosphorescent material and non-emissive materials.

FIG. 22 shows an organic light emitting device that was fabricated using the parameters in Table 4, having first and second organic layers with different concentrations of phosphorescent material and non-emissive materials. Table 5 shows device performance for the devices of Table 4.

TABLE 4

|  | HIL1 | HIL2 | HTL | EML | BL 100 Å |
| --- | --- | --- | --- | --- | --- |
| Example 6 | Compound A | none | Compound D:Compound E 30% 300 Å | Compound D:Compound E 10% 300 Å | Compound D |
| Example 7 | Compound A | none | Compound C:Compound A 30% 300 Å | Compound C:Compound A 10% Å | Compound C |
| Example 8 | LG-101 | Compound A | BAlq:Compound A 30%:Compound G 3% 300 Å | BAlq:Compound A 10%:Compound T 3% Å | BAlq |
| Example 9 | Compound A | none | BAlq:Compound A 30%:Compound G 3% 300 Å | BAlq:Compound A 10%:Compound G 3% Å | BAlq |
| Comparative Example 2 | Compound A | none | NPD 400 Å | Balq:Compound G 12% | none |

TABLE 5

| | CIE | | At 1000 nits | | | At 40 mA/cm2 | |
|---|---|---|---|---|---|---|---|
| | x | y | Voltage [v] | LE [cd/A] | EQE [%] | Lo [nits] | T 80% [h] |
| Example 6 | 0.34 | 0.62 | 8.5 | 42.9 | 11.8 | 13815 | 1,700 |
| Example 7 | 0.36 | 0.61 | 7.4 | 52.6 | 14.5 | 16380 | 1,200 |
| Example 8 | 0.66 | 0.34 | 7.3 | 20.2 | 16.7 | 7359 | ~3,500 |
| Example 9 | 0.66 | 0.34 | 7.7 | 19.1 | 15.8 | 6343 | ~3,500 |
| Comparative Example 2 | 0.67 | 0.33 | 7.8 | 18.8 | 18.1 | 6382 | 963 |

Figure 23:
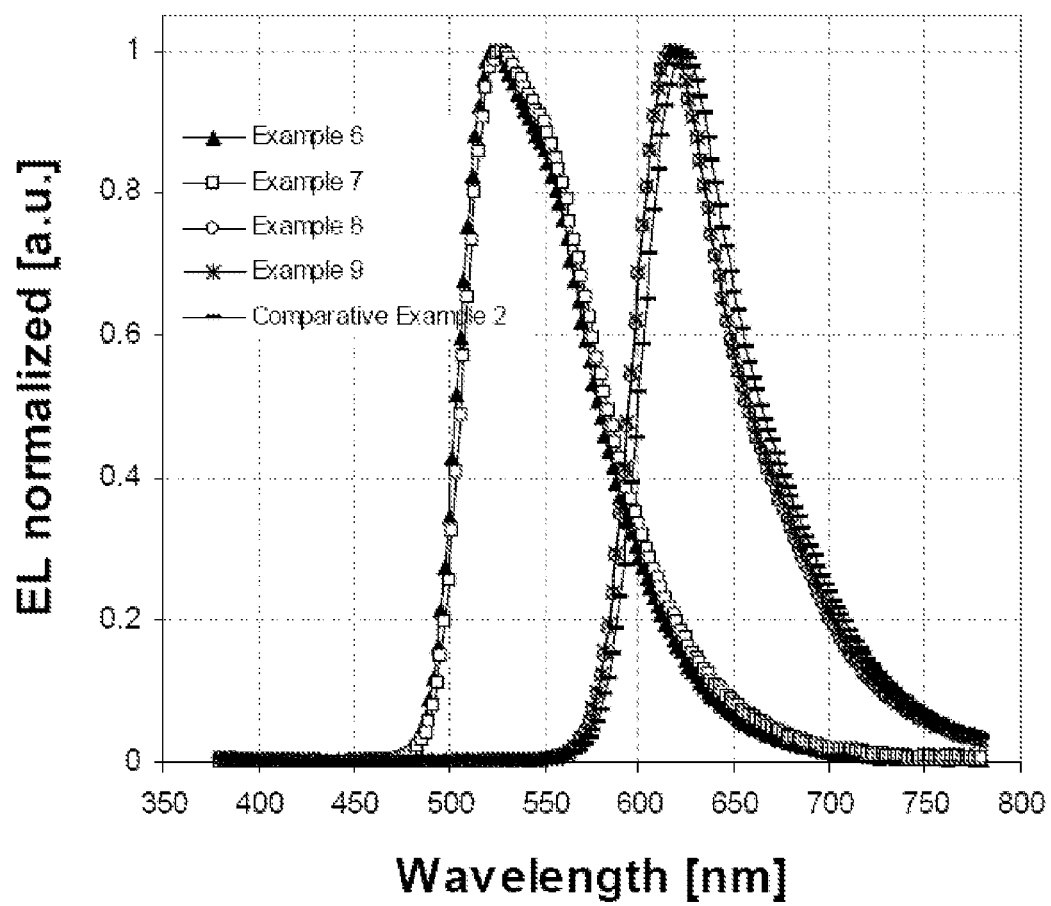
FIG. 23 shows plots of normalized electroluminescent intensity versus wavelength for devices fabricated according to FIG. 22 using parameters from Table 4.

FIG. 23 shows plots of normalized electroluminescent intensity versus wavelength for devices fabricated according to FIG. 22 using parameters from Table 4.

Figure 24:
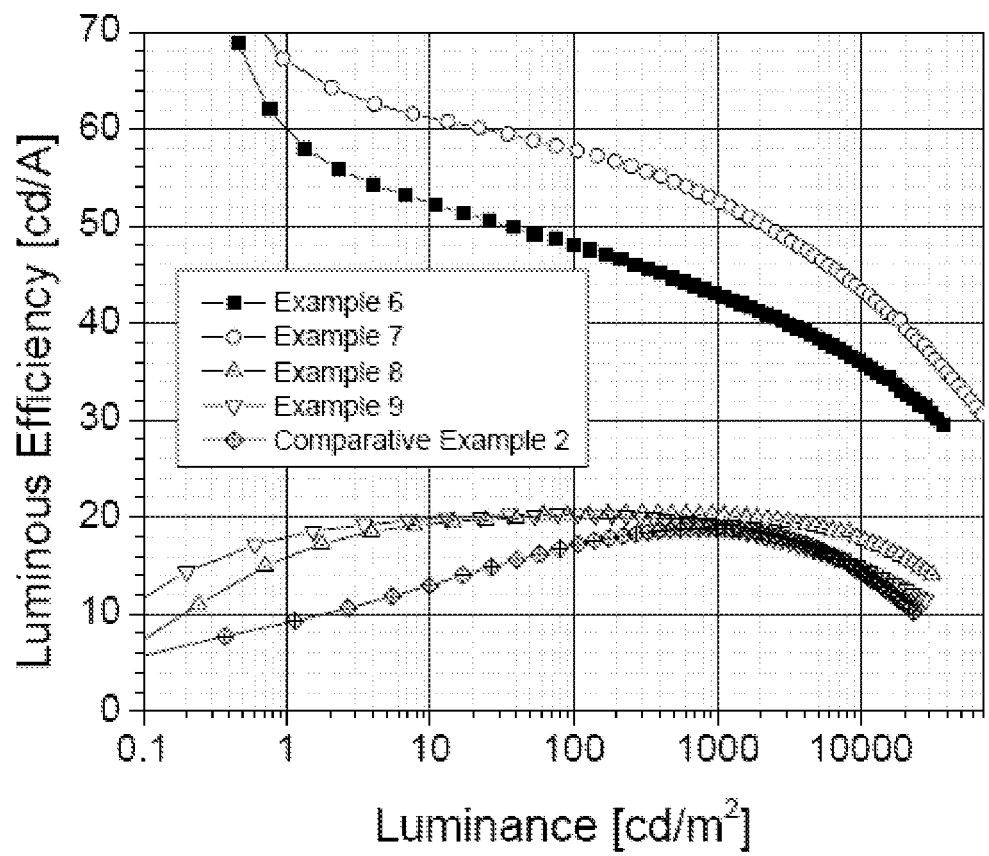
FIG. 24 shows plots of luminous efficiency versus luminance for devices fabricated according to FIG. 22 using parameters from Table 4.

FIG. 24 shows plots of luminous efficiency versus luminance for devices fabricated according to FIG. 22 using parameters from Table 4.

Figure 25:
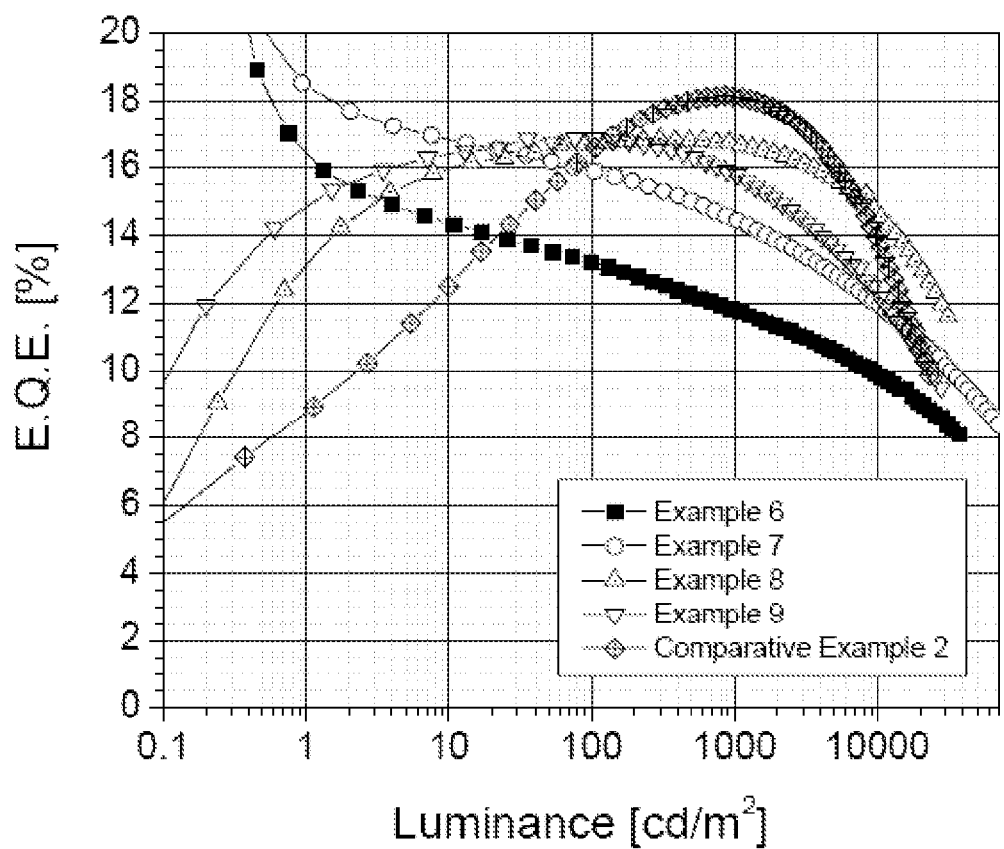
FIG. 25 shows plots of external quantum efficiency versus luminance for devices fabricated according to FIG. 22 using parameters from Table 4.

FIG. 25 shows plots of external quantum efficiency versus luminance for devices fabricated according to FIG. 22 using parameters from Table 4.

Figure 26:
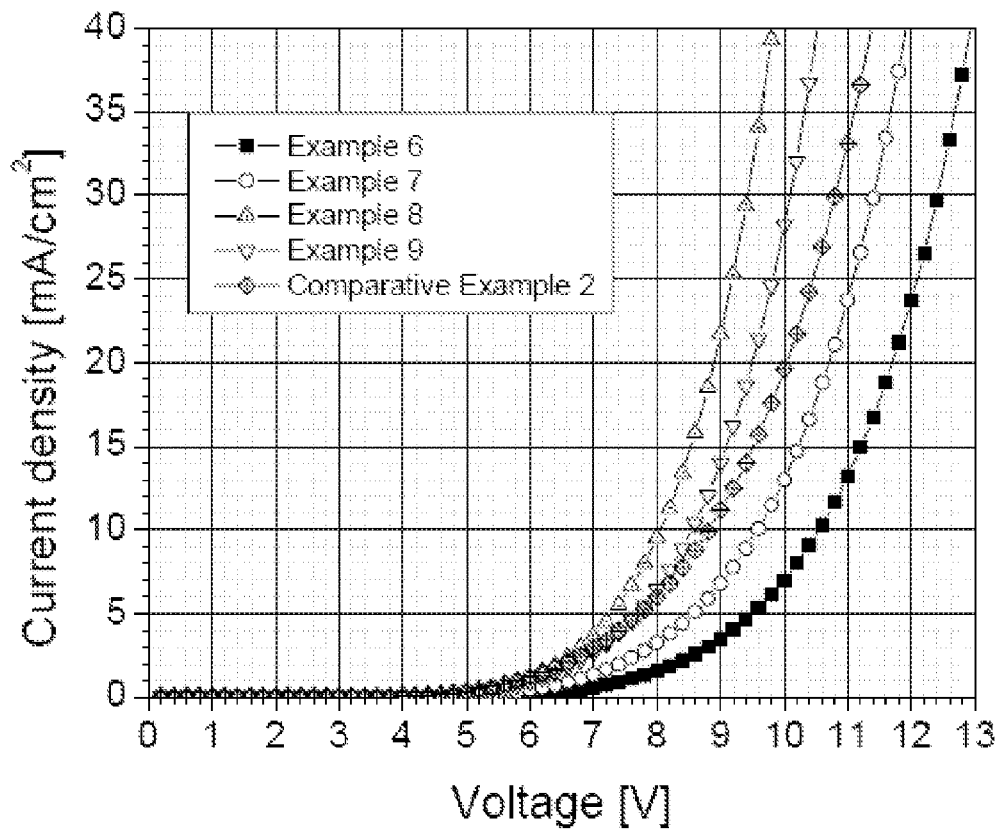
FIG. 26 shows plots of current density versus voltage for devices fabricated according to FIG. 22 using parameters from Table 4.

FIG. 26 shows plots of current density versus voltage for devices fabricated according to FIG. 22 using parameters from Table 4.

Figure 27:
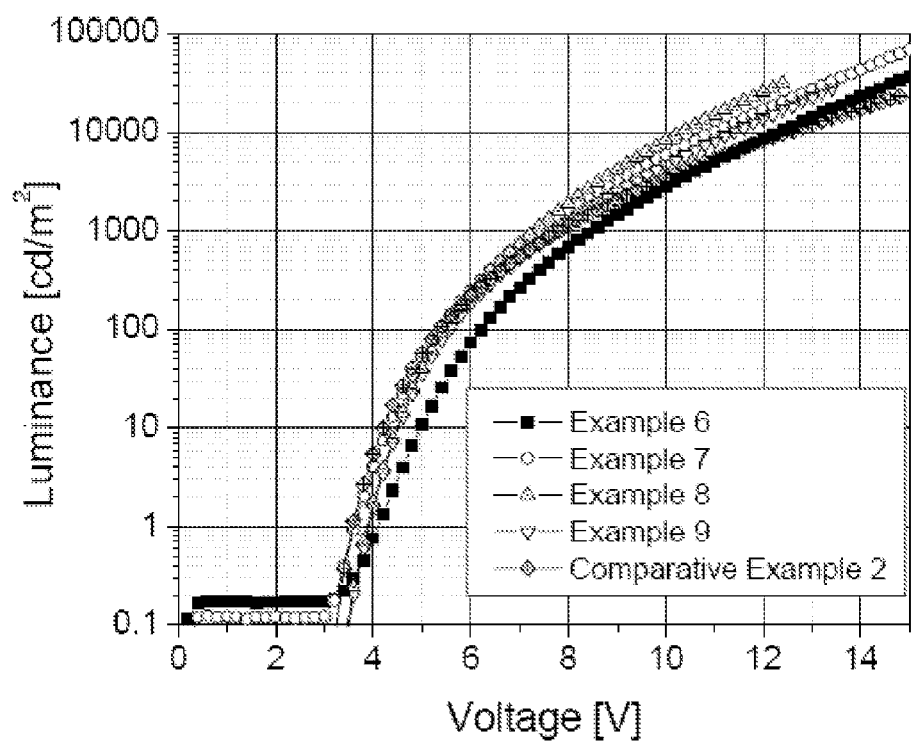
FIG. 27 shows plots of luminance versus voltage for devices fabricated according to FIG. 22 using parameters from Table 4.

FIG. 27 shows plots of luminance versus voltage for devices fabricated according to FIG. 22 using parameters from Table 4.

Figure 28:
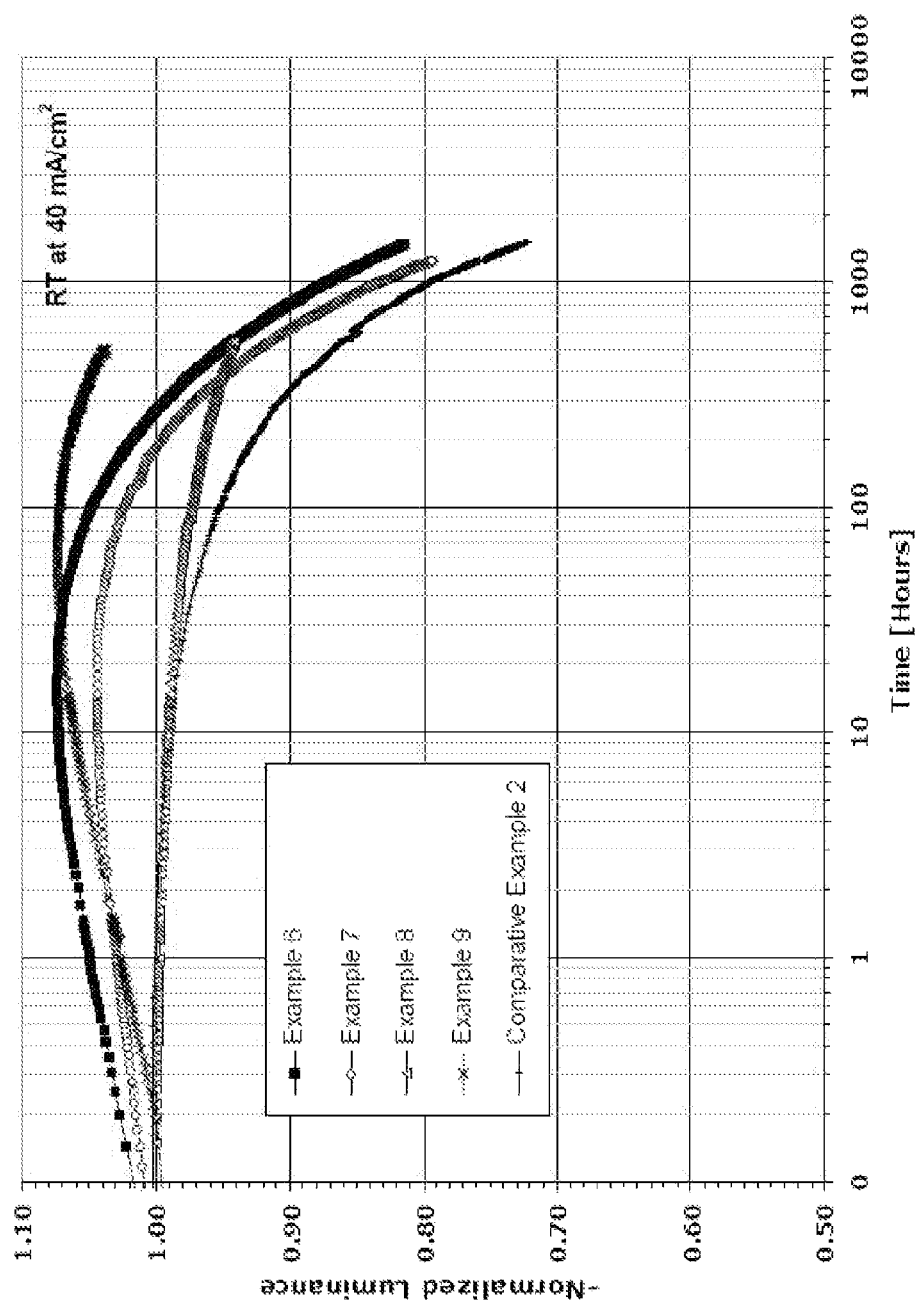
FIG. 28 shows plots of normalized luminance versus time for devices fabricated according to FIG. 22 using parameters from Table 4.

FIG. 28 shows plots of normalized luminance versus time for devices fabricated according to FIG. 22 using parameters from Table 4.

Figure 29:
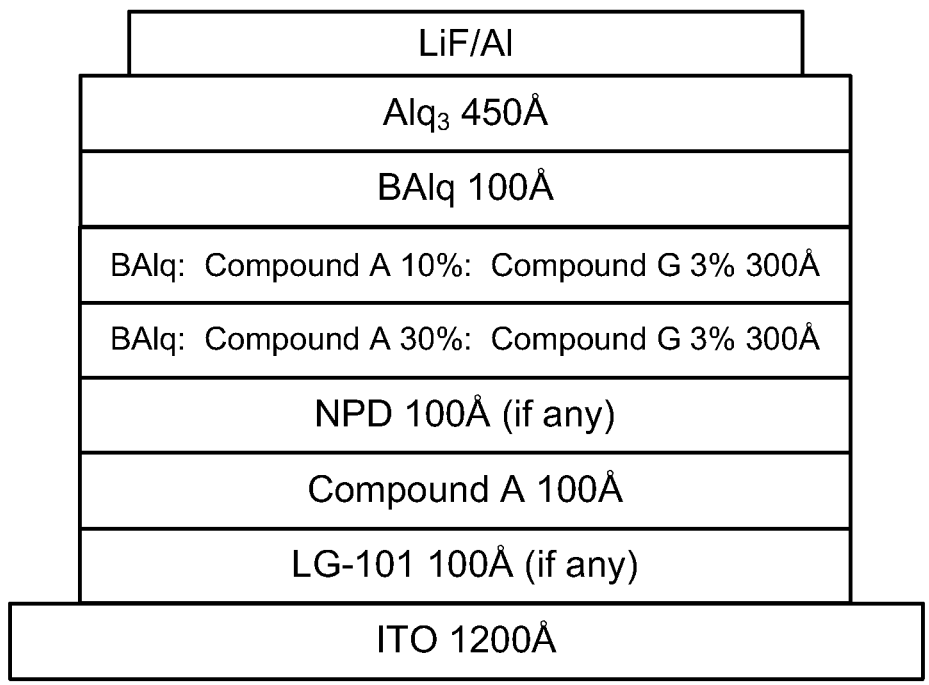
FIG. 29 shows an organic light emitting device that was fabricated using the parameters in Table 6, having first and second organic layers with different concentrations of phosphorescent material and non-emissive materials, some devices with a layer of NPD and some without a layer of NPD.

FIG. 29 shows an organic light emitting device that was fabricated using the parameters in Table 6, having first and second organic layers with different concentrations of phosphorescent material and non-emissive materials, some devices with a layer of NPD and some without a layer of NPD. The data in Table 6 shows that the introduction of a 100 Å layer of NPD between a hole injection layer and an emissive layer reduces the lifetime of a red emitting device.

FIG. 38 shows an organic light emitting device that has emission from both NPD and BAlq.

Figure 39:
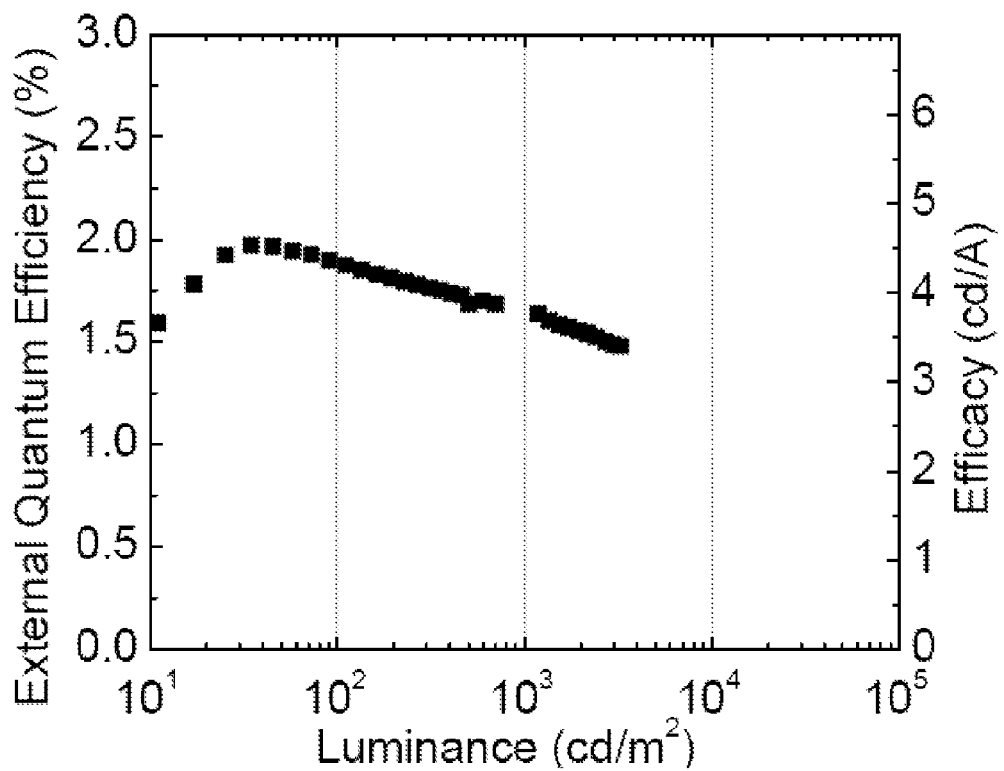
FIG. 39 shows a plot of external quantum efficiency versus luminance for the device of FIG. 38.

FIG. 39 shows a plot of external quantum efficiency versus luminance for the device of FIG. 38.

Figure 40:
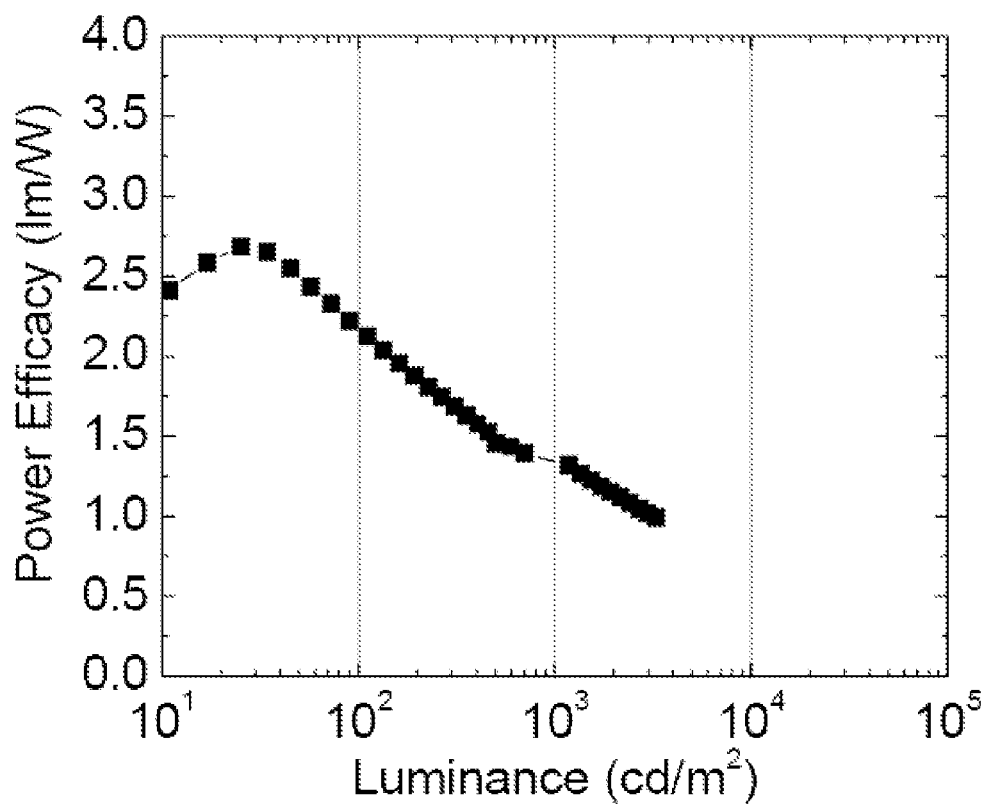
FIG. 40 shows a plot of power efficacy versus luminance for the device of FIG. 38.

FIG. 40 shows a plot of power efficacy versus luminance for the device of FIG. 38.

Figure 41:
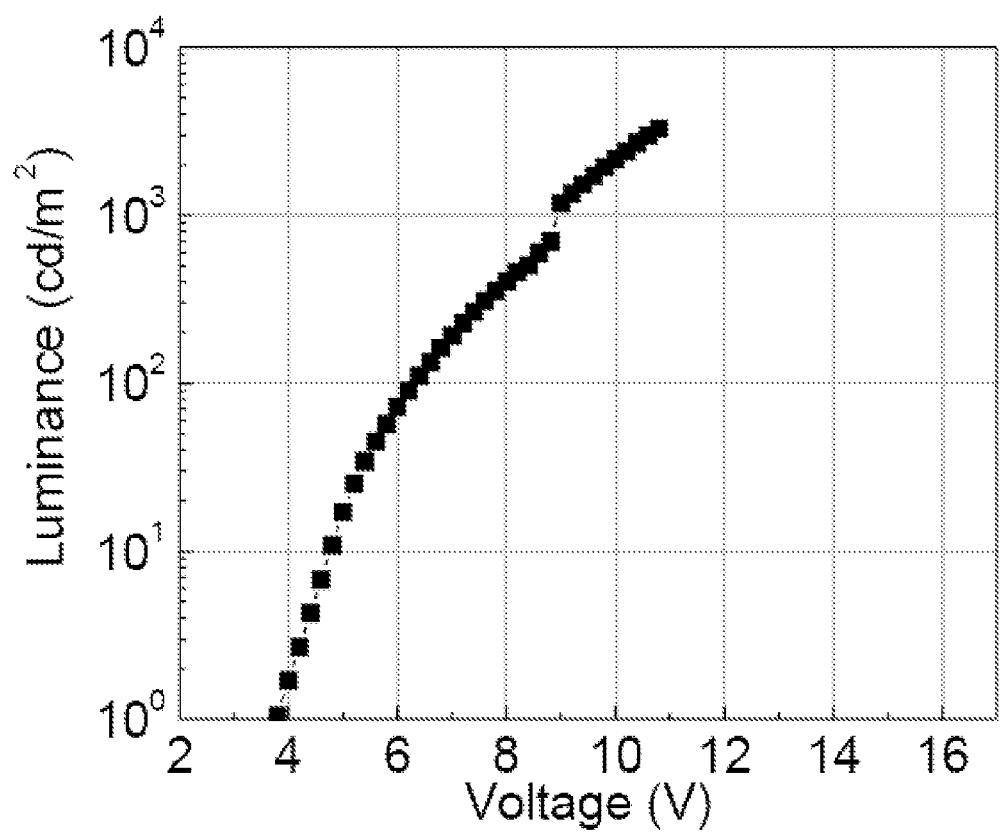
FIG. 41 shows a plot of luminance versus voltage for the device of FIG. 38.

FIG. 41 shows a plot of luminance versus voltage for the device of FIG. 38.

Figure 42:
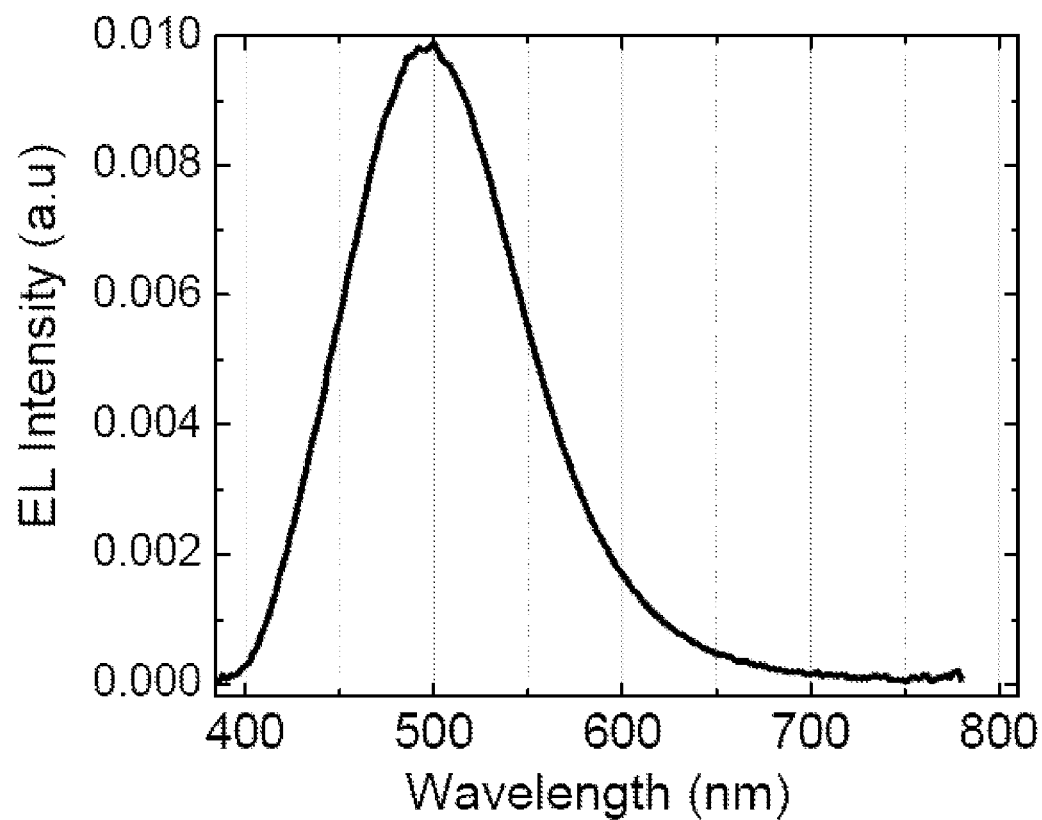
FIG. 42 shows a plot of electroluminescent intensity (arbitrary units) versus wavelength for the device of FIG. 38.

FIG. 42 shows a plot of electroluminescent intensity (arbitrary units) versus wavelength for the device of FIG. 38.

FIG. 43 shows a plot of normalized luminance versus time for the device of FIG. 38.

Figure 44:
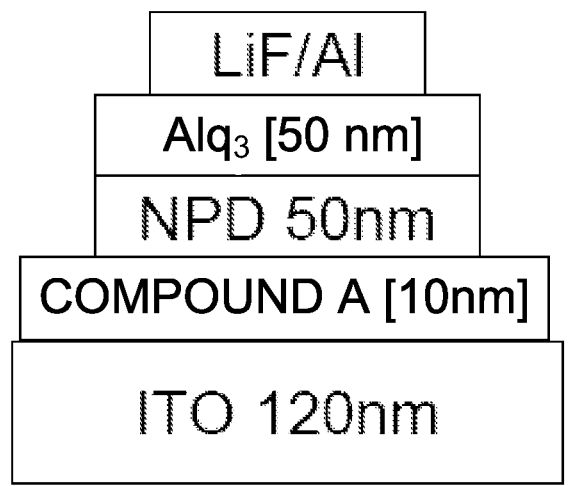
FIG. 44 shows an organic light emitting device that has emission only from Alq.

FIG. 44 shows an organic light emitting device that has emission only from Alq.

Figure 45:
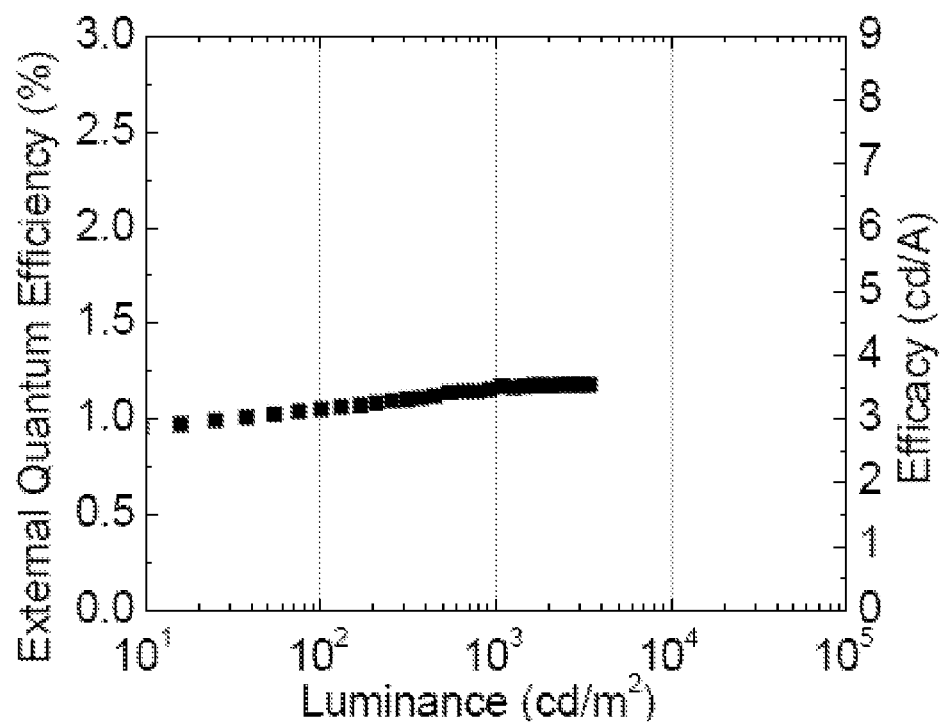
FIG. 45 shows a plot of external quantum efficiency versus luminance for the device of FIG. 44.

FIG. 45 shows a plot of external quantum efficiency versus luminance for the device of FIG. 44.

Figure 46:
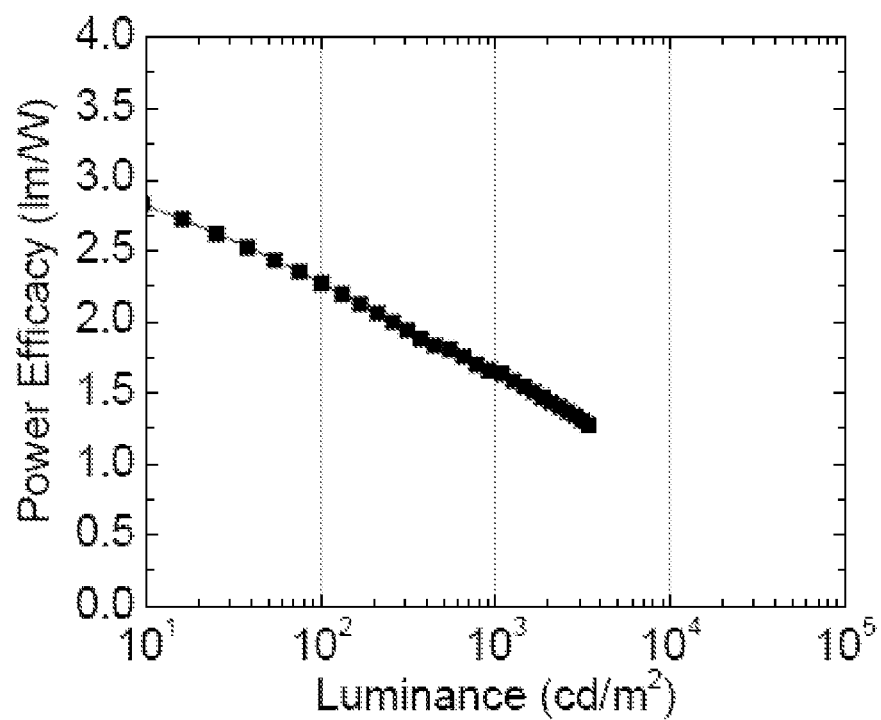
FIG. 46 shows a plot of power efficacy versus luminance for the device of FIG. 44.

FIG. 46 shows a plot of power efficacy versus luminance for the device of FIG. 44.

Figure 47:
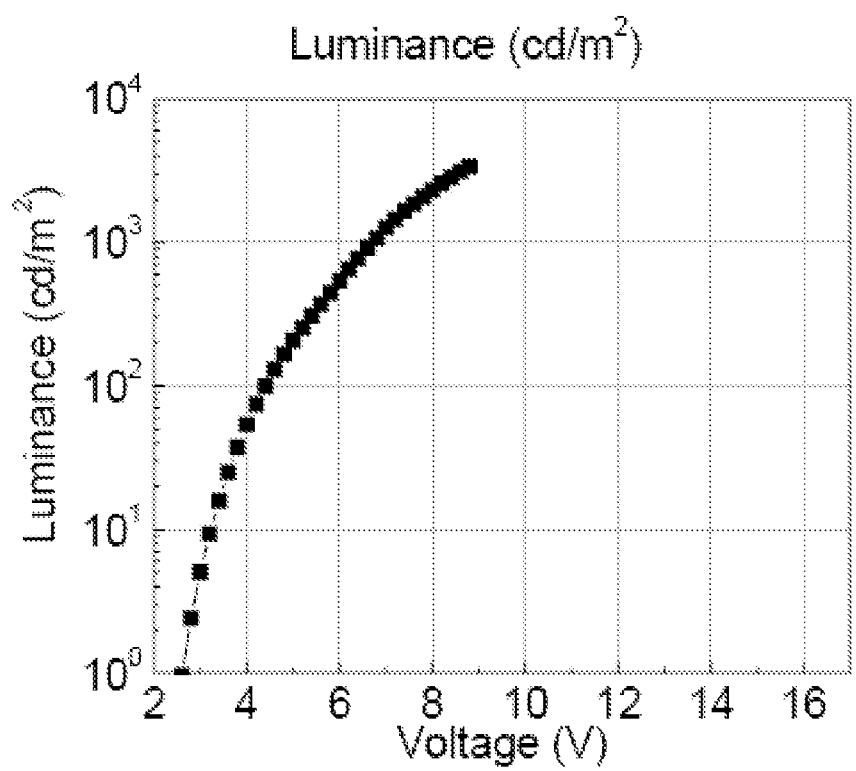
FIG. 47 shows a plot of luminance versus voltage for the device of FIG. 44.

FIG. 47 shows a plot of luminance versus voltage for the device of FIG. 44.

Figure 48:
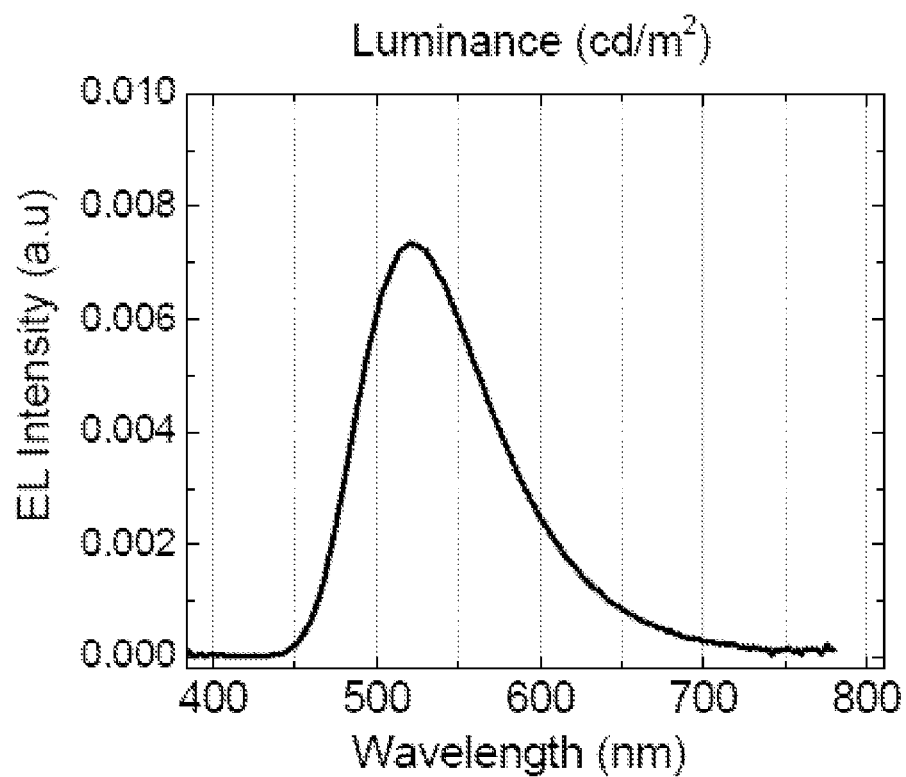
FIG. 48 shows a plot of electroluminescent intensity (arbitrary units) versus wavelength for the device of FIG. 44.

FIG. 48 shows a plot of electroluminescent intensity (arbitrary units) versus wavelength for the device of FIG. 44.

Figure 49:
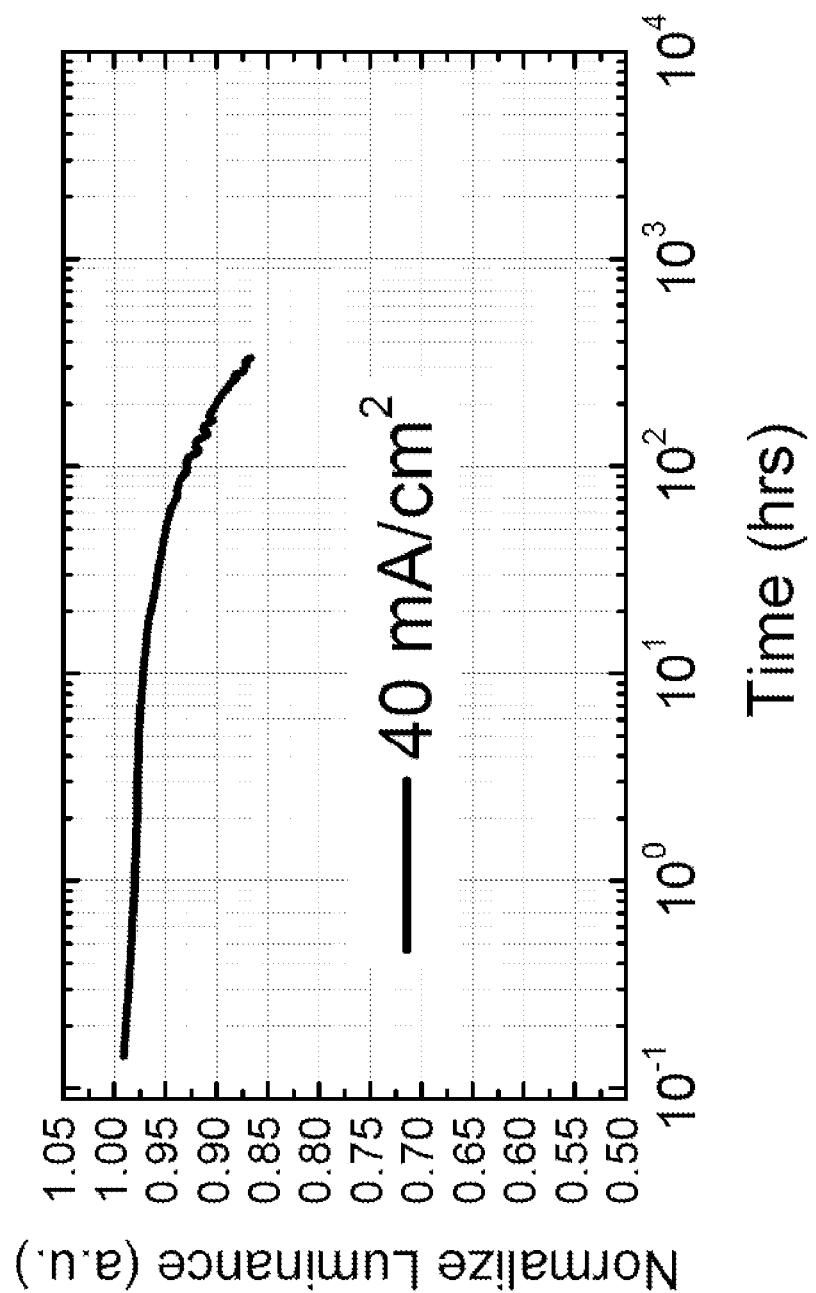
FIG. 49 shows a plot of normalized luminance versus time for the device of FIG. 44.

FIG. 49 shows a plot of normalized luminance versus time for the device of FIG. 44.

Figure 50:
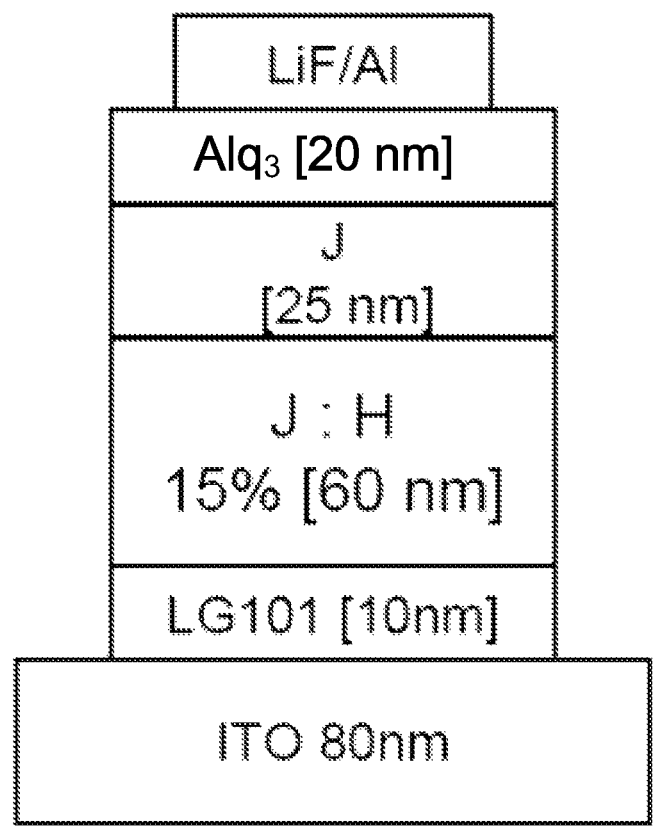
FIG. 50 shows an organic light emitting device having only a layer with a high hole conductivity between an emissive layer and the anode, and a hole blocking layer of the same material used as a non-emissive host in the emissive layer.

FIG. 50 shows an organic light emitting device having only a layer with a high hole conductivity between an emissive layer and the anode, and a hole blocking layer of the same material used as a non-emissive host in the emissive layer. The device of FIG. 50 includes a 10 nm thick hole injection layer of LG101, a 60 nm thick first organic emissive layer of COMPOUND J doped with 15 wt % COMPOUND H, a 25 nm thick hole blocking layer of COMPOUND J, a 20 nm thick electron transport layer of Alq, and a LiF/Al cathode.

Figure 51:
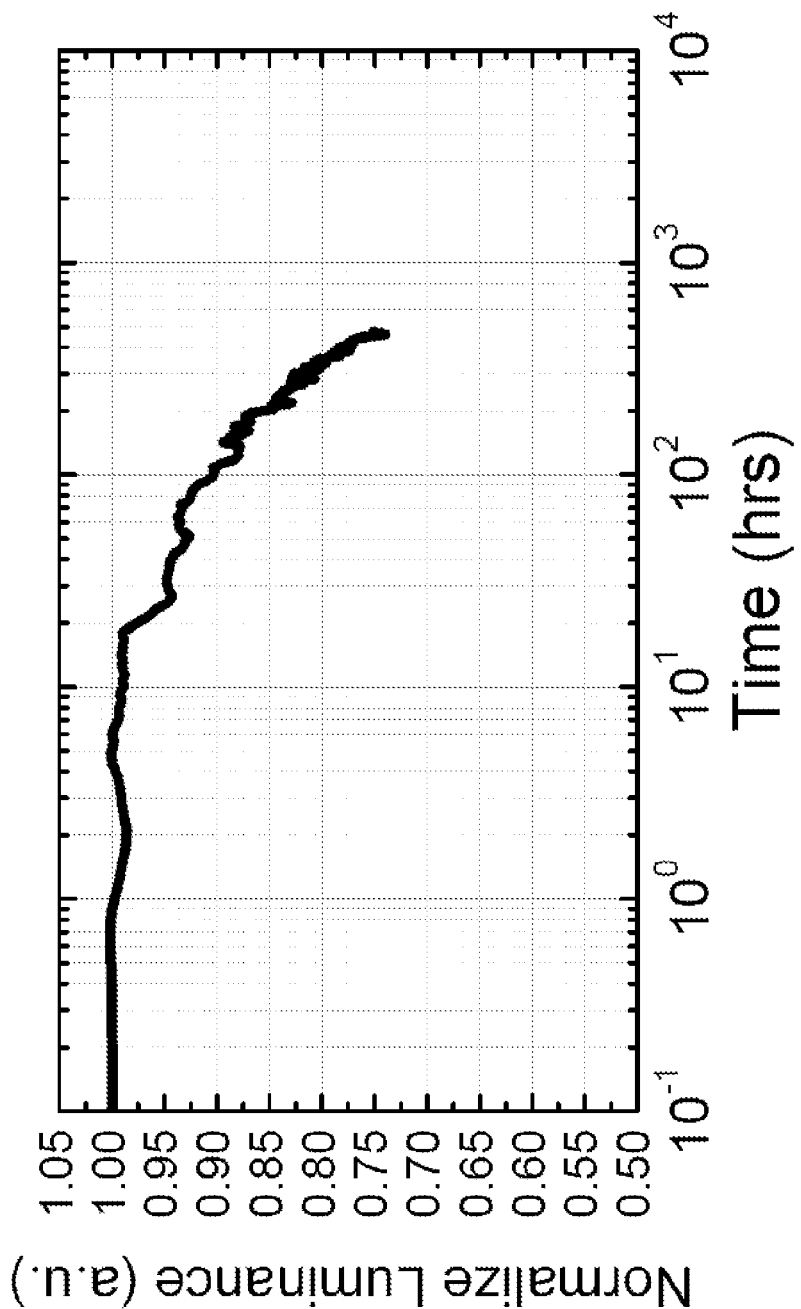
FIG. 51 shows a plot of normalized luminescence versus time for the device of FIG. 50.

FIG. 51 shows a plot of normalized luminescence versus time for the device of FIG. 50.

Figure 52:
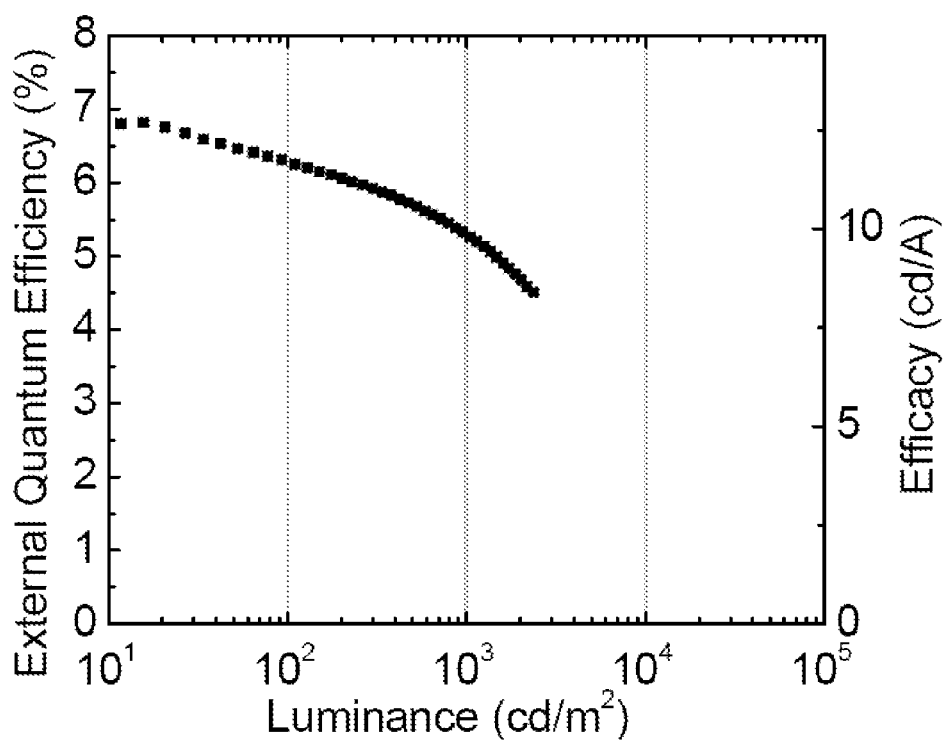
FIG. 52 shows a plot of external quantum efficiency versus luminance for the device of FIG. 50.

FIG. 52 shows a plot of external quantum efficiency versus luminance for the device of FIG. 50.

Figure 53:
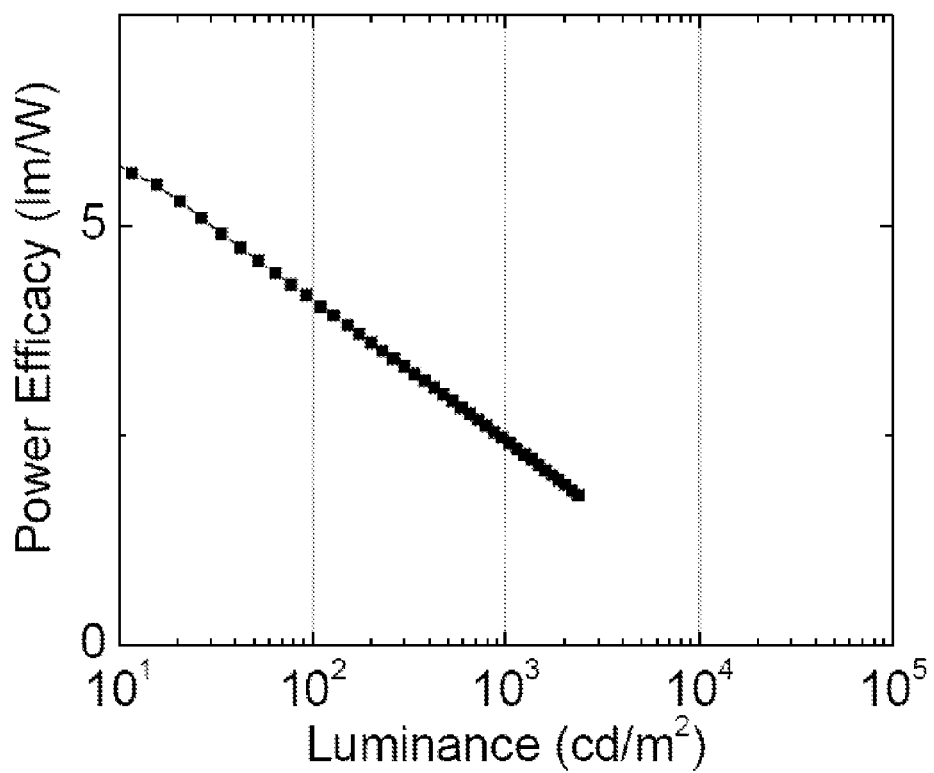
FIG. 53 shows a plot of power efficacy versus luminance for the device of FIG. 50.

FIG. 53 shows a plot of power efficacy versus luminance for the device of FIG. 50.

TABLE 6

| HIL layers (100 Å each) | | | CIE | | At 1,000 nits | | | | At 40 mA/cm² | |
|---|---|---|---|---|---|---|---|---|---|---|
| | | | X | Y | Voltage [v] | L.E. [cd/A] | EQE [%] | P.E. [lm/W] | LT 50% [h] | Lo [nits] | LT 80% [h] |
| LG-101 | Compound A | NPD | 0.659 | 0.339 | 7.5 | 22.5 | 18.8 | 9.4 | 195,000 | 8,170 | 2,800 |
| LG-101 | Compound A | — | 0.658 | 0.340 | 7.3 | 20.2 | 16.7 | 8.7 | 346,000 | 7,359 | 4,000 |
| — | Compound A | NPD | 0.658 | 0.340 | 7.7 | 24.3 | 20.2 | 9.9 | | 8,490 | 2,200 |
| — | Compound A | — | 0.657 | 0.341 | 7.7 | 19.1 | 15.8 | 7.8 | 285,000 | 6,343 | 4,000 |

Figure 30:
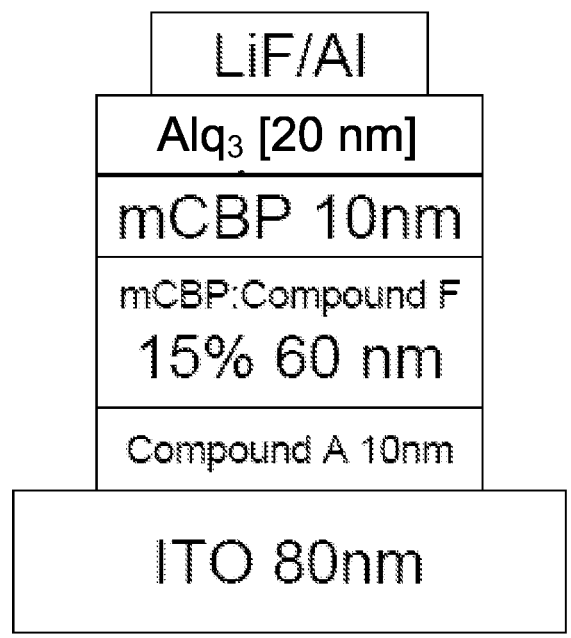
FIG. 30 shows an organic light emitting device without a layer of NPD.

FIG. 30 shows an organic light emitting device without a layer of NPD.

Figure 31:
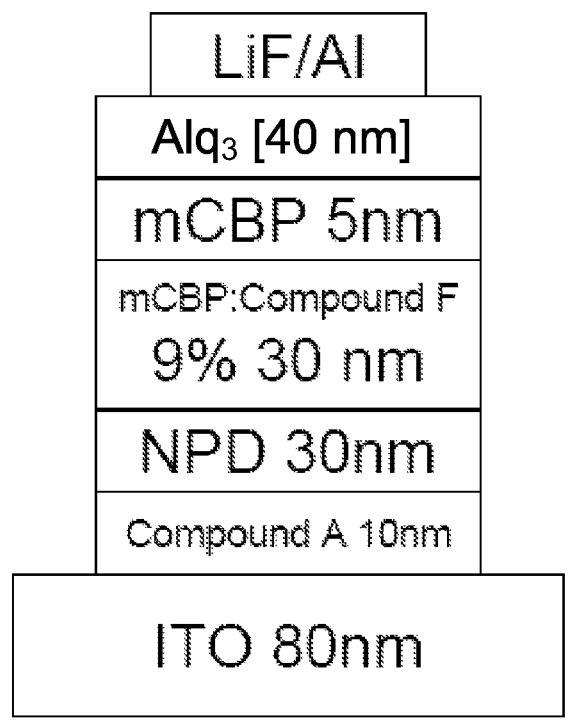
FIG. 31 shows an organic light emitting device with a layer of NPD.

FIG. 31 shows an organic light emitting device with a layer of NPD.

Figure 32:
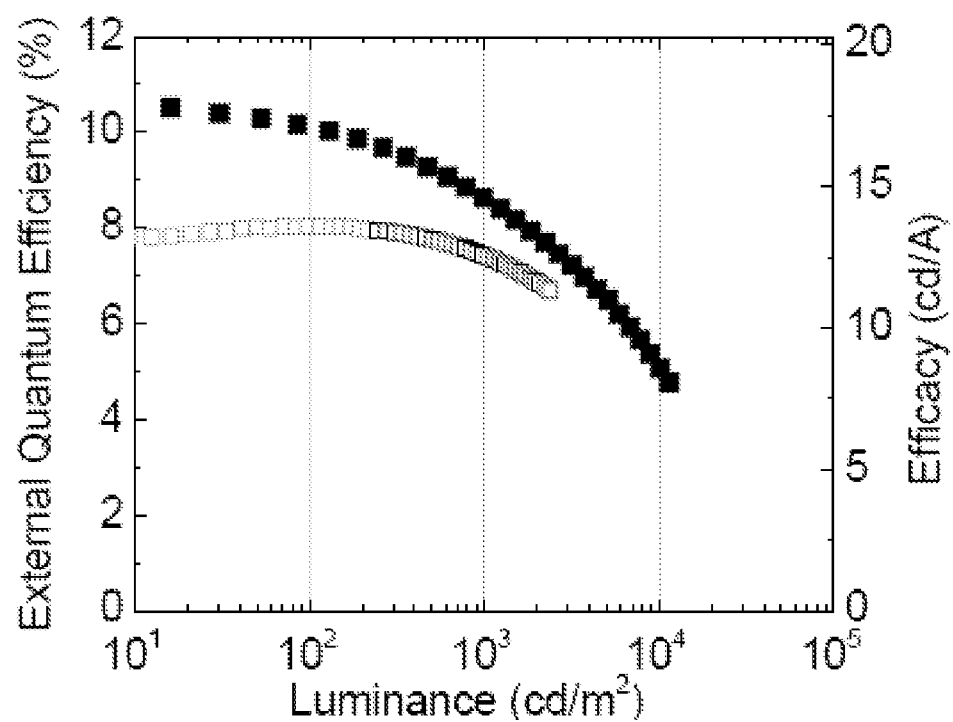
FIG. 32 shows plots of external quantum efficiency versus luminance for the devices of FIG. 30 and FIG. 31.

FIG. 32 shows plots of external quantum efficiency versus luminance for the devices of FIG. 30 and FIG. 31.

Figure 33:
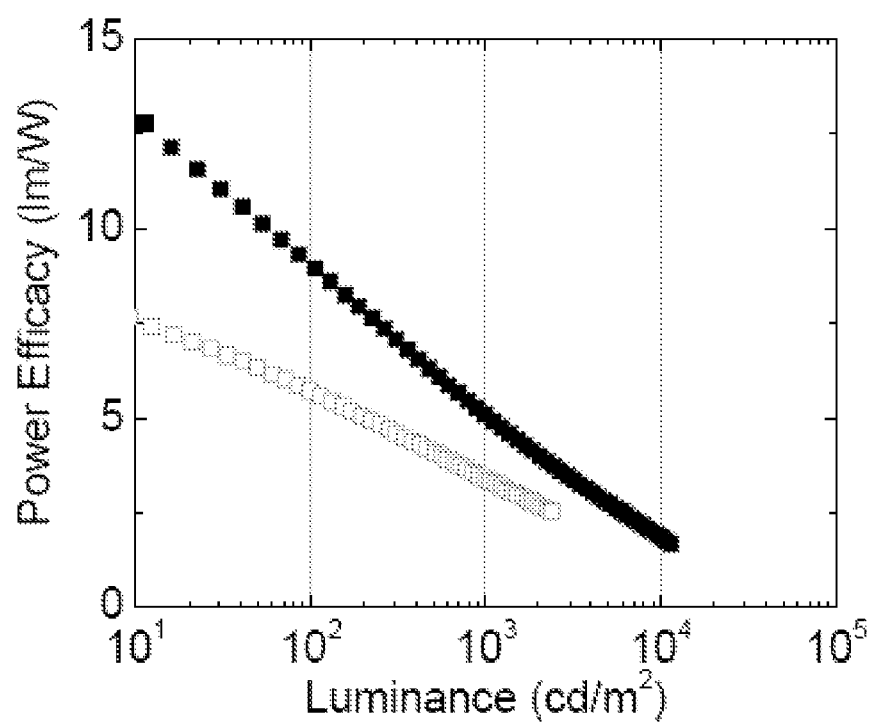
FIG. 33 shows plots of power efficacy versus luminance for the devices of FIG. 30 and FIG. 31.

FIG. 33 shows plots of power efficacy versus luminance for the devices of FIG. 30 and FIG. 31.

Figure 34:
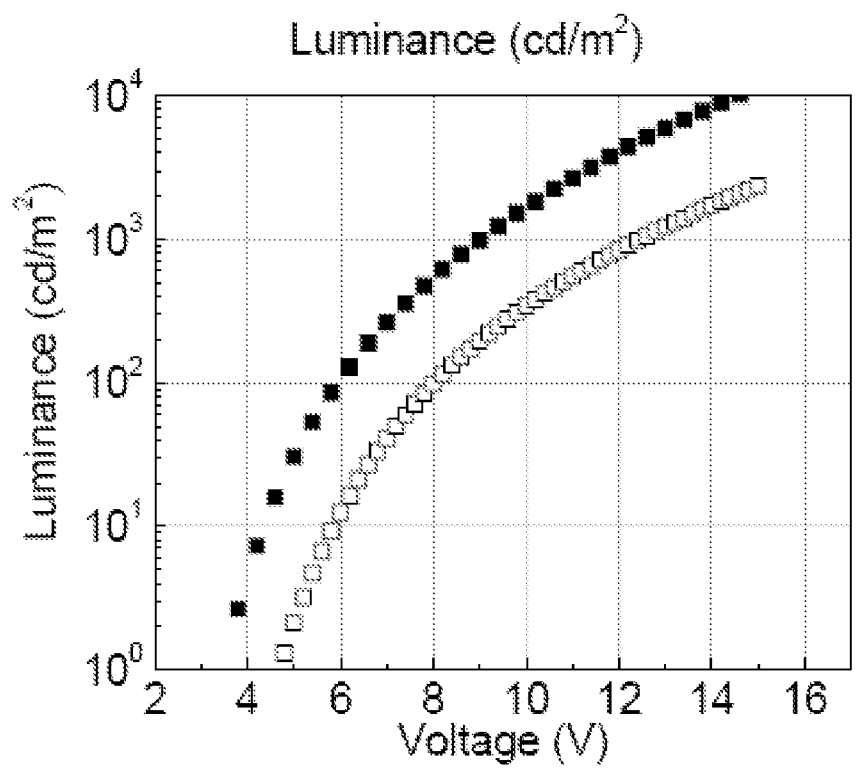
FIG. 34 shows plots of luminance versus voltage for the devices of FIG. 30 and FIG. 31.

FIG. 34 shows plots of luminance versus voltage for the devices of FIG. 30 and FIG. 31.

Figure 35:
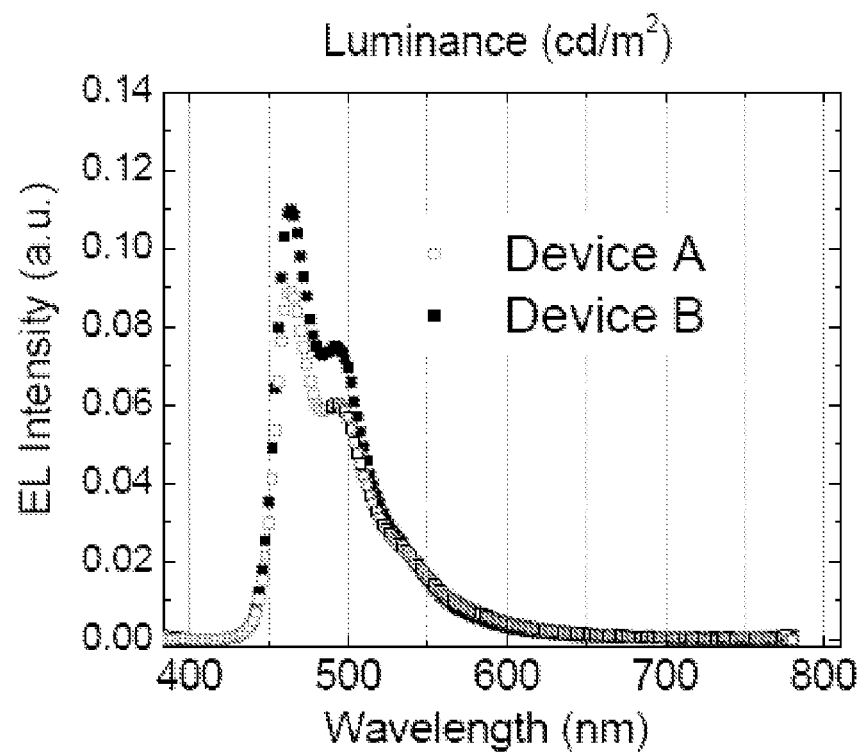
FIG. 35 shows plots of electroluminescent intensity versus wavelength for the devices of FIG. 30 and FIG. 31.

FIG. 35 shows plots of electroluminescent intensity versus wavelength for the devices of FIG. 30 and FIG. 31.

Figure 36:
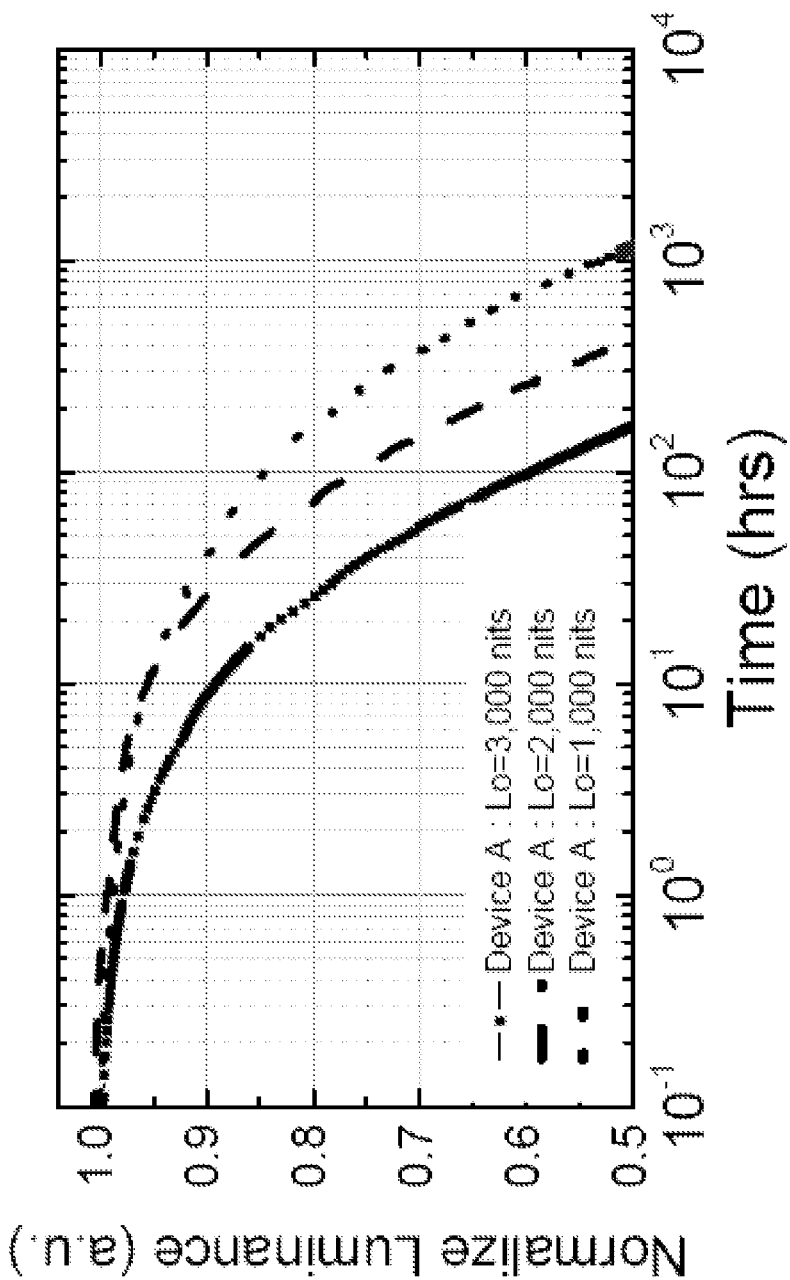
FIG. 36 shows plots of normalized luminance versus time for the device of FIG. 30 at various initial luminances.

FIG. 36 shows plots of normalized luminance versus time for the device of FIG. 30 at various initial luminances.

Figure 37:
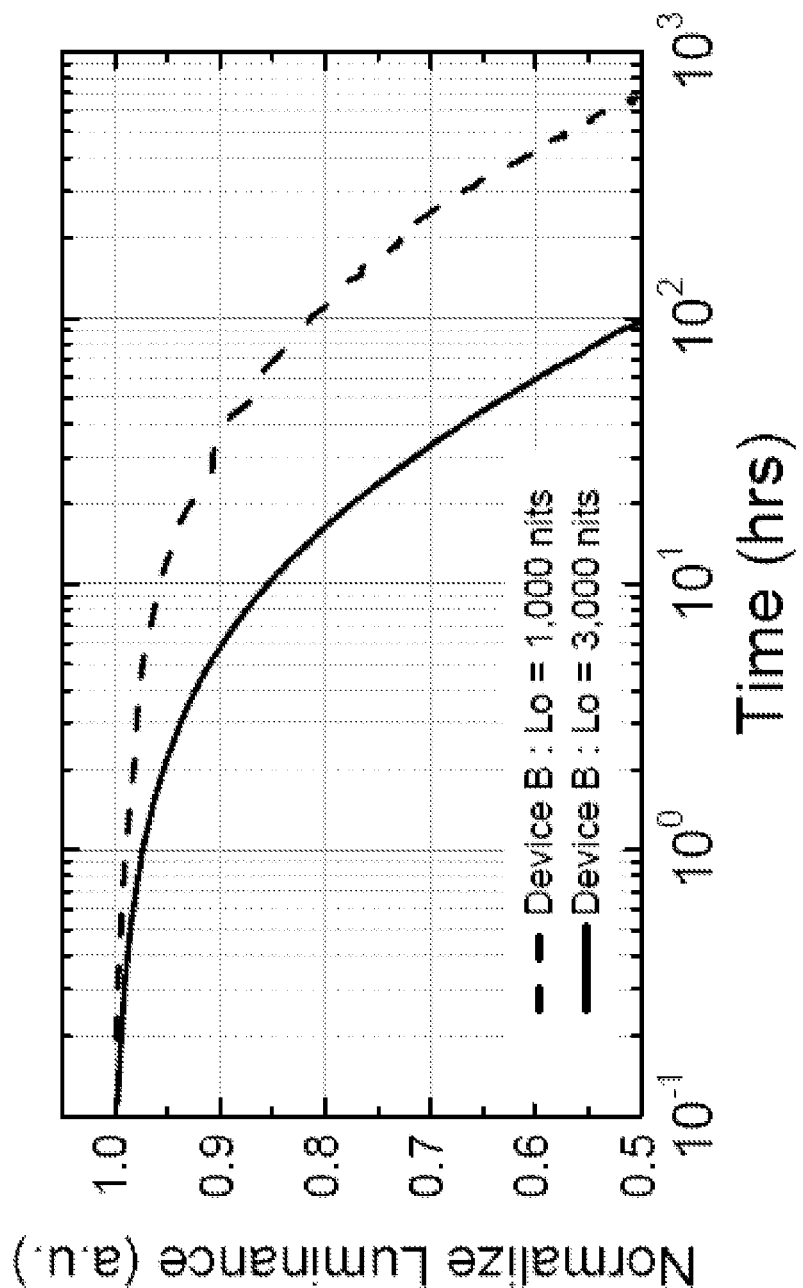
FIG. 37 shows plots of normalized luminance versus time for the device of FIG. 31 at various initial luminances.

FIG. 37 shows plots of normalized luminance versus time for the device of FIG. 31 at various initial luminances.

Figure 54:
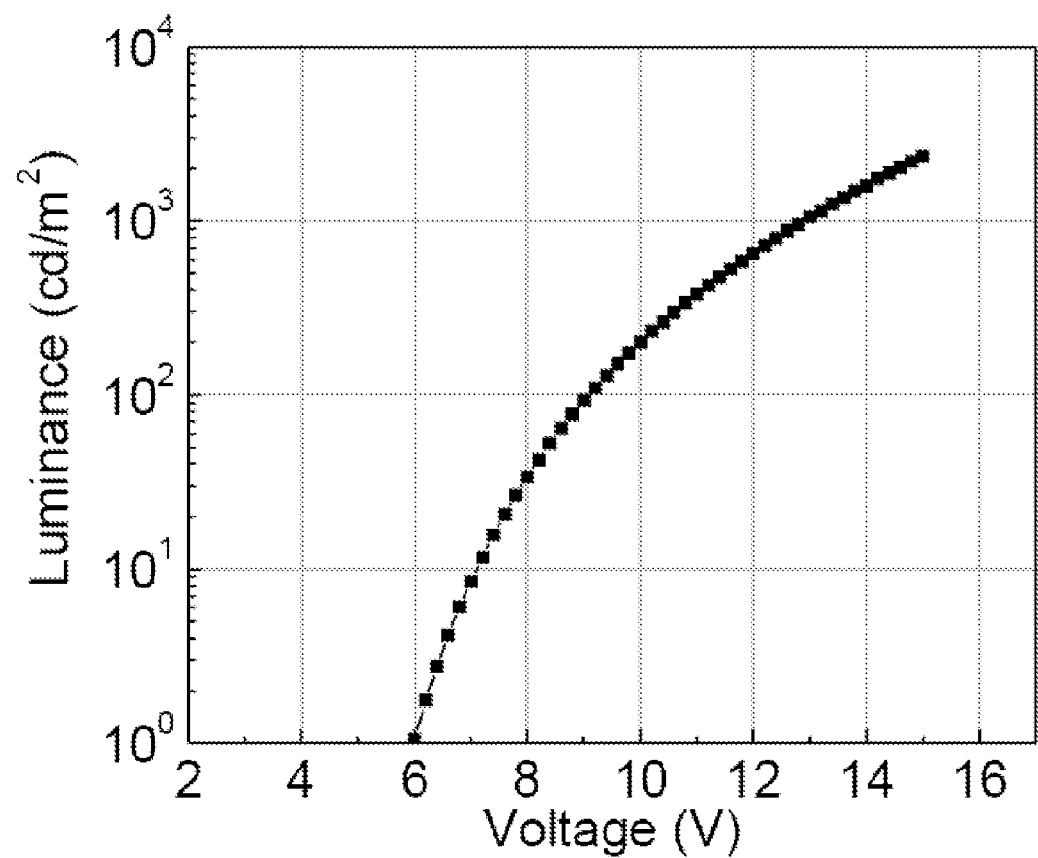
FIG. 54 shows a plot of luminance versus voltage for the device of FIG. 50.

FIG. 54 shows a plot of luminance versus voltage for the device of FIG. 50.

Figure 55:
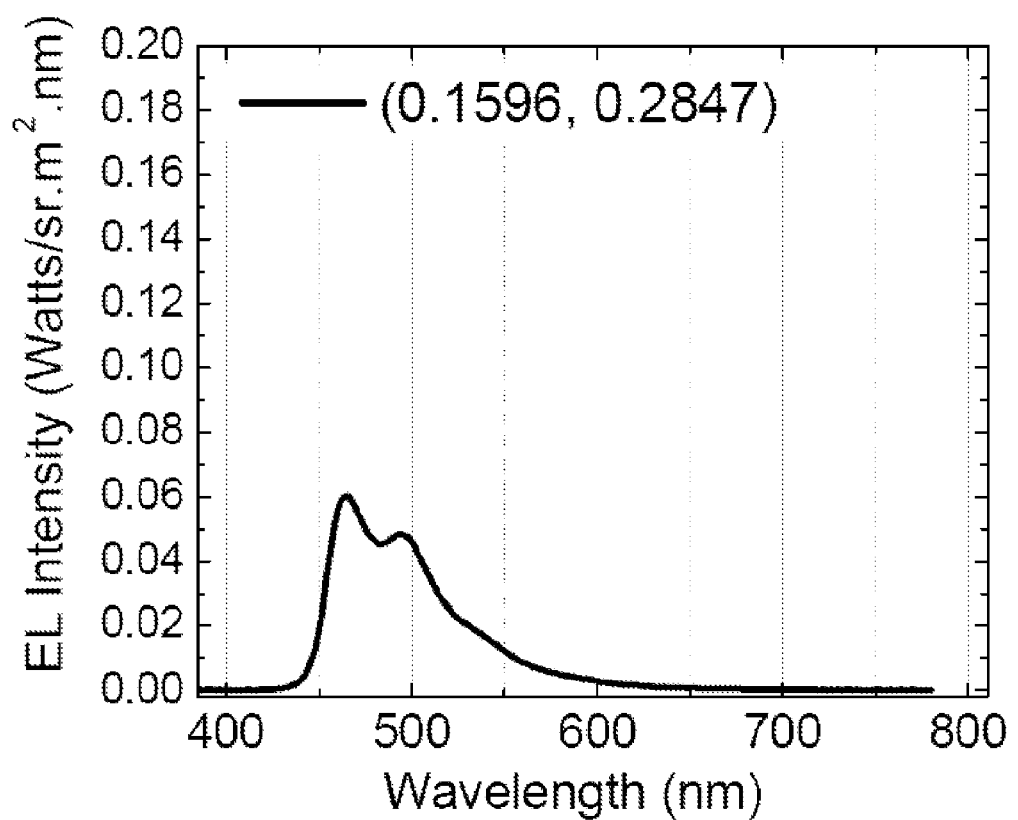
FIG. 55 shows a plot of EL intensity versus wavelength for the device of FIG. 50.

FIG. 55 shows a plot of EL intensity versus wavelength for the device of FIG. 50.

Figure 56:
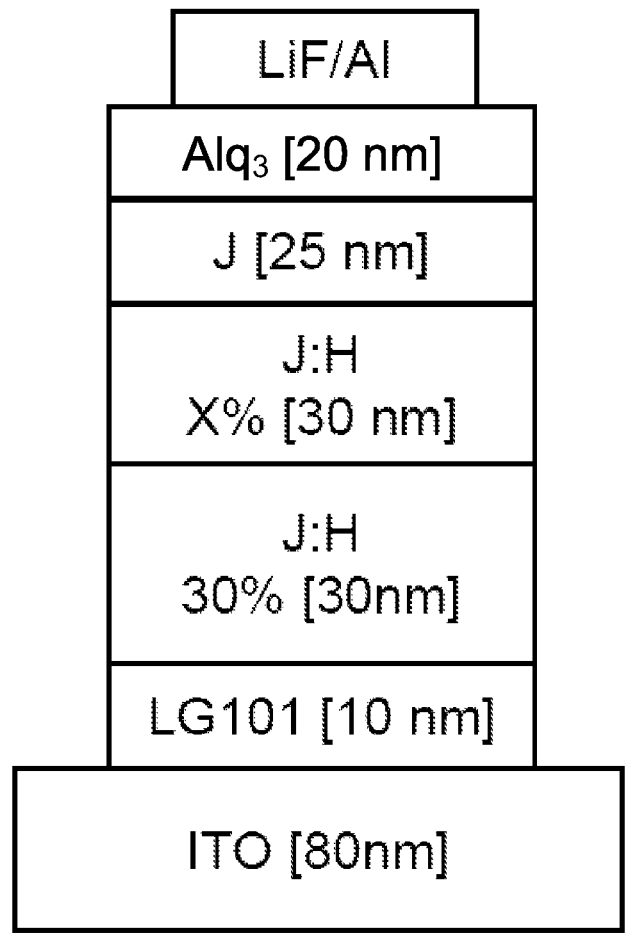
FIG. 56 shows an organic light emitting device having only a layer with a high hole conductivity between an emissive layer and the anode, a hole blocking layer of the same material used as a non-emissive host in the emissive layer, and an emissive layer having first and second organic layers with different concentrations of phosphorescent material and non-emissive materials, where the concentration of phosphorescent material in the second organic layer is variable.

FIG. 56 shows an organic light emitting device having only a layer with a high hole conductivity between an emissive layer and the anode, a hole blocking layer of the same material used as a non-emissive host in the emissive layer, and an emissive layer having first and second organic layers with different concentrations of phosphorescent material and non-emissive materials, where the concentration of phosphorescent material in the second organic layer is variable. The device of FIG. 56 includes a 10 nm thick hole injection layer of LG101, a 30 nm thick first organic emissive layer of COMPOUND J doped with 30 wt % COMPOUND H, a 30 nm thick second organic emissive layer of COMPOUND J doped with X wt % COMPOUND H, a 25 nm thick hole blocking layer of COMPOUND J, a 20 nm thick electron transport layer of Alq, and a LiF/Al cathode. X varies from 10 wt % to 18 wt % in the devices fabricated, with devices at X=10, 14 and 18 wt % as indicated in the legends for FIG. 57. The device of FIG. 56 is very similar to that of FIG. 50, with the difference being that there is a step in the concentration of dopant H in the device of FIG. 56, but not in the device of FIG. 50.

Figure 57:
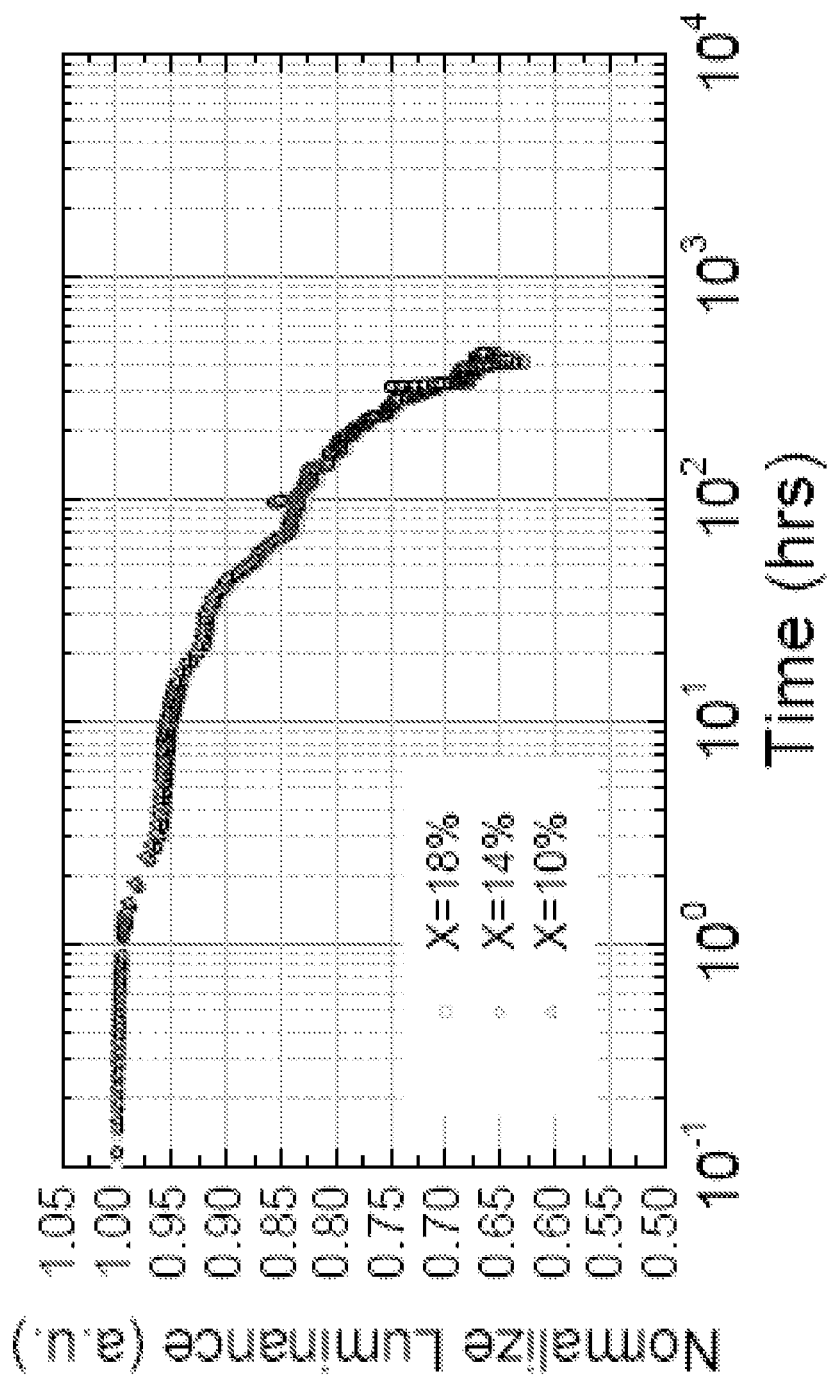
FIG. 57 shows a plot of normalized luminescence versus time for the device of FIG. 56.

FIG. 57 shows a plot of normalized luminescence versus time for the device of FIG. 56.

Figure 58:
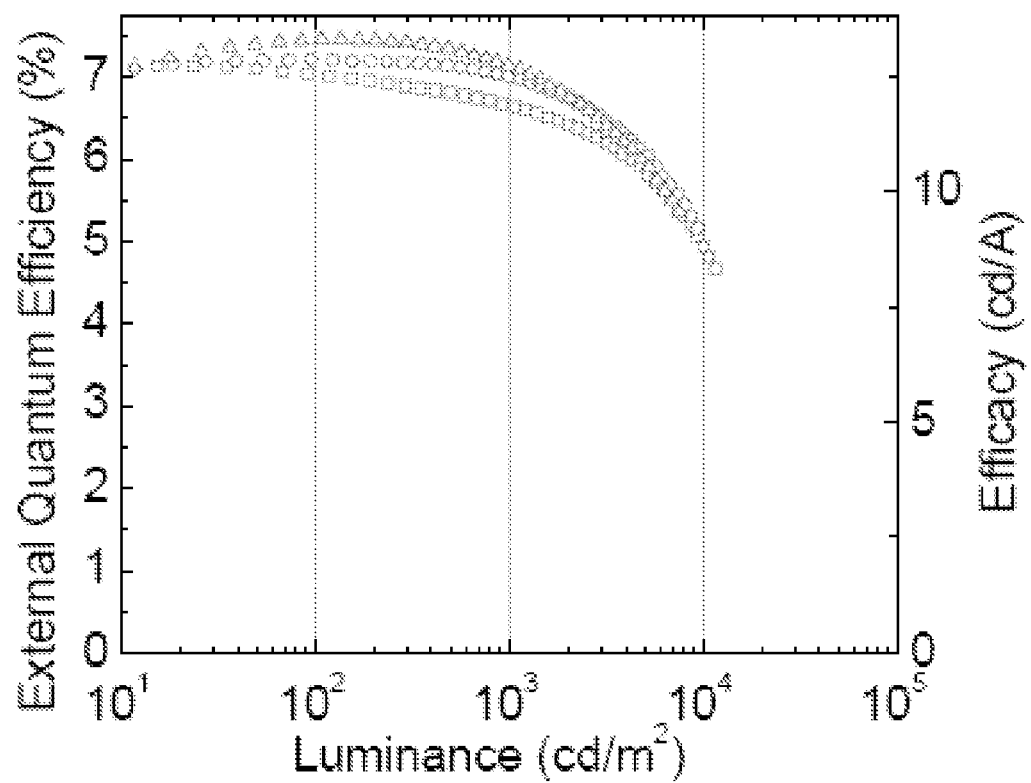
FIG. 58 shows a plot of external quantum efficiency versus luminance for the device of FIG. 56.

FIG. 58 shows a plot of external quantum efficiency versus luminance for the device of FIG. 56.

Figure 59:
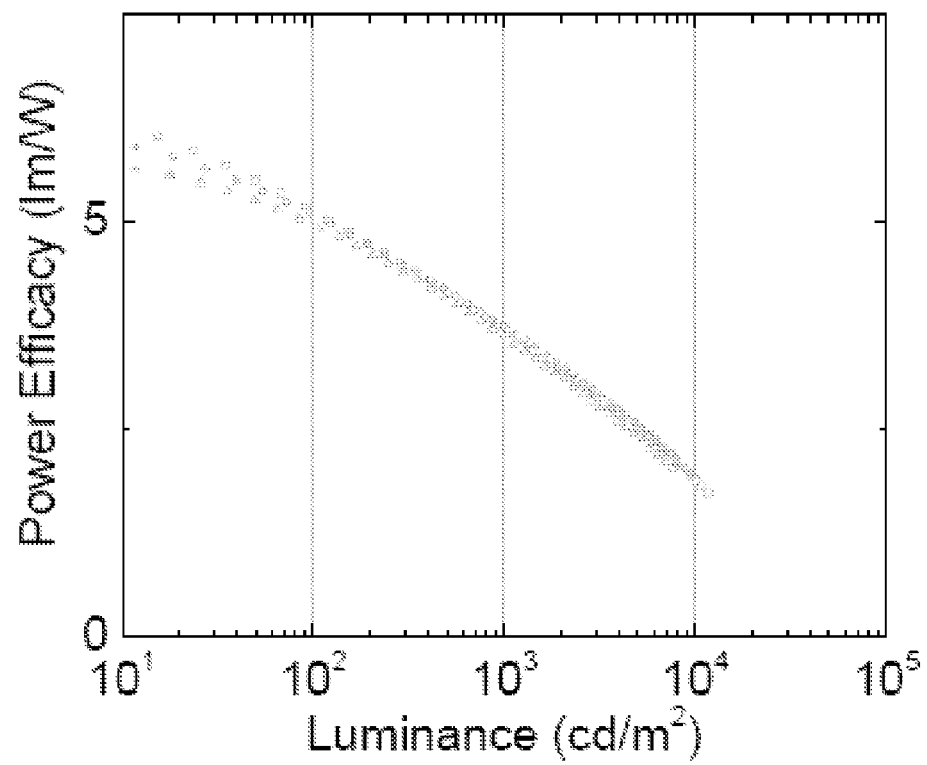
FIG. 59 shows a plot of power efficacy versus luminance for the device of FIG. 56.

FIG. 59 shows a plot of power efficacy versus luminance for the device of FIG. 56.

Figure 60:
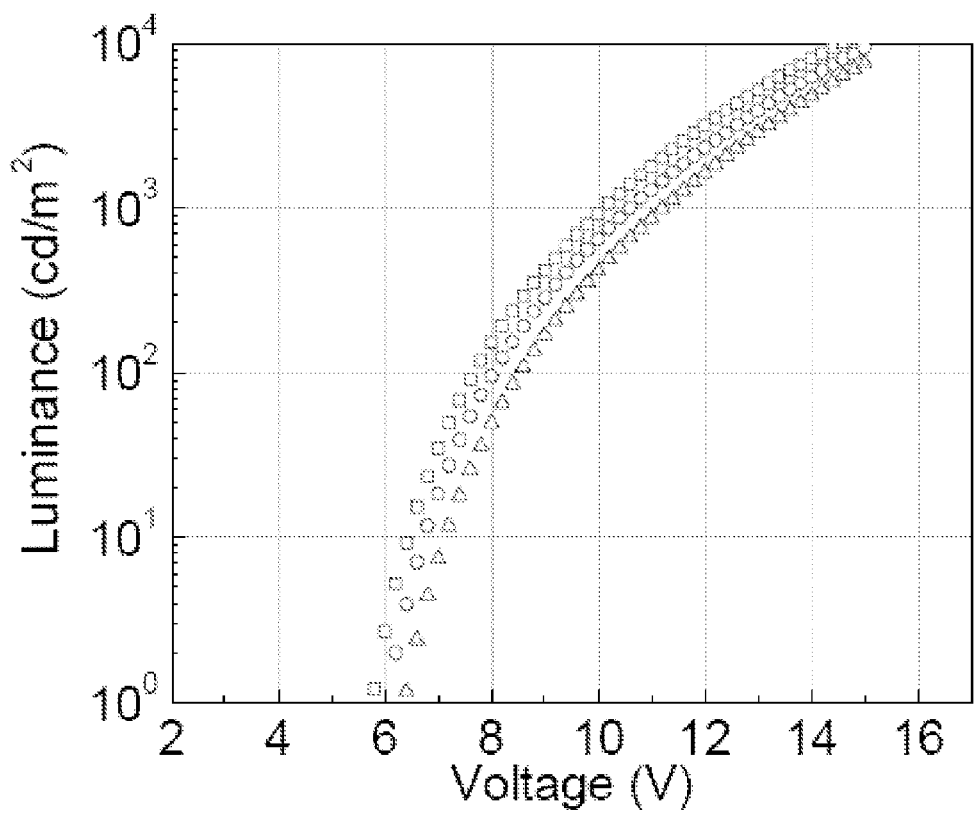
FIG. 60 shows a plot of luminance versus voltage for the device of FIG. 56.

FIG. 60 shows a plot of luminance versus voltage for the device of FIG. 56.

Figure 61:
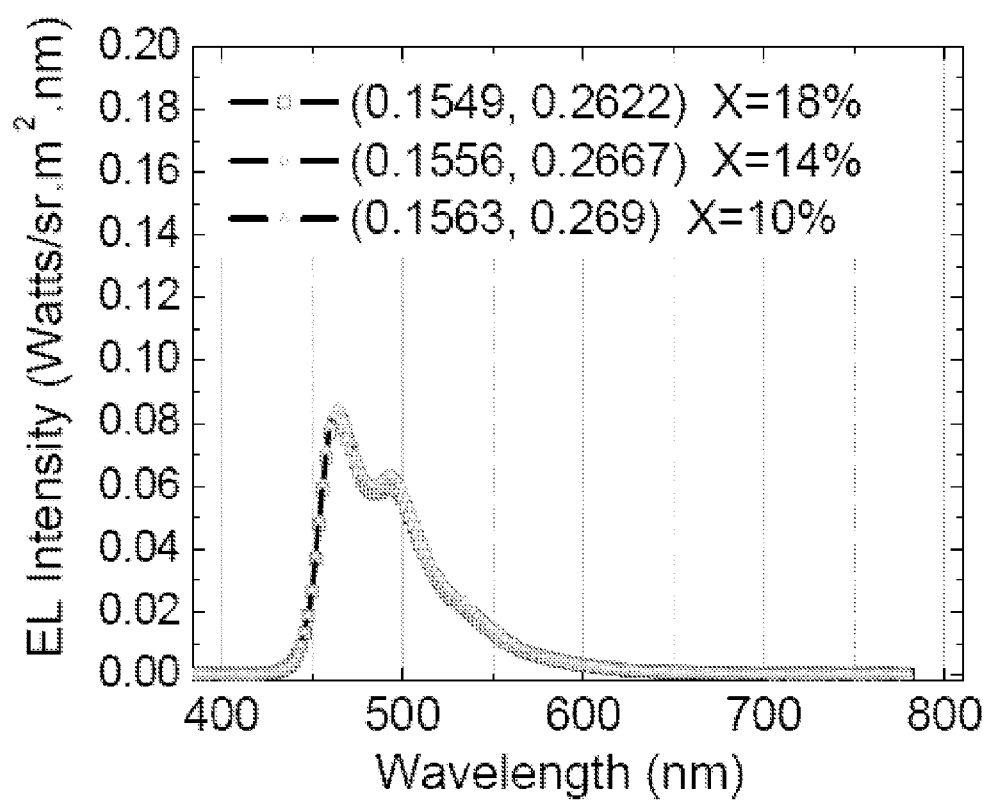
FIG. 61 shows a plot of EL intensity versus wavelength for the device of FIG. 56.

FIG. 61 shows a plot of EL intensity versus wavelength for the device of FIG. 56.

The device of FIG. 56 may be compared to the device of FIG. 50. In terms of device architecture, the devices are similar except in the emissive layer, where the device of FIG. 56 has a step in the concentration of COMPOUND H, whereas the device of FIG. 50 does not. The measured results for these two devices show that the device of FIG. 56 has a lower operating voltage, enabled by the step in dopant concentration. The device of FIG. 56 also has better blue CIE coordinates that the device of FIG. 50. It is believed that the better CIE coordinates are due to optical effects resulting from recombination closer to the cathode in the device of FIG. 56, due to increased hole conductivity in the layer doped with 30% COMPOUND H. The device of FIG. 56 also exhibits higher external quantum efficiency than the device of FIG. 50. It is believed that the higher efficiency in the device of FIG. 56 is due to more spread out recombination due to the step in dopant concentration, and a better balance of electrons and holes at the recombination location. In addition, recombination often occurs at interfaces, and the device of FIG. 56 has three interfaces involving a layer that can emit light due to the step in concentration, whereas the device of FIG. 50 has only two such interfaces.

Figure 62:
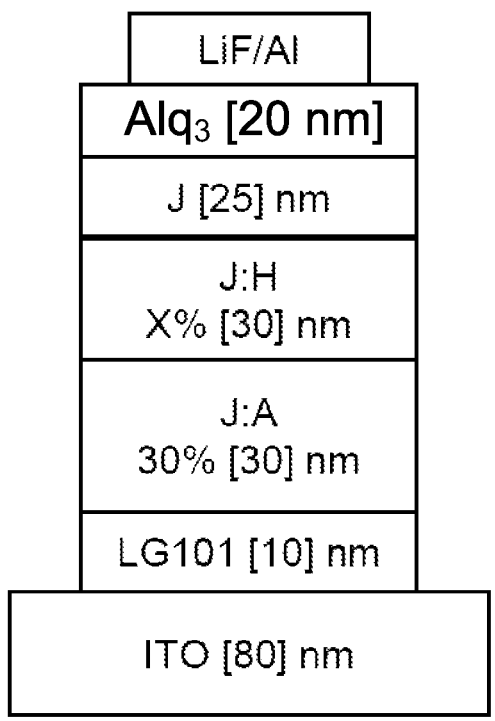
FIG. 62 shows an organic light emitting device having only a layer with a high hole conductivity between an emissive layer and the anode, a hole blocking layer of the same material used as a non-emissive host in the emissive layer, and an emissive layer having first and second organic layers with different phosphorescent materials in the first and second organic emissive layers, where the concentration of phosphorescent material in the second organic emissive layer is variable.

FIG. 62 shows an organic light emitting device having only a layer with a high hole conductivity between an emissive layer and the anode, a hole blocking layer of the same material used as a non-emissive host in the emissive layer, and an emissive layer having first and second organic layers with different phosphorescent materials in the first and second organic emissive layers, where the concentration of phosphorescent material in the second organic emissive layer is variable. The device of FIG. 62 includes a 10 nm thick hole injection layer of LG101, a 30 nm thick first organic emissive layer of COMPOUND J doped with 30 wt % COMPOUND A, a 30 nm thick second organic emissive layer of COMPOUND J doped with X wt % COMPOUND H, a 25 nm thick hole blocking layer of COMPOUND J, a 20 nm thick electron transport layer of Alq, and a LiF/Al cathode. X varies from 10 wt % to 18 wt % in the devices fabricated, with devices at X=10, 14 and 18 wt % as indicated in the legends for FIG. 57. The device of FIG. 62 is very similar to that of FIG. 56, with the difference being that the device of FIG. 62 uses different emissive phosphorescent material in the first and second organic emissive layers, while the device of FIG. 56 uses the same phosphorescent material in both layers. The concentrations of the phosphorescent materials are the same in the device of FIG. 56 compared to the device of FIG. 62.

Figure 63:
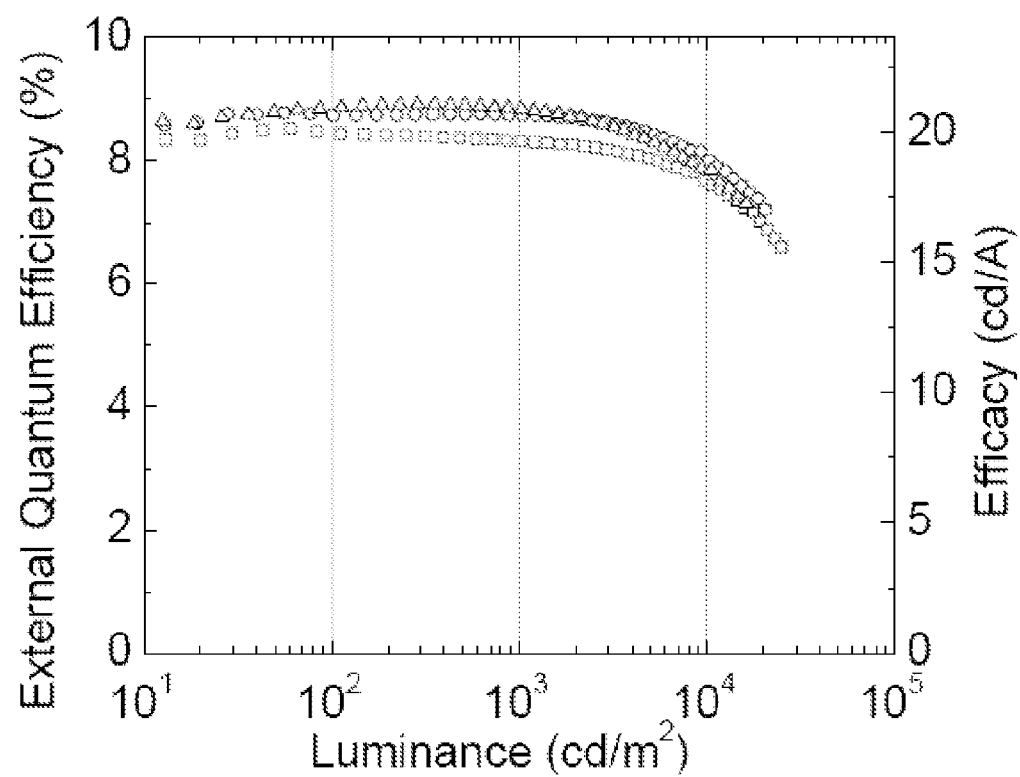
FIG. 63 shows a plot of external quantum efficiency versus luminance for the device of FIG. 62.

FIG. 63 shows a plot of external quantum efficiency versus luminance for the device of FIG. 62.

Figure 64:
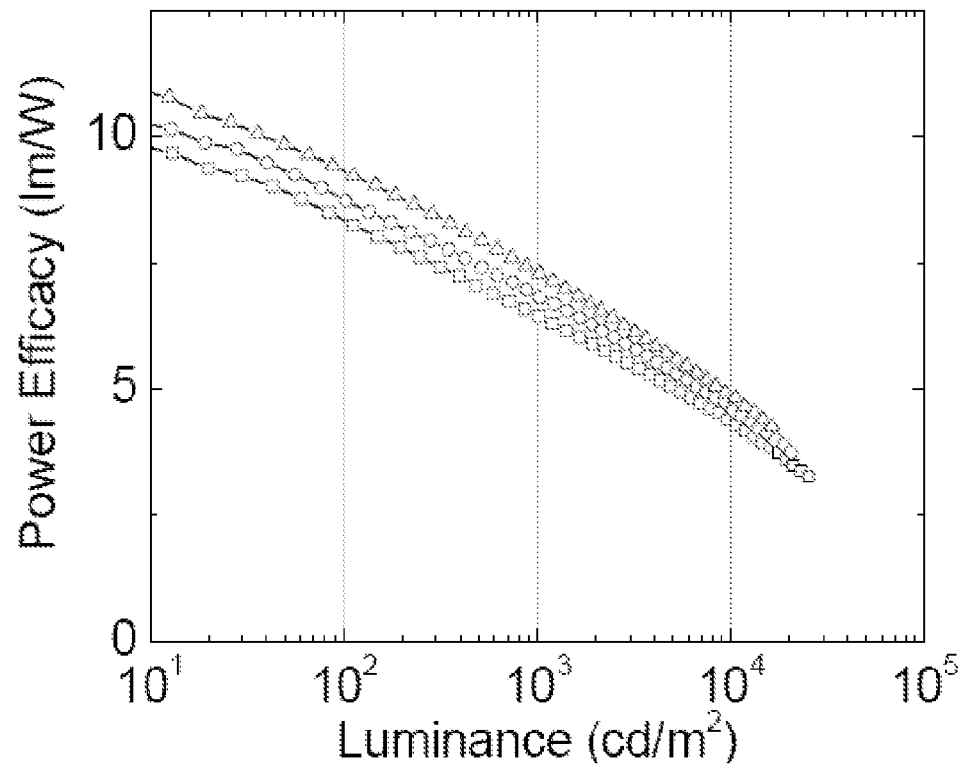
FIG. 64 shows a plot of power efficacy versus luminance for the device of FIG. 62.

FIG. 64 shows a plot of power efficacy versus luminance for the device of FIG. 62.

Figure 65:
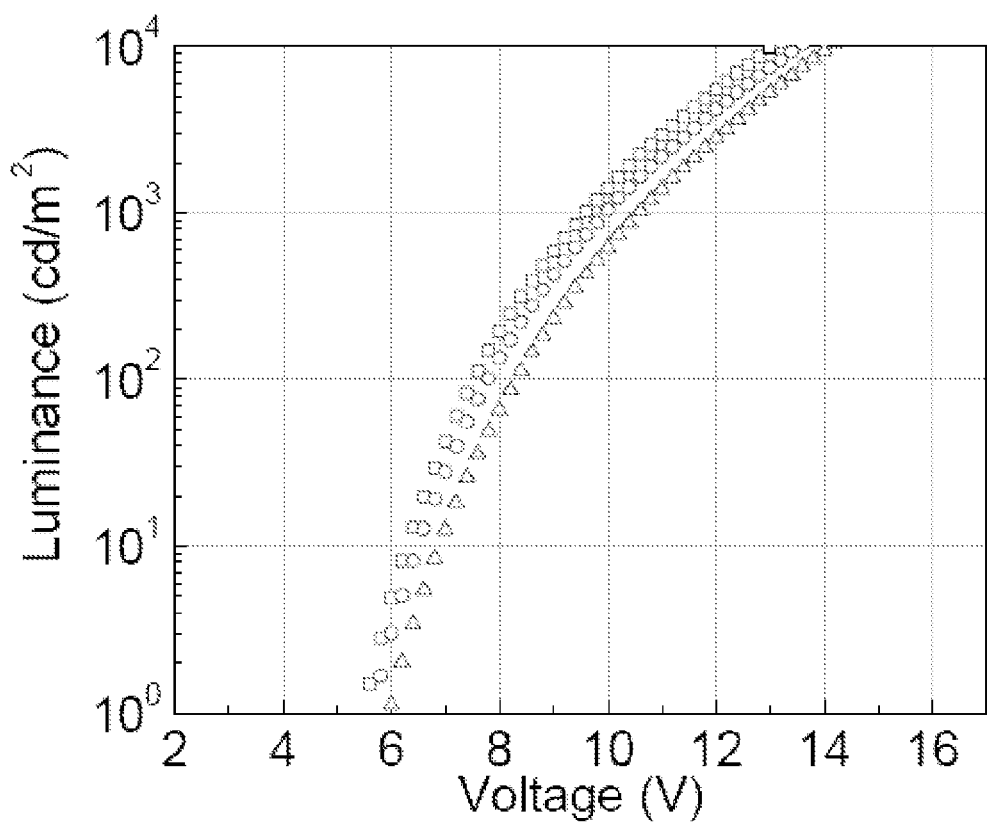
FIG. 65 shows a plot of luminance versus voltage for the device of FIG. 62.

FIG. 65 shows a plot of luminance versus voltage for the device of FIG. 62.

Figure 66:
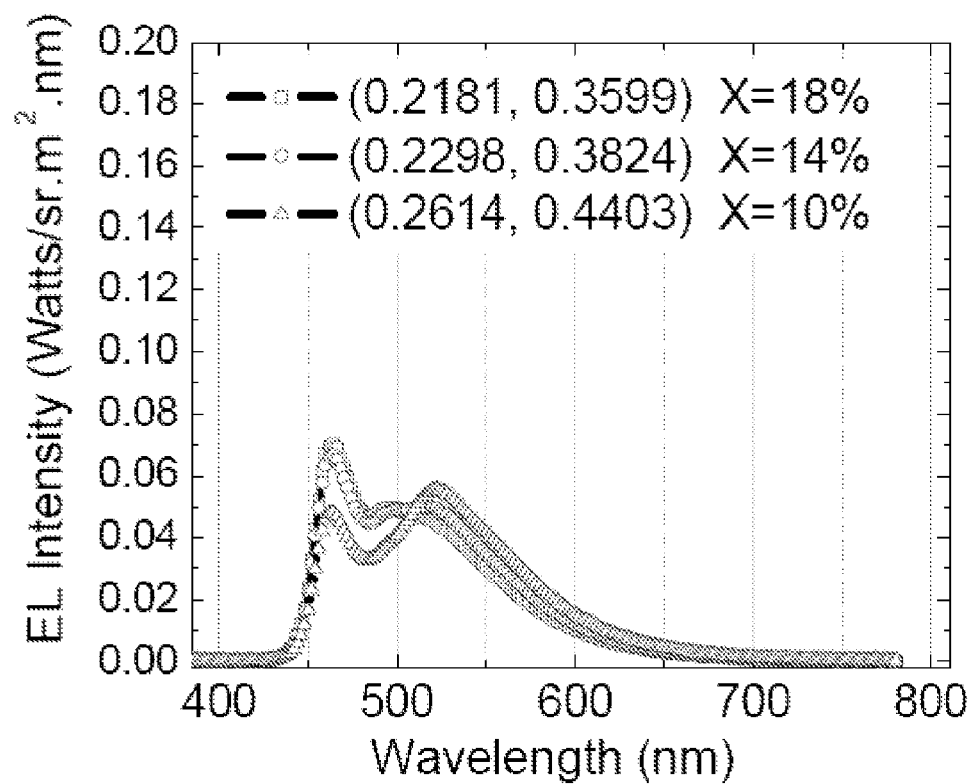
FIG. 66 shows a plot of EL intensity versus wavelength for the device of FIG. 62.

FIG. 66 shows a plot of EL intensity versus wavelength for the device of FIG. 62.

The device of FIG. 62 may be compared to the device of FIG. 56. In terms of device architecture, the devices are similar except in the emissive layer, where the device of FIG. 62 has an emissive layer doped with phosphorescent emitter COMPOUND A and another emissive layer doped phosphorescent emitter COMPOUND H, whereas the device of FIG. 56 has only phosphorescent emitter COMPOUND H. Both devices have a step in dopant concentration, and similar concentrations even in the layers where the actual dopant is different. Several points can be understood from comparing these two device architectures. First, the device of FIG. 62 exhibits a broad emission spectra that is a combination of emission from both COMPOUND A and COMPOUND H. As a result, it can be inferred that the device of FIG. 56 is emitting from both the layer doped with 30% COMPOUND H and the layer doped with a lesser concentration of COMPOUND H. Comparing FIG. 58 to FIG. 63, it can be seen that the device of FIG. 62 has better charge balance than the device of FIG. 56, as evidenced by a relatively flat external quantum efficiency over three orders of magnitude for the device of FIG. 62 as compared to two orders of magnitude for the device of FIG. 56.

A number of devices were fabricated having two different doped emissive layers, where the devices do not include a hole transport layer using a material such as NPD. Table 7 shows the structures for these devices. Table 8 shows measured experimental results for these devices. In general, the devices had an ITO anode, a hole injection layer of LG101, and an emissive layer having a first organic layer and a second organic layer with an interface in between. Some of the devices had a hole blocking layer. All of the devices had an electron transport layer of LG201, available from the same source as LG101, and an LiF/Al cathode. Devices 1, 2 and 4 include the same non-emissive material in the first and second organic layers, but different phosphorescent materials. Devices 5-8 have first and second organic layers with different non-emissive materials and different phosphorescent materials. Devices 9, 11 and 12 have first and second organic layers with different non-emissive materials and different phosphorescent materials, where the first organic layer additionally includes an emissive material. Devices 13-22 have first and second organic layers with the same non-emissive materials, and different phosphorescent materials, where the first organic layer additionally includes a lower energy emissive material. All of devices 1, 2, 4, 5-8, 9, 11, 12, and 13-22 include emissive layers having a first and second organic layer with an interface in between. In most of these devices, the concentration of phosphorescent material is higher in the first (closer to anode) organic layer. However, in devices 8 and 9 the concentration of the phosphorescent material is higher in the second organic layer. The emissive layer of Device 3 does not include first and second organic layers, each having a non-emissive material and a phosphorescent material, with an interface in between. Neither does the emissive layer of Device 10, because Compound B is non-emissive in Device 10. and 10 do not include first and second organic layers, each having a non-emissive material and a phosphorescent material.

TABLE 1

| Device | | | | | | | |
|---|---|---|---|---|---|---|---|
| 1 | ITO [80 nm] | LG101 [10 nm] | D:P 30% [15 nm] | D:N 12% [15 nm] | D [20 nm] | LG201 [20 nm] | LiF/Al [100 nm] |
| 2 | ITO [80 nm] | LG101 [10 nm] | D:P 30% [15 nm] | D:N 12% [15 nm] | D [20 nm] | LG201 [20 nm] | LiF/Al [100 nm] |
| 3 | ITO [120 nm] | LG101 [10 nm] | | C:N 12% [30 nm] | HPT [5 nm] | LG201 [40 nm] | LiF/Al [100 nm] |
| 4 | ITO [120 nm] | LG101 [10 nm] | C:P 30% [30 nm] | C:N 12% [30 nm] | HPT [5 nm] | LG201 [40 nm] | LiF/Al [100 nm] |
| 5 | ITO [120 nm] | LG101 [10 nm] | B:P 30% [30 nm] | mCBP:N 9% [25 nm] | mCBP [5 nm] | LG201 [45 nm] | LiF/Al [100 nm] |
| 6 | ITO [120 nm] | LG101 [10 nm] | B:P 30% [30 nm] | mCBP:N 9% [25 nm] | | LG201 [45 nm] | LiF/Al [100 nm] |
| 7 | ITO [120 nm] | LG101 [10 nm] | mCBP:N 9% [25 nm] | B:P 30% [30 nm] | B [5 nm] | LG201 [45 nm] | LiF/Al [100 nm] |
| 8 | ITO [120 nm] | LG101 [10 nm] | mCBP:N 9% [25 nm] | B:P 30% [30 nm] | | LG201 [45 nm] | LiF/Al [100 nm] |
| 9 | ITO [120 nm] | LG101 [10 nm] | B:P:O 30%:1% [30 nm] | mCBP:N 12% [25 nm] | | LG201 [45 nm] | LiF/Al [100 nm] |
| 10 | ITO [120 nm] | LG101 [10 nm] | B:P:O 30%:1% [30 nm] | B [1.5 nm] | mCBP:N 12% [25 nm] | LG201 [45 nm] | LiF/Al [100 nm] |
| 11 | ITO [120 nm] | LG101 [10 nm] | B:P:O 30%:0.5% [30 nm] | mCBP:N 12% [30 nm] | | LG201 [30 nm] | LiF/Al [100 nm] |
| 12 | ITO [120 nm] | LG101 [10 nm] | B:P:O 30%:0.5% [30 nm] | mCBP:N 12% [30 nm] | | LG201 [30 nm] | LiF/Al [100 nm] |
| 13 | ITO [120 nm] | LG101 [10 nm] | J:P:O 30%:0.5% [30 nm] | J:N 12% [25 nm] | | LG201 [30 nm] | LiF/Al [100 nm] |
| 14 | ITO [120 nm] | LG101 [10 nm] | J:P:O 30%:0.5% [30 nm] | J:N 6% [25 nm] | | LG201 [30 nm] | LiF/Al [100 nm] |
| 15 | ITO [120 nm] | LG101 [10 nm] | M:P:O 30%:0.5% [30 nm] | M:N 18% [25 nm] | M [5 nm] | LG201 [30 nm] | LiF/Al [100 nm] |
| 16 | ITO [120 nm] | LG101 [10 nm] | M:P:O 30%:0.5% [30 nm] | M:N 18% [25 nm] | M [5 nm] | LG201 [30 nm] | LiF/Al [100 nm] |
| 17 | ITO [120 nm] | LG101 [10 nm] | M:P:O 30%:0.5% [30 nm] | M:N 24% [25 nm] | M [5 nm] | LG201 [30 nm] | LiF/Al [100 nm] |
| 18 | ITO [120 nm] | LG101 [10 nm] | M:P:O 30%:0.5% [30 nm] | M:N 24% [25 nm] | M [5 nm] | LG201 [30 nm] | LiF/Al [100 nm] |
| 19 | ITO [120 nm] | LG101 [10 nm] | M:P:O 30%:0.5% [30 nm] | M:N 18% [25 nm] | M [5 nm] | LG201 [30 nm] | LiF/Al [100 nm] |
| 20 | ITO [120 nm] | LG101 [10 nm] | M:P:O 30%:0.5% [30 nm] | M:N 12% [25 nm] | M [5 nm] | LG201 [30 nm] | LiF/Al [100 nm] |
| 21 | ITO [120 nm] | LG101 [10 nm] | M:P:O 30%:0.5% [20 nm] | M:N 18% [25 nm] | M [5 nm] | LG201 [30 nm] | LiF/Al [100 nm] |
| 22 | ITO [120 nm] | LG101 [10 nm] | M:P:O 30%:0.5% [20 nm] | M:N 18% [25 nm] | M [5 nm] | LG201 [30 nm] | LiF/Al [100 nm] |

TABLE 8

| | Data at 1,000 nits | | | | At 10 mA/cm$^2$ | | From 1,000 nits | |
|---|---|---|---|---|---|---|---|---|
| Device | V | cd/A | EQE (%) | PE (lm/W) | CIE x | CIE y | LT70 | LT50 |
| 1 | 7.5 | 17.1 | 5.1 | 7.2 | 0.439 | 0.545 | | |
| 2 | 6.0 | 15.4 | 4.6 | 8.0 | 0.439 | 0.545 | | |
| 3 | 6.2 | 6.4 | 2.1 | 3.3 | 0.258 | 0.569 | | |
| 4 | 6.7 | 28.4 | 9.1 | 13.4 | 0.464 | 0.521 | | |
| 5 | 10.0 | 30.2 | 9.8 | 9.5 | 0.444 | 0.517 | | |
| 6 | 9.0 | 32.9 | 10.4 | 11.4 | 0.442 | 0.523 | | |
| 7 | 9.8 | 7.6 | 2.3 | 2.4 | 0.401 | 0.552 | | |
| 8 | 9.2 | 7.1 | 2.2 | 2.4 | 0.361 | 0.560 | | |
| 9 | 7.7 | 23.6 | 13.2 | 9.6 | 0.516 | 0.424 | 1,000 | 5,000 |
| 10 | 8.3 | 21.9 | 12.8 | 8.3 | 0.543 | 0.413 | 1,500 | 5,000 |
| 11 | 8.9 | 24.6 | 13.5 | 8.7 | 0.533 | 0.424 | 12,000 | 35,000 |
| 12 | 7.4 | 27.4 | 14.5 | 11.6 | 0.524 | 0.426 | 26,000 | 50,000 |
| 13 | 6.3 | 21.3 | 11.1 | 10.6 | 0.501 | 0.431 | | |
| 14 | 6.5 | 22.2 | 12.0 | 10.7 | 0.542 | 0.422 | | |
| 15 | 6.1 | 23.7 | 10.9 | 12.3 | 0.467 | 0.457 | | |
| 16 | 6.2 | 31.7 | 15.1 | 16.1 | 0.500 | 0.445 | | |
| 17 | 6.2 | 14.9 | 6.9 | 7.5 | 0.467 | 0.457 | | |
| 18 | 6.1 | 29.5 | 13.5 | 15.2 | 0.456 | 0.460 | 100,000 | 2,000,000 |
| 19 | 6.3 | 32.4 | 15.3 | 16.1 | 0.437 | 0.451 | | |
| 20 | 7.0 | 33.2 | 16.3 | 15.0 | 0.505 | 0.439 | | |
| 21 | 6.4 | 29.0 | 13.9 | 14.3 | 0.472 | 0.449 | | |
| 22 | 6.2 | 29.4 | 14.2 | 14.9 | 0.467 | 0.448 | | |

Table 9 shows device structures and measured experimental results for some devices having an emissive layer with an interface between a first organic layer and a second organic layer, where the host and the dopant, i.e., the non-emissive material is the same material in both layers and the phosphorescent material is the same material in both layers, but the concentrations are different. All of the devices in Table 9 had a 100 Å hole injection layer of Compound A, a 100 Å hole blocking layer ("BL") of different materials depending on the specific device, a 400 Å electron transport layer, and an LiF/Al cathode. The emissive layer included a first organic layer and a second organic layer with an interface between them, where the first organic layer was 300 Å of a non-emissive material (the "host" in Table 9) at a concentration of 70 wt % and a phosphorescent material (the "dopant" of Table 9) at a concentration of 30 wt %, and the second organic layer was 300 Å of the same non-emissive material (the "host" in Table 9) but at a concentration of 90 wt % and the same phosphorescent material (the "dopant" of Table 9) but at a concentration of 10 wt %. The specific host and dopant for each device are identified in Table 9. Thus, the general device structure for the devices of Table 9 was: ITO (1200 Å)/Compound A (100 Å)/host (70 wt %):dopant (30 wt %) (300 Å)/host (90 wt %):dopant (10 wt %) (300 Å)/BL (100 Å)/Alq$^3$ (400 Å)/LiF/Al.

TABLE 9

| | | | | CIE | | At 1,000 nits | | | | At 40 mA/cm² | |
| | | | | X | Y | Voltage [v] | L.E. [cd/A] | E.Q.E. [%] | P.E. [lm/W] | Lo [nits] | LT 80% [h] |
| Example | Host | Dopant | BL | | | | | | | | |
|---|---|---|---|---|---|---|---|---|---|---|---|
| A | T | A | T | 0.36 | 0.61 | 6.4 | 57.5 | 15.9 | 28.2 | 17,225 | 1060 |
| B | T | A | HPT | 0.36 | 0.61 | 5.8 | 60.4 | 16.6 | 32.7 | 16,732 | 1000 |
| C | T | U | T | 0.34 | 0.62 | 8.4 | 46.4 | 12.5 | 17.3 | 15,184 | 2100 |
| D | T | U | HPT | 0.35 | 0.62 | 7.8 | 54.7 | 14.8 | 22.0 | 15,904 | 1350 |

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works are not intended to be limiting.

The invention claimed is:

1. An organic light emitting device, comprising:
an anode;
a cathode;
an emissive layer disposed between the anode and the cathode, the emissive layer further comprising:
a first organic layer comprising a first phosphorescent material and a first nonemissive material, wherein
the concentration of the first phosphorescent material in the first organic layer is 10-90 wt %; and
the concentration of the first non-emissive material in the first organic layer is 10-90 wt %;
a second organic layer comprising a second phosphorescent material and
a second non-emissive material, wherein
the concentration of the second phosphorescent material in the second layer is 3-25 wt %; and
the concentration of the second non-emissive material in the second organic layer is 75-97 wt %;
wherein the concentration of the second phosphorescent material in the second organic layer is lower than the concentration of the first phosphorescent material in the first organic layer;
wherein the first non-emissive material and the second non-emissive material may be the same material or different materials, and the first phosphorescent material and the second phosphorescent material may be the same material or different materials;
wherein all organic layers between the first organic layer and the anode do not include any materials containing a group selected from the group consisting of triarylamine, napthyl, tri(N-carbazoyl)triphenylamine, tetraarylamine and carbazole;
a third organic layer disposed between the first organic layer and the anode; and
wherein the first phosphorescent material and the second phosphorescent material are the same material, and the first non-emissive material and the second non-emissive material are the same material.

2. The device of claim 1, wherein the third organic layer consists essentially of the first phosphorescent material; and the third organic layer is in direct contact with the first organic layer and the anode.

3. The device of claim 1, wherein all organic layers between the first organic layer and the anode consist essentially of organometallic materials.

4. The device of claim 1, wherein
the first organic layer, the second organic layer, or both, further comprise a lower energy emissive material, wherein the concentration of the lower energy emissive material is 0.1-12 wt %.

5. The device of claim 1, wherein the first organic layer consists essentially of the first phosphorescent material and the first non-emissive material, and
the second organic layer consists essentially of the second phosphorescent material and the second non-emissive material.

6. The device of claim 1, wherein the device includes no more than three different organic materials.

7. The device of claim 1, wherein the device includes no more than four different organic materials, and one of the organic materials is an electron transport material present in the device only between the emissive layer and the cathode.

8. The device of claim 1, further comprising a fourth organic layer disposed between the second organic layer and the cathode, wherein the fourth organic layer consists essentially of materials having a triplet energy at least 0.1 eV greater than the triplet energy of the second phosphorescent material; and wherein the fourth organic layer is in direct contact with the second organic layer.

9. The device of claim 1, wherein the first non-emissive material is selected from materials containing a group selected from the group consisting of triphenylene, carbazole, dibenzothiophene and dibenzothiophene coupled with carbazole.

10. The device of claim 1, wherein the concentration of the second phosphorescent material in the second organic layer is at least 5 wt % lower than the concentration of the first phosphorescent material in the first organic layer.

11. The device of claim 1, wherein the concentration of the second phosphorescent material in the second organic layer is at least 10 wt % lower than the concentration of the first phosphorescent material in the first organic layer.

12. The device of claim 1, wherein the total thickness of the first and second organic layers is at least 400 Å, and wherein the thickness of the first organic layer is at least 50 Å and the thickness of the second organic layer is at least 50 Å.

13. The device of claim 1, wherein the first phosphorescent material has a highest occupied molecular orbital that is at least 0.3 eV higher than the highest occupied molecular orbital of the first non-emissive material, and the second phosphorescent material has a highest occupied molecular orbital that is at least 0.3 eV higher than the second occupied molecular orbital of the first non-emissive material.

14. The device of claim 1, wherein all organic layers between the first organic layer and the anode have a hole mobility and an electron mobility such that the hole mobility is at least twice as great as the electron mobility.

15. The device of claim 14, wherein all organic layers between the first organic layer and the anode have a hole mobility and an electron mobility such that the hole mobility is at least ten times greater than the electron mobility.

16. The device of claim 14, wherein all organic layers between the first organic layer and the anode have a hole mobility and an electron mobility such that the hole mobility is at least one hundred times greater than the electron mobility.

17. The device of claim 1, wherein all organic layers between the first organic layer and the anode have a hole conductivity sufficiently large such that an additional 10 nm thickness in the layer results in a voltage rise of 0.1 V or less at a current of 10 mA/cm$^2$.

* * * * *